(12) United States Patent
Tokuse et al.

(10) Patent No.: US 11,483,481 B2
(45) Date of Patent: Oct. 25, 2022

(54) ELECTRONIC INSTRUMENT

(71) Applicant: SONY CORPORATION, Tokyo (JP)

(72) Inventors: Akira Tokuse, Tokyo (JP); Yoshitaka Miyatani, Tokyo (JP); Noriaki Kozuka, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/754,513

(22) PCT Filed: Oct. 19, 2018

(86) PCT No.: PCT/JP2018/038946
§ 371 (c)(1),
(2) Date: Apr. 8, 2020

(87) PCT Pub. No.: WO2019/078338
PCT Pub. Date: Apr. 25, 2019

(65) Prior Publication Data
US 2020/0260012 A1 Aug. 13, 2020

(30) Foreign Application Priority Data

Oct. 19, 2017 (JP) .............................. JP2017-202862

(51) Int. Cl.
*H04N 5/232* (2006.01)
*G06K 9/00* (2022.01)
(Continued)

(52) U.S. Cl.
CPC ....... *H04N 5/23293* (2013.01); *G06V 40/166* (2022.01); *G06V 40/172* (2022.01);
(Continued)

(58) Field of Classification Search
CPC . E01B 25/04; E01B 25/24; G02B 2027/0138; G06K 9/00255;
(Continued)

(56) References Cited

U.S. PATENT DOCUMENTS 9,071,739 B2 * 6/2015 Miao ...................... H04N 5/374
9,977,960 B2 * 5/2018 Gustafsson .......... G02B 27/017
(Continued)

FOREIGN PATENT DOCUMENTS

CN 106455974 A 2/2017
JP 2001-116985 A 4/2001
(Continued)

OTHER PUBLICATIONS

International Search Report dated Dec. 11, 2018 in PCT/JP2018/038946, 2 pages.

*Primary Examiner* — Joon Kwon
(74) *Attorney, Agent, or Firm* — Oblon, McClelland, Maier & Neustadt, L.L.P.

(57) ABSTRACT

The present disclosure relates to an electronic instrument capable of downsizing an electronic instrument having a function of imaging at least a part of a user.

In an electronic instrument worn or used by a user, the electronic instrument includes an imaging unit arranged at a position where at least a part of the user wearing or using the electronic instrument is capturable, the imaging unit including two or more pixel output units that each receive incident light from a subject incident not via either an imaging lens or a pinhole and output one detection signal indicating an output pixel value modulated depending on an incident angle of the incident light. The present disclosure can be applied to, for example, a wearable device.

25 Claims, 50 Drawing Sheets

(51) Int. Cl.
*H04N 5/225* (2006.01)
*G06V 40/19* (2022.01)
*G06V 40/16* (2022.01)

(52) U.S. Cl.
CPC ........... *G06V 40/19* (2022.01); *H04N 5/2253* (2013.01); *H04N 5/22525* (2018.08)

(58) Field of Classification Search
CPC ............ G06K 9/00288; G06K 9/00604; H01L 27/14609; H01L 27/14621; H01L 27/14625; H01L 27/1463; H04N 5/22525; H04N 5/2253; H04N 5/2254; H04N 5/22541; H04N 5/2257; H04N 5/232; H04N 5/23293; H04N 5/3696; H04N 5/374; H04N 5/37457
See application file for complete search history.

(56) References Cited

U.S. PATENT DOCUMENTS

| | | | |
|---|---|---|---|
| 11,042,729 B2* | 6/2021 | Sud | G06N 3/0454 |
| 2006/0157640 A1 | 7/2006 | Perlman et al. | |
| 2009/0051768 A1* | 2/2009 | DeKeyser | G11B 23/288 348/143 |
| 2009/0147111 A1* | 6/2009 | Litvinov | G06T 7/13 348/273 |
| 2011/0019056 A1 | 1/2011 | Hirsch et al. | |
| 2014/0285629 A1* | 9/2014 | Okigawa | H04N 9/04515 348/46 |
| 2014/0341441 A1* | 11/2014 | Slaby | G06V 40/193 382/117 |
| 2016/0126275 A1* | 5/2016 | Kurokawa | H01L 27/14669 257/43 |
| 2016/0266386 A1* | 9/2016 | Scott | G06T 19/006 |
| 2019/0012836 A1* | 1/2019 | Lim | G06V 20/20 |

FOREIGN PATENT DOCUMENTS

| | | |
|---|---|---|
| JP | 2009-135705 A | 6/2009 |
| JP | 2012-29209 A | 2/2012 |
| JP | 2016-92413 A | 5/2016 |
| WO | WO 2015/195417 A1 | 12/2015 |
| WO | WO 2016/123529 A1 | 8/2016 |
| WO | WO 2017/056865 A1 | 4/2017 |

* cited by examiner

FIG. 31
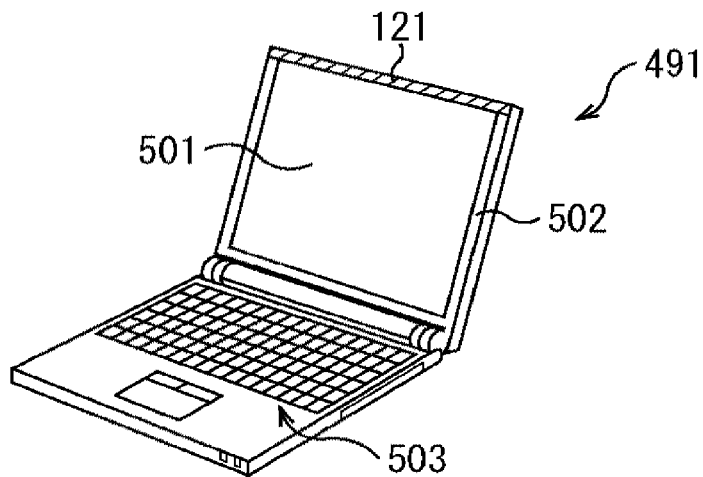
A
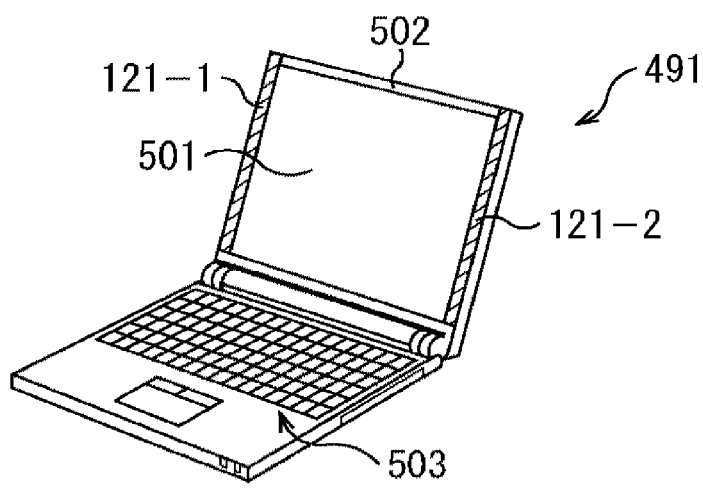
B
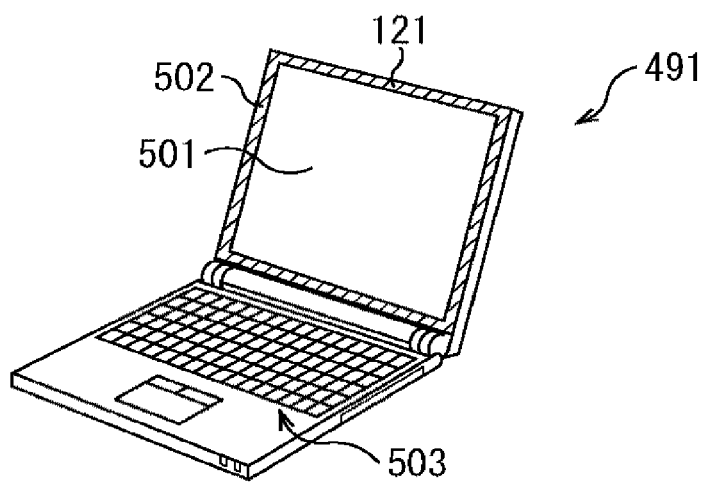
C

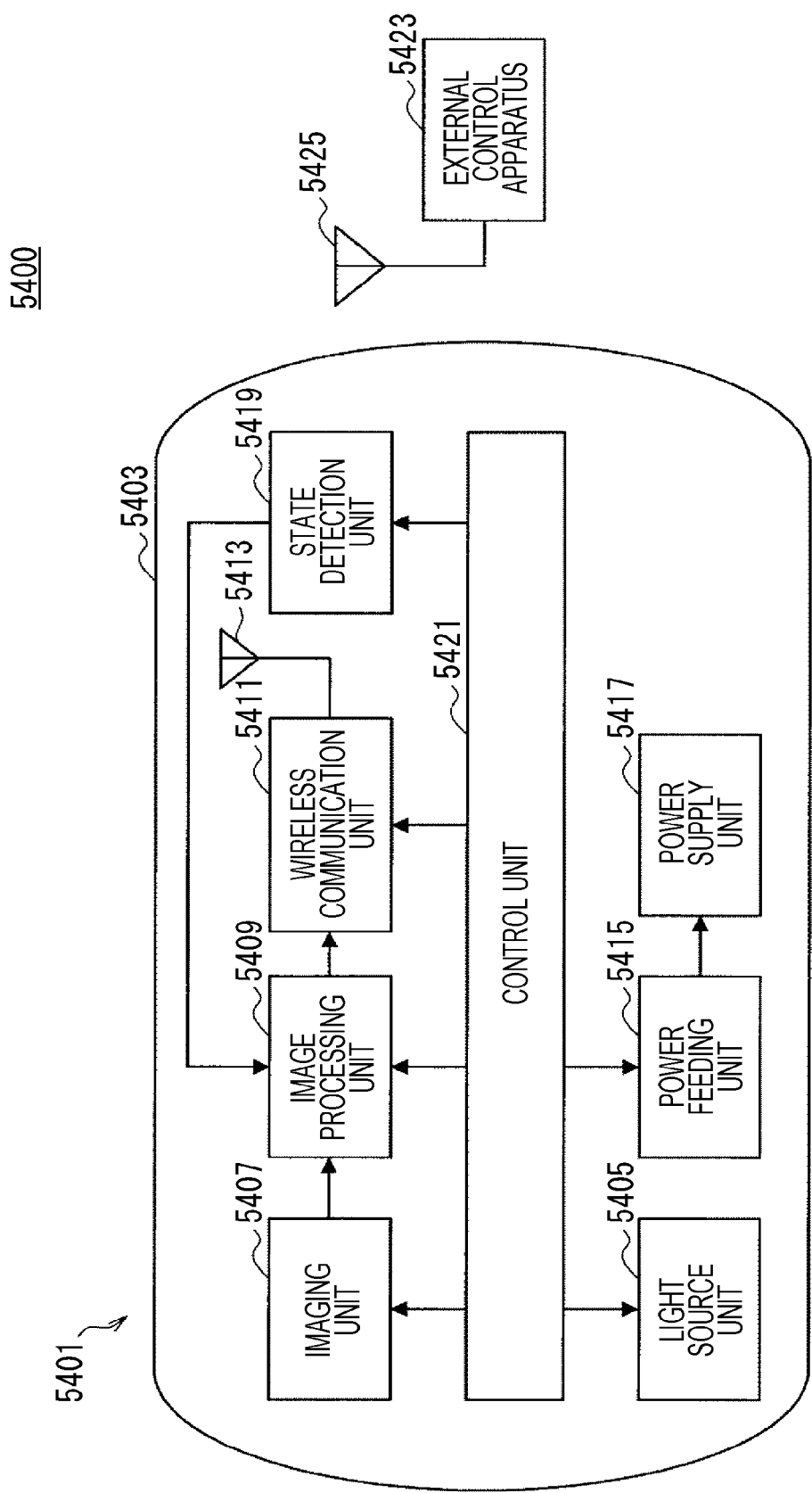

ELECTRONIC INSTRUMENT

TECHNICAL FIELD

The present disclosure relates to an electronic instrument, and more particularly, to an electronic instrument having a function of imaging at least a part of a user.

BACKGROUND ART

Conventionally, an imaging apparatus has been proposed in which light from a subject is modulated by a grating-like optical filter or an optical filter including a diffraction grating that covers a light receiving surface of an imaging element, and imaged without using an imaging lens, and an image on which a figure of the subject is formed as an image is restored by a predetermined arithmetic process (see, for example, Non-Patent Document 1, and Patent Documents 1 and 2).

CITATION LIST

Non-Patent Document

Non-Patent Document 1: M. Salman Asif and four others, "Flatcam: Replacing lenses with masks and computation", "2015 IEEE International Conference on Computer Vision Workshop (ICCVW)", 2015, pages 663-666

Patent Document

Patent Document 1: Japanese National Publication of International Patent Application No. 2016-510910
Patent Document 2: International Publication No. 2016/123529

SUMMARY OF THE INVENTION

Problems to be Solved by the Invention

Incidentally, an imaging apparatus that does not use an imaging lens as indicated in Non-Patent Document 1 and Patent Documents 1 and 2 can be downsized due to the absence of the imaging lens, and is expected to expand the applicable range.

The present disclosure has been made in view of such a situation, and makes it possible to downsize an electronic instrument having a function of imaging at least a part of a user.

Solutions to Problems

An imaging apparatus according to an aspect of the present disclosure is an electronic instrument worn or used by a user, the electronic instrument including an imaging unit arranged at a position where at least a part of the user wearing or using the electronic instrument is capturable, the imaging unit including two or more pixel output units that each receive incident light from a subject incident not via either an imaging lens or a pinhole and output one detection signal indicating an output pixel value modulated depending on an incident angle of the incident light.

In one aspect of the present disclosure, at least a part of a user wearing or using an electronic instrument is imaged, and detection signals are output by a plurality of pixel output units.

Effects of the Invention

According to one aspect of the present disclosure, an electronic instrument having a function of imaging at least a part of a user can be downsized.

Note that the effects described herein are not necessarily limited and any effects described in the present disclosure may be applied.

BRIEF DESCRIPTION OF DRAWINGS

FIG. 31 is a diagram illustrating arrangement examples of imaging elements in a PC.

FIG. 51 is a block diagram illustrating an example of an outline of the configuration of an in-vivo information acquisition system.

MODE FOR CARRYING OUT THE INVENTION

Figure 1:
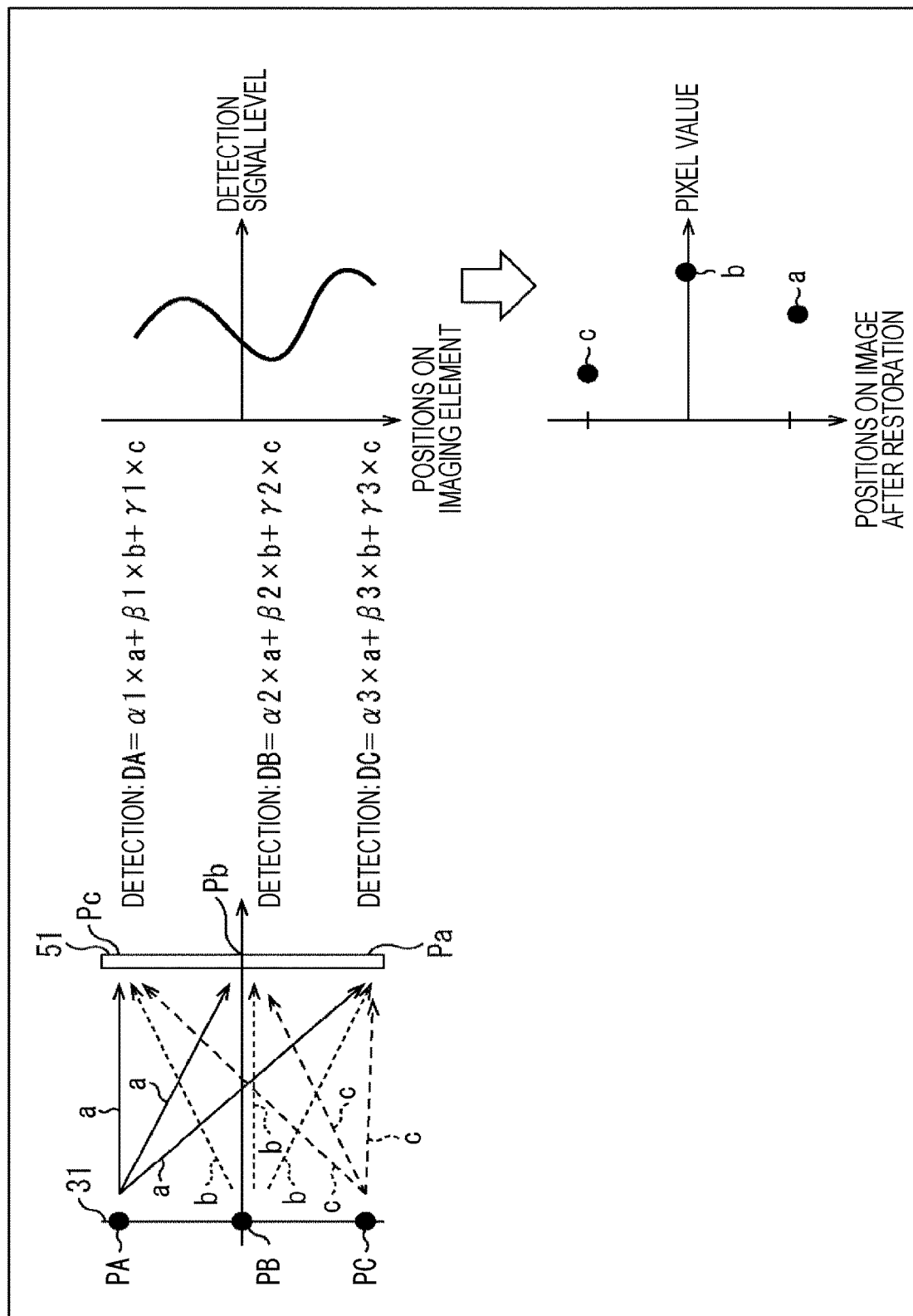
FIG. 1 is a diagram explaining a principle of imaging in an imaging apparatus to which the technology of the present disclosure is applied.

Hereinafter, favorable embodiments of the present disclosure will be described in detail with reference to the accompanying drawings. Note that, in the present description and the drawings, constituent elements having substantially the same functional configuration will be denoted by the same reference numeral and redundant description will be appropriately omitted.

Furthermore, the description will be given in the following order.

1. Overview of Imaging Apparatus of Present Disclosure
2. Basic Configuration Example of Imaging Apparatus of Present Disclosure
3. First Embodiment: Case of Imaging User
4. Second Embodiment: Case of Imaging Surroundings of User
5. Variations
6. Application Examples
7. Others 1. Overview of Imaging Apparatus of Present Disclosure First, an overview of an imaging apparatus according to the present disclosure will be described.

In the imaging apparatus according to the present disclosure, as illustrated in the upper left of FIG. 1, an imaging element 51 in which the detection sensitivity of each pixel is provided with incident angle directivity is used. Here, providing the detection sensitivity of each pixel with incident angle directivity means that light receiving sensitivity characteristics according to incident angles of incident light to respective pixels are differentiated for each pixel. However, the light receiving sensitivity characteristics of all the pixels need not be completely different, and the light receiving sensitivity characteristics of some of the pixels may be the same.

Here, for example, it is assumed that all subjects are each a collection of point light sources, and light is emitted from each point light source in every direction. For example, it is assumed that a subject surface 31 of a subject in the upper left of FIG. 1 is constituted by point light sources PA to PC, and the point light sources PA to PC each disperse a plurality of light rays having light intensities a to c, respectively, to surroundings. Furthermore, hereinafter, it is assumed that the imaging element 51 includes pixels having mutually different incident angle directivities at positions Pa to Pc (hereinafter referred to as pixels Pa to Pc).

In this case, as illustrated in the upper left of FIG. 1, light rays having the same light intensity, which have been dispersed from the same point light source, are incident on each pixel of the imaging element 51. For example, a light ray having a light intensity a dispersed from the point light source PA is incident on each of the pixels Pa to Pc of the imaging element 51. Meanwhile, light rays dispersed from the same point light source are incident at mutually different incident angles for each pixel. For example, light rays from the point light source PA are incident on the pixels Pa to Pc at mutually different incident angles.

Here, since the incident angle directivities of the pixels Pa to Pc are different from each other, light rays having the same light intensity, which have been dispersed from the same point light source, are detected with different sensitivities in the respective pixels. As a result, light rays having the same light intensity are detected at different detection signal levels for each pixel. For example, the detection signal level with respect to the light ray having the light intensity a from the point light source PA has different values from each other between the pixels Pa to Pc.

Then, the light receiving sensitivity level of each pixel with respect to a light ray from each point light source is found by multiplying the light intensity of this light ray by a coefficient indicating the light receiving sensitivity (that is, the incident angle directivity) with respect to the incident angle of this light ray. For example, the detection signal level of the pixel Pa with respect to a light ray from the point light source PA is found by multiplying the light intensity a of the light ray of the point light source PA by a coefficient indicating the incident angle directivity of the pixel Pa with respect to the incident angle of this light ray to the pixel Pa.

Accordingly, respective detection signal levels DA, DB, and DC of the pixels Pc, Pb, and Pa are represented by following formulas (1) to (3).

$$DA = \alpha 1 \times a + \beta 1 \times b + \gamma 1 \times c \quad (1)$$

$$DB = \alpha 2 \times a + \beta 2 \times b + \gamma 2 \times c \quad (2)$$

$$DC = \alpha 3 \times a + \beta 3 \times b + \gamma 3 \times c \quad (3)$$

Here, the coefficient $\alpha 1$ represents a coefficient indicating the incident angle directivity of the pixel Pc with respect to the incident angle of the light ray from the point light source PA to the pixel Pc, and is set according to this incident angle. Furthermore, $\alpha 1 \times a$ indicates the detection signal level of the pixel Pc with respect to the light ray from the point light source PA.

The coefficient $\beta 1$ represents a coefficient indicating the incident angle directivity of the pixel Pc with respect to the incident angle of the light ray from the point light source PB to the pixel Pc, and is set according to this incident angle. Furthermore, $\beta 1 \times b$ indicates the detection signal level of the pixel Pc with respect to the light ray from the point light source PB.

The coefficient $\gamma 1$ represents a coefficient indicating the incident angle directivity of the pixel Pc with respect to the incident angle of the light ray from the point light source PC to the pixel Pc, and is set according to this incident angle. Furthermore, $\gamma 1 \times c$ indicates the detection signal level of the pixel Pc with respect to the light ray from the point light source PC.

As described above, the detection signal level DA of the pixel Pa is found by sum of products between the light intensities a, b, and c of the light rays from the point light sources PA, PB, and PC, respectively, in the pixel Pc, and the coefficients $\alpha 1$, $\beta 1$, and $\gamma 1$ indicating the incident angle directivities according to the incident angles of the respective light rays.

Similarly, as indicated by formula (2), the detection signal level DB of the pixel Pb is found by sum of products between the light intensities a, b, and c of the light rays from the point light sources PA, PB, and PC, respectively, in the pixel Pb, and the coefficients $\alpha 2$, $\beta 2$, and $\gamma 2$ indicating the incident angle directivities according to the incident angles of the respective light rays. Furthermore, as indicated by formula (3), the detection signal level DC of the pixel Pc is found by sum of products between the light intensities a, b, and c of the light rays from the point light sources PA, PB, and PC, respectively, in the pixel Pa, and the coefficients $\alpha 2$, $\beta 2$, and $\gamma 2$ indicating the incident angle directivities according to the incident angles of the respective light rays.

However, in the detection signal levels DA, DB, and DC of the pixels Pa, Pb, and Pc, the light intensities a, b, and c of the light rays dispersed from the respective point light sources PA, PB, and PC are intermixed, as indicated in formulas (1) to (3). Accordingly, as illustrated in the upper right of FIG. 1, the detection signal level in the imaging element 51 is different from the light intensity of each point light source on the subject surface 31. Accordingly, an image obtained by the imaging element 51 is given as an image different from an image on which a figure on the subject surface 31 is formed as an image.

Meanwhile, the light intensities a to c of the light rays of the point light sources PA to PC, respectively, are found by creating simultaneous equations including formulas (1) to (3) and solving the created simultaneous equations. Then, by placing pixels having pixel values according to the found light intensities a to c in line with the arrangement (relative positions) of the point light sources PA to PC, a restoration image on which a figure on the subject surface 31 is formed as an image is restored, as illustrated in the lower right of FIG. 1.

Note that, in the following, coefficients gathered for each of the formulas constituting the simultaneous equations (for example, coefficients $\alpha 1$, $\beta 1$, and $\gamma 1$) are referred to as a coefficient set. Furthermore, in the following, a plurality of gathered coefficient sets corresponding to a plurality of formulas included in the simultaneous equations (for example, a coefficient set $\alpha 1$, $\beta 1$, $\gamma 1$, a coefficient set $\alpha 2$, $\beta 2$, $\gamma 2$, and a coefficient set $\alpha 3$, $\beta 3$, $\gamma 3$) is referred to as a coefficient set group.

By configuring in this manner, an imaging apparatus not requiring an imaging lens, a pinhole, or the optical filters indicated in Patent Document 1 and Non-Patent Document 1 (hereinafter referred to as Patent Document and the like), and including, as an essential constituent, the imaging element 51 having incident angle directivities in each pixel can be implemented. As a result, the imaging lens, the pinhole, and the optical filters described in Patent Document and the like are not regarded as essential constituents, such that the imaging apparatus is allowed to have a low profile, that is, the thickness with respect to the light incident direction in a configuration that implements the imaging function can be thinned.

Furthermore, since the essential constituent is only the imaging element 51, the degree of freedom in designing can be improved. For example, while it is necessary in an imaging apparatus using a conventional imaging lens to arrange the pixels of the imaging element in a two-dimensional array shape in line with a position where a figure of the subject is formed as an image by the imaging lens, this is not necessary in an imaging apparatus using the imaging element 51. For this reason, the degree of freedom in arrangement of each pixel is improved, and for example, each pixel can be freely arranged within a range in which light from a subject is incident. For example, respective pixels can be placed in a circular region, placed in a hollow square (box-shaped) region, or distributed and arranged in a plurality of regions.

Then, regardless of the arrangement of each pixel, by creating and solving simultaneous equations as indicated by above-described formulas (1) to (3) using a coefficient according to the incident angle of the light ray from each point light source on the subject surface 31 to each pixel, the light intensity of the light ray from each point light source can be found. Then, by placing pixels having pixel values according to the found light intensities of the respective point light sources in line with the arrangement of the respective point light sources on the subject surface 31, a restoration image on which a figure on the subject surface 31 is formed as an image can be restored.

2. Basic Configuration Example of Imaging Apparatus of Present Disclosure

Next, a basic configuration example of the imaging apparatus according to the present disclosure will be described with reference to FIGS. 2 to 25.

<Configuration Example of Imaging Apparatus 101>

Figure 2:
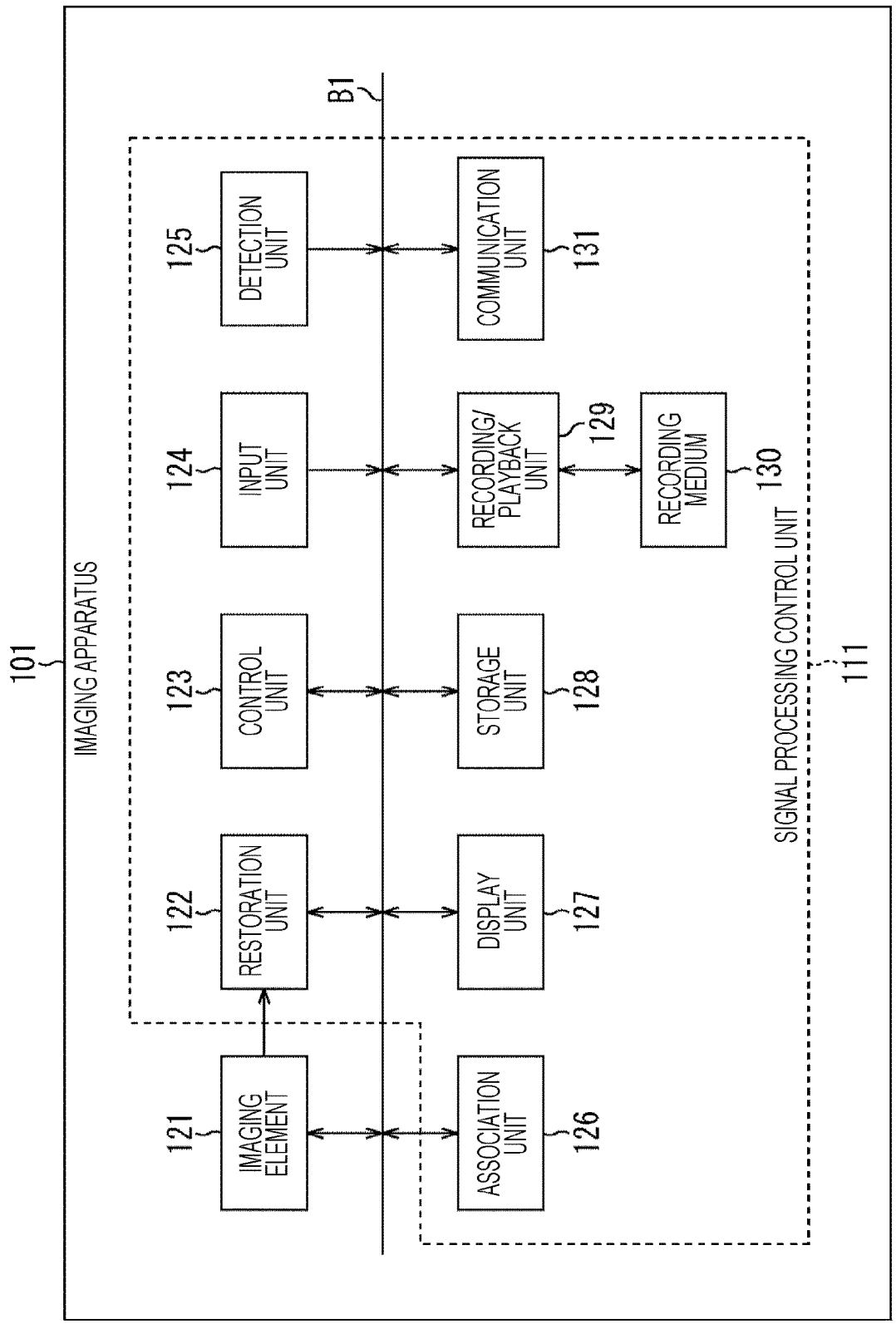
FIG. 2 is a block diagram illustrating a basic configuration example of the imaging apparatus to which the technology of the present disclosure is applied.

FIG. 2 is a block diagram illustrating a configuration example of an imaging apparatus 101, which is a basic imaging apparatus to which the technology of the present disclosure is applied.

The imaging apparatus 101 includes an imaging element 121, a restoration unit 122, a control unit 123, an input unit 124, a detection unit 125, an association unit 126, a display unit 127, a storage unit 128, a recording/playback unit 129, a recording medium 130, and a communication unit 131. Furthermore, the restoration unit 122, the control unit 123, the input unit 124, the detection unit 125, the association unit 126, the display unit 127, the storage unit 128, the recording/playback unit 129, the recording medium 130, and the communication unit 131 constitute a signal processing control unit 111 that, for example, performs signal processes and controls the imaging apparatus 101. Note that the imaging apparatus 101 does not include an imaging lens (imaging lens-free).

In addition, the imaging element 121, the restoration unit 122, the control unit 123, the input unit 124, the detection unit 125, the association unit 126, the display unit 127, the storage unit 128, the recording/playback unit 129, and the communication unit 131 are connected to each other via a bus B1, and for example, transmit and receive data via the bus B1. Note that, in the following, in order to simplify the explanation, description of the bus B1 in cases where each unit of the imaging apparatus 101, for example, transmits and receives data via the bus B1 will be omitted. For example, a case where the input unit 124 supplies data to the control unit 123 via the bus B1 will be described that the input unit 124 supplies data to the control unit 123.

The imaging element 121 corresponds to the imaging element 51 described with reference to FIG. 1, and is an imaging element that includes a pixel having an incident angle directivity, and outputs an image including a detection signal indicating a detection signal level according to the light amount of incident light, to the restoration unit 122 or the bus B1.

Figure 3:
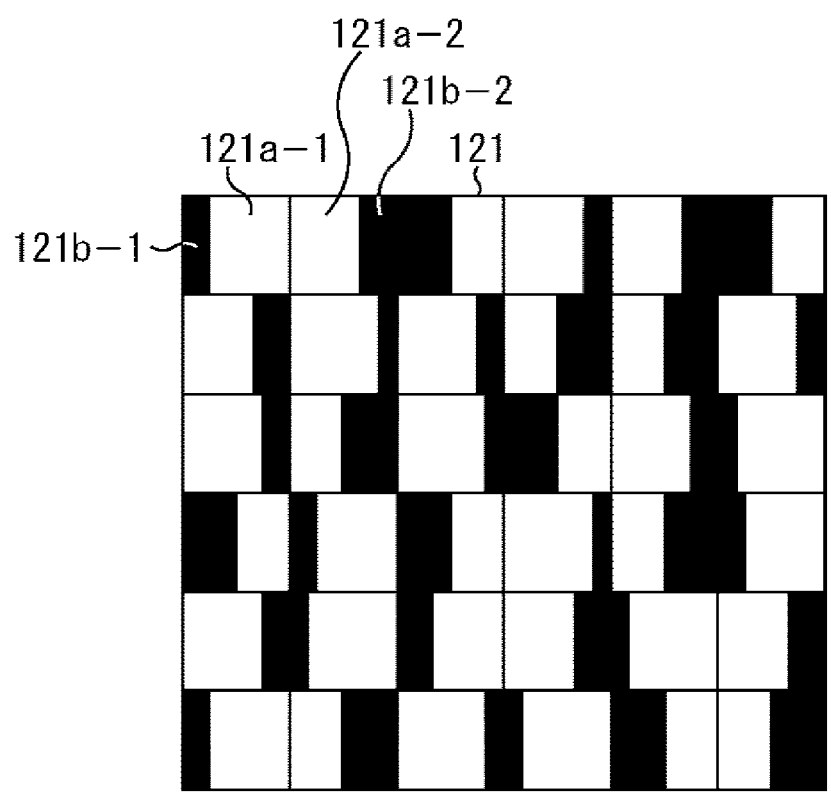
FIG. 3 is a diagram illustrating a configuration example of a pixel array unit of an imaging element in FIG. 2.
Figure 4:
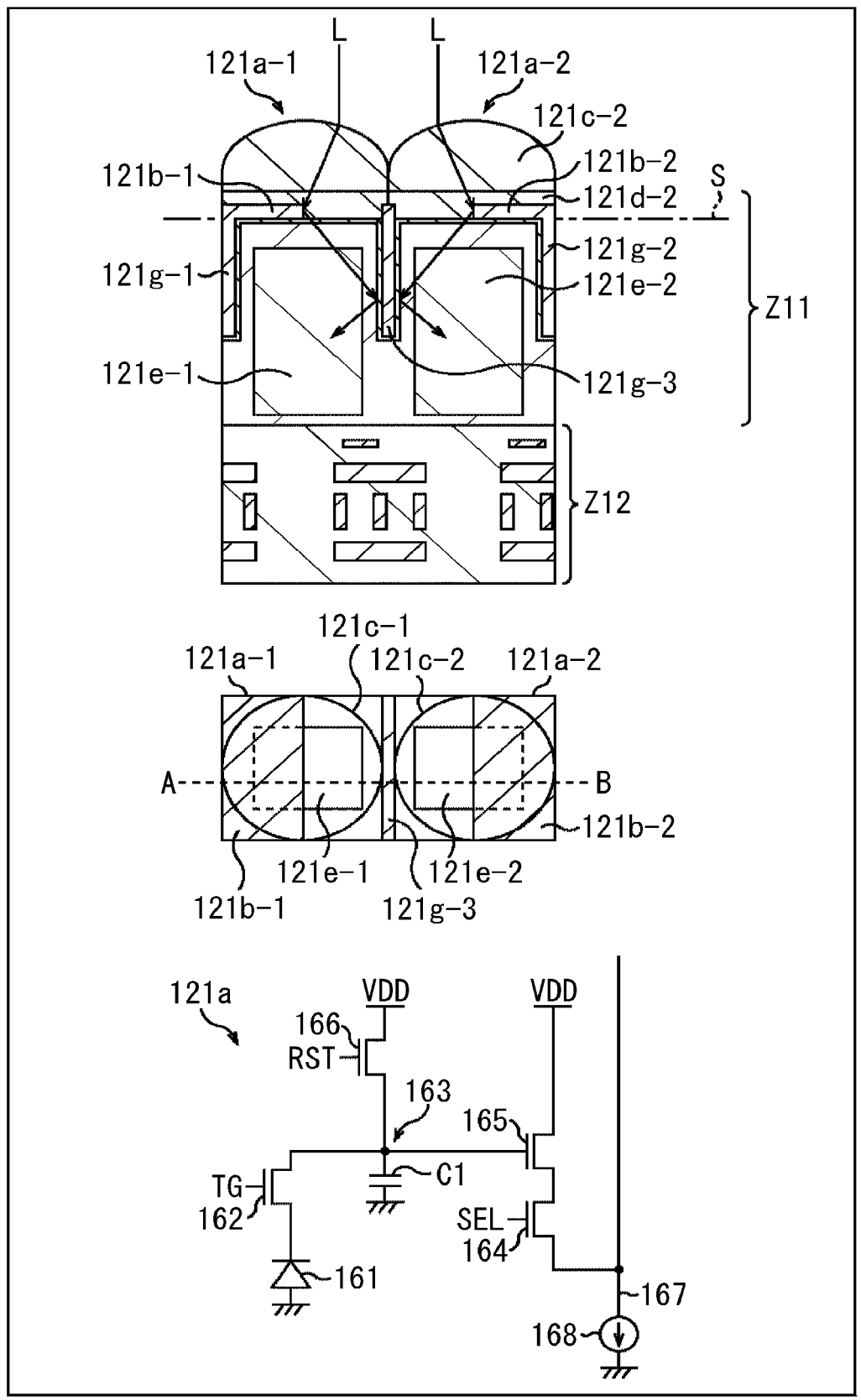
FIG. 4 is a diagram explaining a first configuration example of the imaging element in FIG. 2.
Figure 5:
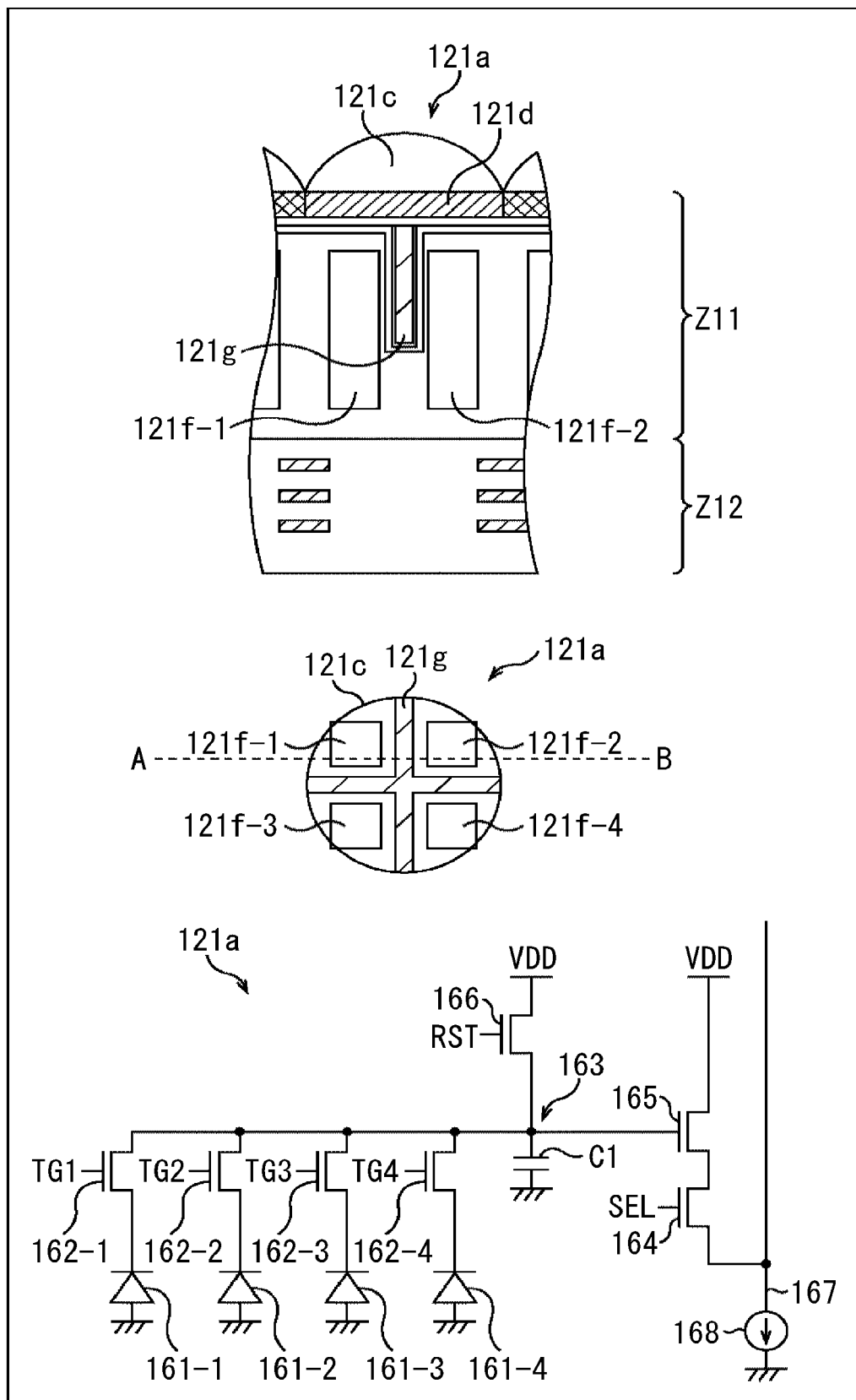
FIG. 5 is a diagram explaining a second configuration example of the imaging element in FIG. 2.

More specifically, in a basic structure, the imaging element 121 may be similar to an imaging element including a general imaging element such as a complementary metal oxide semiconductor (CMOS) image sensor, for example. However, in the imaging element 121, the configuration of each pixel constituting a pixel array is different from the general configuration, and a configuration that provides the incident angle directivity, for example, as described later with reference to FIGS. 3 to 5, is employed. Then, the imaging element 121 has different (changed) light receiving sensitivities depending on the incident angle of incident light for each pixel, and has an incident angle directivity with respect to the incident angle of incident light in units of pixels.

Note that an image output by the imaging element 121 is given as an image constituted by detection signals in which a figure of the subject is not formed as an image, as illustrated in the upper right of FIG. 1 described above, such that the subject cannot be recognized by viewing. That is, a detection image including the detection signals output by the imaging element 121 is a collection of pixel signals, but is an image on which a user cannot recognize the subject even if viewing the image (the subject cannot be visually recognized).

Thus, hereinafter, an image constituted by detection signals in which a figure of a subject is not formed as an image, as illustrated in the upper right of FIG. 1, that is, an image captured by the imaging element 121 will be referred to as a detection image.

Note that the imaging element 121 may not be configured as a pixel array, and may be configured as a line sensor, for example. Furthermore, every incident angle directivity need not necessarily be different in units of pixels, and pixels having the same incident angle directivity may be included.

The restoration unit 122 acquires, from the storage unit 128, a coefficient set group, for example, corresponding to the subject distance corresponding to a distance from the imaging element 51 to the subject surface 31 in FIG. 1 (a subject surface corresponding to the restoration image), and corresponding to the coefficients α1 to α3, β1 to β3, and γ1 to γ3 described above. Furthermore, the restoration unit 122 creates simultaneous equations as indicated by above-described formulas (1) to (3), using the detection signal level of each pixel of the detection image output from the imaging element 121 and the acquired coefficient set group. Then, the restoration unit 122 finds the pixel value of each pixel constituting the image illustrated in the lower right of FIG. 1 on which a figure of the subject is formed as an image, by solving the created simultaneous equations. Therefore, an image in which the user can recognize the subject by viewing (the subject can be visually recognized) is restored from the detection image. Hereinafter, this image restored from the detection image is referred to as a restoration image. However, in a case where the imaging element 121 is sensitive only to light outside the visually recognizable wavelength band, such as ultraviolet rays, the restoration image will not be given as an image in which the subject can be identified like a normal image, but will be referred to as a restoration image also in this case.

Furthermore, hereinafter, an image that is a restoration image as an image in a state in which a figure of a subject is formed as an image, and is not yet subjected to color separation such as a demosaic process and a synchronization process is referred to as a RAW image, and the detection image captured by the imaging element 121 is distinguished as an image other than a RAW image, although being an image in accordance with the color filter array.

Note that the number of pixels of the imaging element 121 and the number of pixels constituting the restoration image need not necessarily be the same.

Furthermore, the restoration unit 122 performs a demosaic process, γ correction, white balance adjustment, a conversion process to a predetermined compression format, and the like on the restoration image as necessary. Then, the restoration unit 122 outputs the restoration image to the bus B1.

The control unit 123 includes, for example, various processors, and controls each unit of the imaging apparatus 101.

The input unit 124 includes an input device for operating the imaging apparatus 101, inputting data used for processes, and the like (for example, a key, a switch, a button, a dial, a touch panel, a remote controller, or the like). The input unit 124 outputs an operation signal, input data, and the like to the bus B1.

The detection unit 125 includes various sensors and the like used for detecting the state and the like of the imaging apparatus 101 and the subject. For example, the detection unit 125 includes an acceleration sensor and a gyro sensor that detect the attitude and movement of the imaging apparatus 101, a position detection sensor that detects the position of the imaging apparatus 101 (for example, a global navigation satellite system (GNSS) receiver and the like), a distance measuring sensor that detects the subject distance, and the like. The detection unit 125 outputs a signal indicating the detection result to the bus B1.

The association unit 126 associates the detection image obtained by the imaging element 121 with metadata corresponding to the detection image. The metadata includes, for example, the coefficient set group, the subject distance, and the like for restoring the restoration image using a targeted detection image.

Note that the method for associating the detection image with metadata is not particularly limited as long as the correspondence between the detection image and the metadata can be specified. For example, the detection image is associated with metadata by adding metadata to image data including the detection image, giving the same ID to the detection image and metadata, or recording the detection image and metadata on the same recording medium 130.

The display unit 127 is constituted by, for example, a display, and displays various types of information (for example, the restoration image and the like). Note that the display unit 127 is also allowed to include a sound output unit such as a speaker to output sound.

The storage unit 128 includes one or more storage apparatuses such as a read only memory (ROM), a random access memory (RAM), and a flash memory, and for example, stores programs, data, and the like used for processes of the imaging apparatus 101. For example, the storage unit 128 stores a coefficient set group corresponding to the above-described coefficients $\alpha 1$ to $\alpha 3$, $\beta 1$ to $\alpha 3$, and $\gamma 1$ to $\gamma 3$ in correspondence with a variety of subject distances. More specifically, for example, the storage unit 128 stores a coefficient set group including a coefficient for each pixel 121a of the imaging element 121 with respect to each point light source set on the subject surface 31 for each subject surface 31 at each subject distance.

The recording/playback unit 129 records data on the recording medium 130, and plays back (reads) data recorded on the recording medium 130. For example, the recording/playback unit 129 records the restoration image on the recording medium 130 or reads the restoration image from the recording medium 130. Furthermore, for example, the recording/playback unit 129 records the detection image and corresponding metadata on the recording medium 130, or reads the detection image and corresponding metadata from the recording medium 130.

The recording medium 130 includes, for example, any of a hard disk drive (HDD), a solid state drive (SSD), a magnetic disk, an optical disc, a magneto-optical disk, a semiconductor memory, and the like, or a combination thereof, or the like.

The communication unit 131 communicates with other instruments (for example, other imaging apparatuses, signal processing apparatuses, and the like) by a predetermined communication scheme. Note that the communication scheme of the communication unit 131 may be either wired or wireless. Furthermore, the communication unit 131 can also support a plurality of communication schemes.

<First Configuration Example of Imaging Element 121>

Next, a first configuration example of the imaging element 121 of the imaging apparatus 101 in FIG. 2 will be described with reference to FIGS. 3 and 4.

FIG. 3 illustrates a front view of a part of a pixel array unit of the imaging element 121. Note that FIG. 3 illustrates an example of a case where the number of pixels in the pixel array unit is 6 longitudinal pixels×6 lateral pixels; however, the number of pixels in the pixel array unit is not restricted to this example.

In the imaging element 121 in FIG. 3, every one pixel 121a is provided with a light shielding film 121b, which is one of modulation elements, such that a part of a light receiving region (light receiving surface) of a photodiode of the one pixel 121a is covered, and incident light incident on each pixel 121a is optically modulated according to the incident angle. Then, for example, by providing the light shielding films 121b in different ranges for each pixel 121a, the light receiving sensitivity with respect to the incident angle of the incident light is differentiated for each pixel 121a, such that each pixel 121a has different incident angle directivity.

For example, ranges in which the light receiving regions of the photodiodes are shielded by the provided light shielding films 121b-1 and 121b-2 are different between the pixels 121a-1 and 121a-2 (at least one of light-shielded regions (positions)) or the light-shielded areas are different). That is, in the pixel 121a-1, the light shielding film 121b-1 is provided so as to shield a part on the left side of the light receiving region of the photodiode by a predetermined width. Meanwhile, in the pixel 121a-2, the light shielding film 121b-2 is provided so as to shield a part on the right side of the light receiving region by a predetermined width. Note that the width of the light receiving region of the photodiode shielded by the light shielding film 121b-1 and the width of the light receiving region of the photodiode shielded by the light shielding film 121b-2 may be different from each other or the same as each other. In the other pixels 121a as well, similarly, the light shielding films 121b are randomly arranged in the pixel array so as to shield different ranges of the light receiving regions for each pixel.

Note that, as the ratio of the light receiving region of each pixel occupied by the light shielding film 121b increases, a state in which the amount of light that can be received by the photodiode decreases is brought about. Accordingly, the area of the light shielding film 121b desirably has an area to an extent that can secure a desired light amount, and for example, a limitation such as a limitation up to a maximum of about ¾ of the light receiving region may be added. By configuring in this manner, the amount of light equal to or larger than the desired amount can be secured. However, if each pixel is provided with an unshielded range having a width corresponding to the wavelength of light to be received, a minimum amount of light can be received. That is, for example, in the case of a blue pixel (B pixel), the wavelength is about 500 nm, and thus a minimum amount of light can be received if the B pixel is not shielded by a width corresponding to this wavelength or wider.

The upper part of FIG. 4 is a side sectional view of the imaging element 121 having the first configuration example, and the middle part of FIG. 4 is a top view of the imaging element 121 having the first configuration example. Furthermore, the side sectional view in the upper part of FIG. 4 depicts an AB cross section in the middle part of FIG. 4. Moreover, the lower part of FIG. 4 is a circuit configuration example of the imaging element 121.

In the imaging element 121 in the upper part of FIG. 4, incident light is incident from the upper side toward the lower side of the figure. Each of the adjacent pixels 121a-1 and 121a-2 is of a so-called back-illuminated type in which a wiring layer Z12 is provided in the lowermost layer in the figure and a photoelectric conversion layer Z11 is provided on top of the wiring layer Z12.

Note that, in a case where there is no need to distinguish between the pixels 121a-1 and 121a-2, description of the numerals at the end of the reference numerals will be omitted, and the pixels 121a-1 and 121a-2 will be simply referred to as pixels 121a. Hereinafter, in the description, numerals at the end of the reference numerals will be similarly omitted in some cases also for other constituents.

Furthermore, FIG. 4 illustrates the side view and the top view only for two pixels constituting the pixel array of the imaging element 121, and needless to say, a number of pixels 121a equal to or larger than two are arranged, illustration of which is omitted.

Moreover, the pixels 121a-1 and 121a-2 include photodiodes 121e-1 and 121e-2, respectively, in the photoelectric conversion layer Z11. In addition, on top of the photodiodes 121e-1 and 121e-2, on-chip lenses 121c-1 and 121c-2 and color filters 121d-1 and 121d-2 are layered from above, respectively.

The on-chip lenses 121c-1 and 121c-2 converge incident light on the photodiodes 121e-1 and 121e-2.

The color filters 121d-1 and 121d-2 are, for example, optical filters that transmit light of specific wavelengths such as red, green, blue, infrared, and white. Note that, in the case of white, the color filters 121d-1 and 121d-2 may be formed as transparent filters or may be taken away.

Each of light shielding films 121g-1 to 121g-3 is formed at a boundary between the pixels in the photoelectric conversion layer Z11 of the pixels 121a-1 and 121a-2, and for example, as illustrated in FIG. 4, suppresses the incidence of incident light L on adjacent pixels and the occurrence of crosstalk.

Furthermore, as illustrated in the upper and middle parts of FIG. 4, the light shielding films 121b-1 and 121b-2 shield parts of a light receiving surface S as viewed from the top. In the light receiving surfaces S of the photodiodes 121e-1 and 121e-2 in the pixels 121a-1 and 121a-2, different ranges from each other are shielded by the light shielding films 121b-1 and 121b-2, whereby different incident angle directivities are set independently for each pixel. However, the light-shielded ranges need not be different among all the pixels 121a of the imaging element 121, and there may be some pixels 121a in which the same range is shielded.

Note that, as illustrated in the upper part of FIG. 4, the light shielding film 121b-1 and the light shielding film 121g-1 are connected to each other and configured in an L-shape as viewed from the side. Similarly, the light shielding film 121b-2 and the light shielding film 121g-2 are connected to each other and configured in an L-shape as viewed from the side. Furthermore, the light shielding films 121b-1 and 121b-2, and the light shielding films 121g-1 to 121g-3 are constituted by metal, and for example, constituted by tungsten (W), aluminum (Al), or an alloy of Al and copper (Cu). In addition, the light shielding films 121b-1 and 121b-2, and the light shielding films 121g-1 to 121g-3 may be formed at the same time using the same metal as wiring in the same process as a process in which the wiring is formed in a semiconductor process. Note that the film thicknesses of the light shielding films 121b-1 and 121b-2, and the light shielding films 121g-1 to 121g-3 need not have the same thickness depending on the position.

Besides, as illustrated in the lower part of FIG. 4, the pixel 121a includes a photodiode 161 (corresponding to the photodiode 121e), a transfer transistor 162, a floating diffusion (FD) unit 163, a select transistor 164, an amplification transistor 165, and a reset transistor 166, and is connected to a current source 168 via a vertical signal line 167.

The photodiode 161 has its anode electrode grounded and its cathode electrode connected to a gate electrode of the amplification transistor 165 via the transfer transistor 162.

The transfer transistor 162 is driven in accordance with a transfer signal TG. For example, when the transfer signal TG supplied to a gate electrode of the transfer transistor 162 becomes a high level, the transfer transistor 162 is turned on. Therefore, charges accumulated in the photodiode 161 are transferred to the FD unit 163 via the transfer transistor 162.

The amplification transistor 165 serves as an input unit of a source follower, which is a reading circuit that reads a signal obtained by photoelectric conversion in the photodiode 161, and outputs a pixel signal having a level according to the charges accumulated in the FD unit 163 to the vertical signal line 167. That is, the amplification transistor 165 has a drain terminal connected to a power supply VDD and a source terminal connected to the vertical signal line 167 via the select transistor 164, thereby constituting the source follower with the current source 168 connected to one end of the vertical signal line 167.

The FD unit 163 is a floating diffusion region having a charge capacitance C1 provided between the transfer transistor 162 and the amplification transistor 165, and temporarily accumulates a charge transferred from the photodiode 161 via the transfer transistor 162. The FD unit 163 is a charge detection unit that converts charge into voltage, and charges accumulated in the FD unit 163 are converted into a voltage in the amplification transistor 165.

The select transistor 164 is driven in accordance with a select signal SEL, and is turned on when the select signal SEL supplied to its gate electrode becomes a high level to connect the amplification transistor 165 and the vertical signal line 167.

The reset transistor 166 is driven in accordance with a reset signal RST. For example, the reset transistor 166 is turned on when the reset signal RST supplied to its gate electrode becomes a high level, and discharges charges accumulated in the FD unit 163 to the power supply VDD to reset the FD unit 163.

For example, the pixel circuit illustrated in the lower part of FIG. 4 works as follows.

That is, as a first working, the reset transistor 166 and the transfer transistor 162 are turned on, charges accumulated in the FD unit 163 are discharged to the power supply VDD, and the FD unit 163 is reset.

As a second working, the reset transistor 166 and the transfer transistor 162 are turned off, an exposure period is started, and charges according to the light amount of incident light are accumulated by the photodiode 161.

As a third working, after the reset transistor 166 is turned on and the FD unit 163 is reset, the reset transistor 166 is turned off. By this working, the FD unit 163 is set to a reference potential.

As a fourth working, the potential of the FD unit 163 in a reset state is output from the amplification transistor 165 as the reference potential.

As a fifth working, the transfer transistor 162 is turned on, and charges accumulated in the photodiode 161 are transferred to the FD unit 163.

As a sixth working, the potential of the FD unit 163 to which the charges in the photodiode have been transferred is output from the amplification transistor 165 as a signal potential.

Then, a signal obtained by subtracting the reference potential from the signal potential by correlated double sampling (CDS) is output as a detection signal (pixel signal) of the pixel 121a. The value of this detection signal (output pixel value) is modulated according to the incident angle of incident light from the subject, and has a characteristic (directivity) different depending on the incident angle (has incident angle directivity).

<Second Configuration Example of Imaging Element 121>

FIG. 5 is a diagram illustrating a second configuration example of the imaging element 121. The upper part of FIG. 5 illustrates a side sectional view of the pixel 121a of the imaging element 121 as the second configuration example, and the middle part of FIG. 5 illustrates a top view of the imaging element 121. Furthermore, the side sectional view in the upper part of FIG. 5 depicts an AB cross section in the middle part of FIG. 5. Moreover, the lower part of FIG. 5 is a circuit configuration example of the imaging element 121.

The imaging element 121 in FIG. 5 has a configuration different from the configuration of the imaging element 121 in FIG. 4 in that four photodiodes 121f-1 to 121f-4 are formed in one pixel 121a, and the light shielding film 121g is formed in a region that separates the photodiodes 121f-1 to 121f-4 from each other. That is, in the imaging element 121 in FIG. 5, the light shielding film 121g is formed in a "+" shape as viewed from the top. Note that common constituents between the above imaging elements are denoted by the same reference numerals as those in FIG. 4, and detailed description will be omitted.

In the imaging element 121 in FIG. 5, the occurrence of electrical and optical crosstalk between the photodiodes 121f-1 to 121f-4 is prevented by separating the photodiodes 121f-1 to 121f-4 with the light shielding film 121g. That is, the light shielding film 121g in FIG. 5 is for preventing crosstalk, and is not for imparting incident angle directivity, similarly to the light shielding film 121g of the imaging element 121 in FIG. 4.

Furthermore, in the imaging element 121 in FIG. 5, one FD unit 163 is shared by the four photodiodes 121f-1 to 121f-4. The lower part of FIG. 5 illustrates a circuit configuration example in which one FD unit 163 is shared by the four photodiodes 121f-1 to 121f-4. Note that, in the lower part of FIG. 5, the description of the same constituents as those in the lower part of FIG. 4 will be omitted.

In the lower part of FIG. 5, a difference from the circuit configuration in the lower part of FIG. 4 is that a configuration provided with photodiodes 161-1 to 161-4 (corresponding to the photodiodes 121f-1 to 121f-4 in the upper part of FIG. 5) and transfer transistors 162-1 to 162-4, between which the FD unit 163 is shared, instead of the photodiode 161 (corresponding to the photodiode 121e in the upper part of FIG. 4) and the transfer transistor 162, is employed.

With such a configuration, charges accumulated in the photodiodes 121f-1 to 121f-4 are transferred to the common FD unit 163 having a predetermined capacitance and being provided at a connecting portion between the photodiodes 121f-1 to 121f-4 and the gate electrode of the amplification transistor 165. Then, a signal according to the level of the charge held in the FD unit 163 is read as a detection signal (pixel signal) (however, the CDS process is performed as described above).

For this reason, the charges accumulated in the photodiodes 121f-1 to 121f-4 can be allowed to selectively contribute to the output, that is, the detection signal of the pixel 121a in a variety of combinations. That is, by employing a configuration in which the charge can be read independently for each of the photodiodes 121f-1 to 121f-4, and making the photodiodes 121f-1 to 121f-4 that contribute to the output (the degree of contribution of the photodiodes 121f-1 to 121f-4 to the output) different from each other, different incident angle directivities can be obtained.

For example, by transferring the charges of the photodiodes 121f-1 and 121f-3 to the FD unit 163 and adding signals obtained by reading the respective charges, an incident angle directivity in a left-right direction can be obtained. Similarly, by transferring the charges of the photodiodes 121f-1 and 121f-2 to the FD unit 163 and adding signals obtained by reading the respective charges, an incident angle directivity in an up-down direction can be obtained.

Furthermore, a signal obtained on the basis of charges selectively read independently from the four photodiodes 121f-1 to 121f-4 is given as a detection signal corresponding to one pixel constituting the detection image.

Note that the contribution of each photodiode 121f (the charge of each photodiode 121f) to the detection signal can be implemented, for example, not only by whether or not the charge (detection value) of each photodiode 121f is transferred to the FD unit 163, but also by resetting charges accumulated in the photodiode 121f before transfer to the FD unit 163 using the electronic shutter function. For example, if the charge of the photodiode 121f is reset immediately before transfer to the FD unit 163, this photodiode 121f is put into a state of having no contribution to the detection signal at all. On the other hand, by providing time between the reset of the charge of the photodiode 121f and the transfer of the charge to the FD unit 163, this photodiode 121f is put into a state of partially having contribution to the detection signal.

As described above, in the case of the imaging element 121 in FIG. 5, by altering the combination of photodiodes used for the detection signal among the four photodiodes 121f-1 to 121f-4, different incident angle directivities can be provided for each pixel. Furthermore, the detection signal output from each pixel 121a of the imaging element 121 in FIG. 5 has a value (output pixel value) modulated according to the incident angle of the incident light from the subject, and has a different characteristic (directivity) depending on the incident angle (has incident angle directivity).

Note that, in the following, a unit for outputting a detection signal corresponding to one pixel of the detection image is referred to as a pixel output unit. The pixel output unit includes at least one or more photodiodes, and usually, every single pixel 121a of the imaging element 121 corresponds to one pixel output unit.

For example, in the imaging element 121 in FIG. 4, since one photodiode 121e is provided in every one pixel 121a, every one pixel output unit includes one photodiode 121e. In different terms, one pixel output unit is constituted by one photodiode 121e.

Then, by differentiating the light shielding states by the light shielding films 121b of the respective pixels 121a from each other, the incident angle directivity of each pixel output unit can be made different. Additionally, in the imaging element 121 in FIG. 4, the incident light to each pixel 121a is optically modulated using the light shielding film 121b, and as a result, a detection signal for one pixel of the detection image reflecting the incident angle directivity is obtained by a signal output from the photodiode 121e of each pixel 121a. That is, the imaging element 121 in FIG. 4 includes a plurality of pixel output units that receive incident light from the subject incident not via either an imaging lens or a pinhole, each pixel output unit includes one photodiode 121e, and a characteristic (incident angle directivity) with respect to the incident angle of the incident light from the subject is set for each pixel output unit.

On the other hand, in the imaging element 121 in FIG. 5, every one pixel 121a is provided with the four photodiodes 121f-1 to 121f-4, such that every one pixel output unit includes four photodiodes 121e. In different terms, one pixel output unit is constituted by four photodiodes 121*f*. Meanwhile, each photodiode 121*e* alone does not constitute an individual pixel output unit.

Then, as described above, the incident angle directivity of each pixel output unit is made different by differentiating the photodiode 121*f* that contributes to the detection signal among the four photodiodes 121*f*-1 to 121*f*-4 for each pixel 121*a*. That is, in the imaging element 121 in FIG. 5, a range that does not contribute to the output (detection signal) among the four photodiodes 121*f*-1 to 121*f*-4 functions similarly to a light-shielded region. Then, a detection signal for one pixel of the detection image reflecting the incident angle directivity is obtained by a combination of signals output from the photodiodes 121*f*-1 to 121*f*-4. That is, the imaging element 121 in FIG. 5 includes a plurality of pixel output units that receive incident light from the subject incident not via either an imaging lens or a pinhole, each pixel output unit includes a plurality of photodiodes (for example, the photodiodes 121*f*-1 to 121*f*-4), and the photodiodes that contribute to the output (the degrees of contribution of the photodiodes to the output) are made different; consequently characteristics (incident angle directivities) of the respective pixel output units with respect to the incident angle of the incident light from the subject are different from each other.

Note that, in the imaging element 121 in FIG. 5, since the incident light is incident on all the photodiodes 121*f*-1 to 121*f*-4 without being optically modulated, the detection signal is not a signal obtained by optical modulation. Furthermore, hereinafter, the photodiode 121*f* that does not contribute to the detection signal is also referred to as a photodiode 121*f* that does not contribute to the pixel output unit or the output.

Note that FIG. 5 illustrates an example in which the light receiving surface of the pixel output unit (pixel 121*a*) is divided into four equal parts, and photodiodes 121*f* having light receiving surfaces of the same size as each other are arranged in the respective regions, that is, an example in which the photodiode is divided into four equal parts; however, the number of divisions and division positions of the photodiode can be arbitrarily set.

For example, the photodiode need not necessarily be equally divided, and the division positions of the photodiode may be made different for each pixel output unit. With this configuration, for example, even if the photodiodes 121*f* at the same position are caused to contribute to the output among a plurality of pixel output units, the incident angle directivity is differentiated between the pixel output units. Furthermore, for example, by differentiating the number of divisions between the pixel output units, it becomes possible to set the incident angle directivity more freely. Moreover, for example, both of the number of divisions and the division position may be made different between the pixel output units.

In addition, in both of the imaging element 121 in FIG. 4 and the imaging element 121 in FIG. 5, each pixel output unit has a configuration in which the incident angle directivity can be set independently. On the other hand, in the imaging apparatuses indicated in Non-Patent Document 1 and Patent Documents 1 and 2 described above, each pixel output unit of the imaging element does not have a configuration in which the incident angle directivity can be set independently. Note that, in the imaging element 121 in FIG. 4, the incident angle directivity of each pixel output unit is set by the light shielding film 121*b* at the time of manufacture. On the other hand, in the imaging element 121 in FIG. 5, the number of divisions and the division position of the photodiode of each pixel output unit are set at the time of manufacture, but the incident angle directivity (combination of photodiodes contributing to the output) of each pixel output unit can be set at the time of use (for example, at the time of imaging). Note that, in both of the imaging element 121 in FIG. 4 and the imaging element 121 in FIG. 5, all the pixel output units need not necessarily include a configuration that provides the incident angle directivity.

In addition, as described earlier, usually, every single pixel of the imaging element corresponds to one pixel output unit; however, as will be described later, there are cases where one pixel output unit is constituted by a plurality of pixels. Hereinafter, description will be given assuming that every single pixel of the imaging element corresponds to one pixel output unit unless otherwise mentioned.

<About Principle of Producing Incident Angle Directivity>

Figure 6:
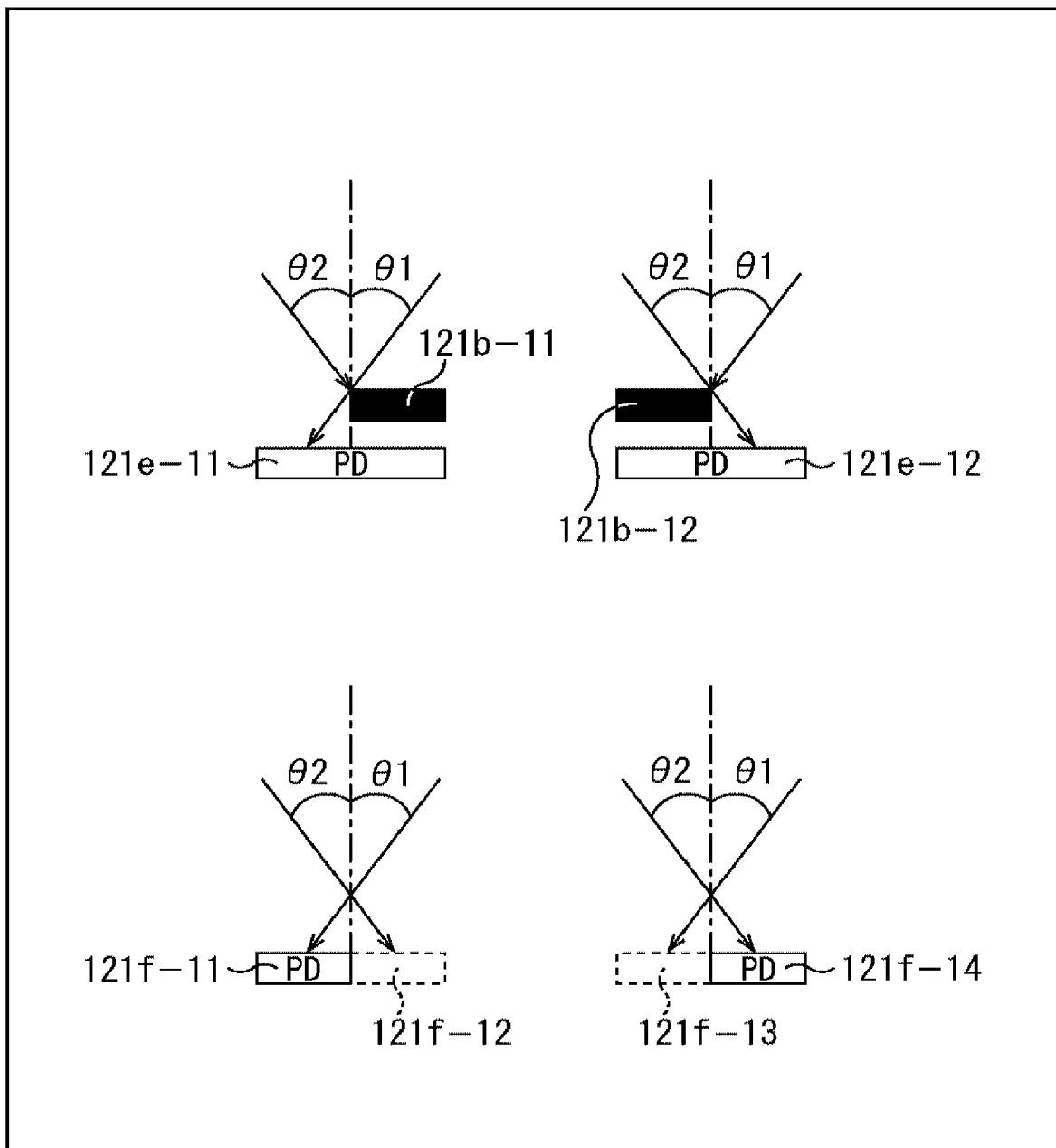
FIG. 6 is a diagram explaining a principle of incident angle directivity generation.

The incident angle directivity of each pixel of the imaging element 121 is generated, for example, according to the principle illustrated in FIG. 6. Note that the upper left portion and the upper right portion of FIG. 6 are diagrams explaining the principle of incident angle directivity generation in the imaging element 121 in FIG. 4, while the lower left portion and lower right portion of FIG. 6 are diagrams explaining the principle of incident angle directivity generation in the imaging element 121 in FIG. 5.

Each pixel in the upper left and upper right portions of FIG. 6 includes one photodiode 121*e*. In contrast, each pixel in the lower left and lower right portions of FIG. 6 includes two photodiodes 121*f*. Note that an example in which one pixel includes two photodiodes 121*f* is illustrated here; however, this is for convenience of explanation, and the number of photodiodes 121*f* included in one pixel may be other numbers.

In the pixel in the upper left portion of FIG. 6, a light shielding film 121*b*-11 is formed so as to shield the right half of the light receiving surface of the photodiode 121*e*-11. Furthermore, in the pixel in the upper right portion of FIG. 6, a light shielding film 121*b*-12 is formed so as to shield the left half of the light receiving surface of the photodiode 121*e*-12. Note that alternate long and short dash lines in the figure are each an auxiliary line that passes through the center of the light receiving surface of the photodiode 121*e* in a horizontal direction and is perpendicular to the light receiving surface.

For example, in the pixel in the upper left portion of FIG. 6, incident light from an upper right direction that forms an incident angle θ1 with respect to the alternate long and short dash line in the figure is easily received by the left half range of the photodiode 121*e*-11, which is unshielded by the light shielding film 121*b*-11. In contrast, incident light from an upper left direction that forms an incident angle θ2 with respect to the alternate long and short dash line in the figure is not easily received by the left half range of the photodiode 121*e*-11, which is unshielded by the light shielding film 121*b*-11. Accordingly, the pixel in the upper left portion of FIG. 6 has an incident angle directivity with higher light receiving sensitivity with respect to incident light from the upper right in the figure and lower light receiving sensitivity with respect to incident light from the upper left.

On the other hand, for example, in the pixel in the upper right portion of FIG. 6, incident light from an upper right direction that forms the incident angle θ1 is not easily received by the left half range of the photodiode 121*e*-12, which is shielded by the light shielding film 121*b*-12. In contrast, incident light from an upper left direction that forms the incident angle θ2 is easily received by the right half range of the photodiode 121e-12, which is unshielded by the light shielding film 121b-12. Accordingly, the pixel in the upper right portion of FIG. 6 has an incident angle directivity with lower light receiving sensitivity with respect to incident light from the upper right in the figure and higher light receiving sensitivity with respect to incident light from the upper left.

Furthermore, the pixel in the lower left portion of FIG. 6 is provided with photodiodes 121f-11 and 121f-12 on the left and right in the figure, and configured with the incident angle directivity by reading the detection signal of one of the photodiodes 121f-11 and 121f-12, without providing the light shielding film 121b.

That is, in the pixel in the lower left portion of FIG. 6, by reading only the signal of the photodiode 121f-11 provided on the left side in the figure, incident angle directivity similar to the incident angle directivity of the pixel in the upper left portion of FIG. 6 can be obtained. In other words, incident light from an upper right direction that forms the incident angle θ1 with respect to the alternate long and short dash line in the figure is incident on the photodiode 121f-11, and a signal corresponding to the amount of received light is read from the photodiode 121f-11; thus the photodiode 121f-11 contributes to the detection signal output from this pixel. In contrast, incident light from an upper left direction that forms the incident angle θ2 with respect to the alternate long and short dash line in the figure is incident on the photodiode 121f-12, but reading from the photodiode 121f-12 is not performed; thus the photodiode 121f-12 does not contribute to the detection signal output from this pixel.

Similarly, in a case where two photodiodes 121f-13 and 121f-14 are provided as in the pixel in the lower right portion of FIG. 6, by reading only the signal of the photodiode 121f-14 provided on the right side in the figure, incident angle directivity similar to the incident angle directivity of the pixel in the upper right portion of FIG. 6 can be obtained. That is, incident light from an upper right direction that forms the incident angle θ1 is incident on the photodiode 121f-13, but the signal is not read from the photodiode 121f-13; thus the photodiode 121f-13 does not contribute to the detection signal output from this pixel. In contrast, incident light from an upper left direction that forms the incident angle θ2 is incident on the photodiode 121f-14, and a signal corresponding to the amount of received light is read from the photodiode 121f-14; thus the photodiode 121f-14 contributes to the detection signal output from this pixel.

Note that, in the pixels in the upper portion of FIG. 6, an example in which the light-shielded range and the non-light-shielded range are split at the center position of the pixel (the light receiving surface of the photodiode 121e) in the horizontal direction is indicated; however, the pixels may be split at other positions. Furthermore, in the pixels in the lower portion of FIG. 6, an example in which the two photodiodes 121f are split at the center position of the pixel in the horizontal direction is indicated; however the pixels may be split at other positions. In this manner, by varying the light shielding range or a position where the photodiodes 121f are split, different incident angle directivities can be produced.

<About Incident Angle Directivity in Configuration Including On-Chip Lens>

Next, the incident angle directivity in a configuration including the on-chip lens 121c will be described with reference to FIG. 7.

Figure 7:
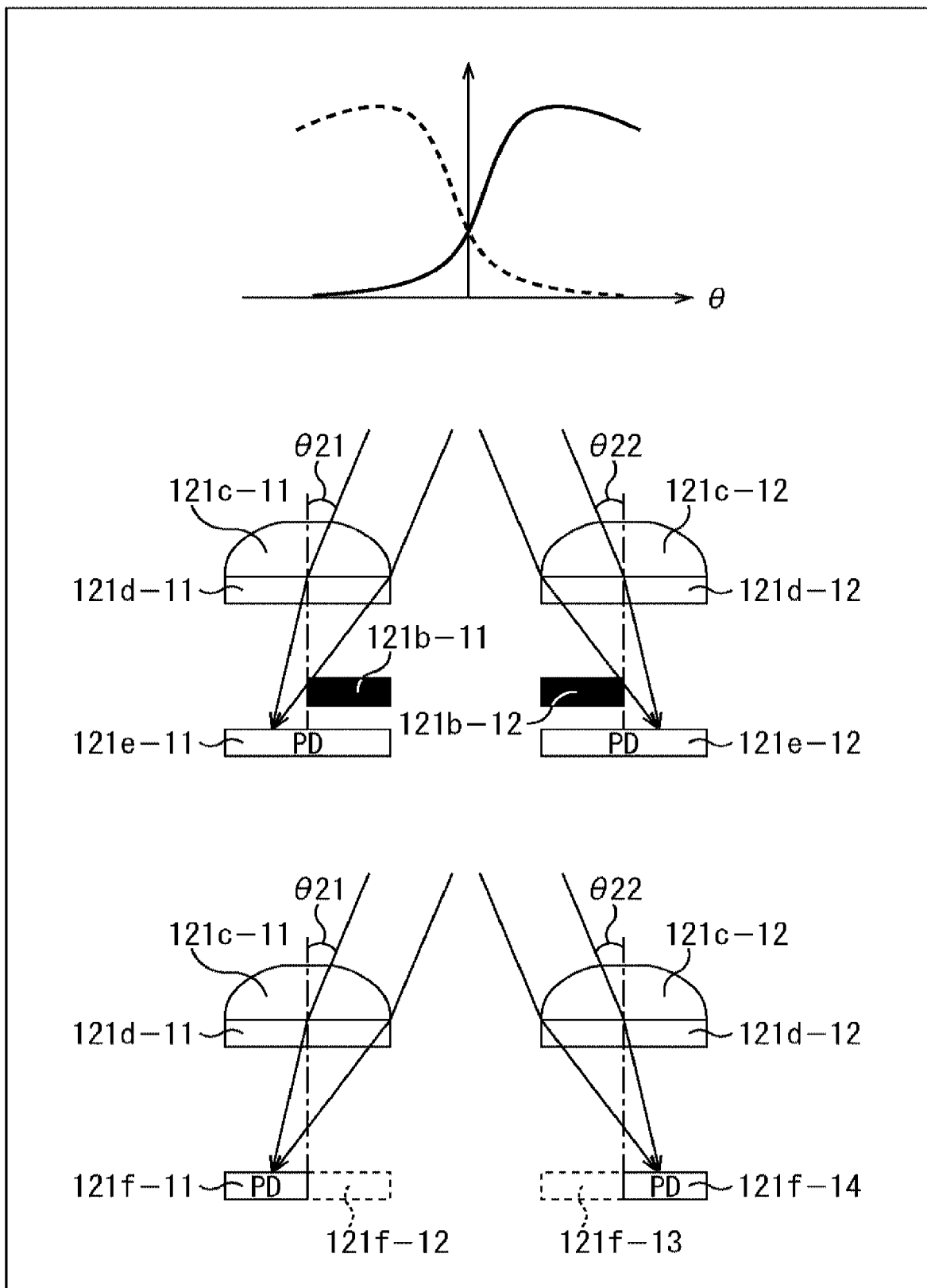
FIG. 7 is a diagram explaining a change in incident angle directivities using an on-chip lens.

A graph in the upper part of FIG. 7 illustrates incident angle directivities of pixels in the middle and lower parts of FIG. 7. Note that the abscissa axis indicates the incident angle θ, and the ordinate axis indicates the detection signal level. In addition, it is assumed that the incident angle θ has zero degrees in a case where the direction of incident light coincides with an alternate long and short dash line on the left side of the middle part of FIG. 7, the side of an incident angle θ21 on the left side of the middle part of FIG. 7 is a positive direction, and the side of an incident angle θ22 on the right side of the middle part of FIG. 7 is a negative direction. Accordingly, the incident angle of incident light incident on the on-chip lens 121c from the upper right is larger than the incident angle of incident light incident from the upper left. That is, the incident angle θ increases as the traveling direction of incident light tilts to the left (increases in the positive direction) and decreases as the traveling direction tilts to the right (increases in the negative direction).

Furthermore, the pixel in the left portion of the middle part of FIG. 7 is obtained by adding an on-chip lens 121c-11 that converges incident light, and a color filter 121d-11 that transmits light of a predetermined wavelength to the pixel in the left portion of the upper part of FIG. 6. That is, in this pixel, the on-chip lens 121c-11, the color filter 121d-11, the light shielding film 121b-11, and the photodiode 121e-11 are layered in this order from a light incident direction on the upper side of the figure.

Similarly, the pixel in the right portion of the middle part of FIG. 7, the pixel in left portion of the lower part of FIG. 7, and the pixel in the right portion of the lower part of FIG. 7 are obtained by adding the on-chip lens 121c-11 and the color filter 121d-11, or the on-chip lens 121c-12 and the color filter 121d-12 to the pixel in the right portion of the upper part of FIG. 6, the pixel in the left portion of the lower part of FIG. 6, and the pixel in the right portion of the lower part of FIG. 6, respectively.

In the pixel in the left portion of the middle part of FIG. 7, the detection signal level (light receiving sensitivity) of the photodiode 121e-11 changes according to the incident angle θ of the incident light, as indicated by the solid line waveform in the upper part of FIG. 7. That is, the larger the incident angle θ, which is an angle formed by the incident light with respect to the alternate long and short dash line in the figure (the larger the incident angle θ is in the positive direction (the more the incident angle θ tilts in the right direction in the figure)), the larger the detection signal level of the photodiode 121e-11, because the light is converged in a range where the light shielding film 121b-11 is not provided. Conversely, the smaller the incident angle θ of the incident light (the larger the incident angle θ is in the negative direction (the more the incident angle θ tilts in the left direction in the figure)), the smaller the detection signal level of the photodiode 121e-11, because the light is converged in a range where the light shielding film 121b-11 is provided.

Furthermore, in the pixel in the right portion of the middle part of FIG. 7, the detection signal level (light receiving sensitivity) of the photodiode 121e-12 changes according to the incident angle θ of the incident light, as indicated by the dotted line waveform in the upper part of FIG. 7. That is, the larger the incident angle θ of the incident light (the larger the incident angle θ is in the positive direction), the smaller the detection signal level of the photodiode 121e-12, because the light is converged in a range where the light shielding film 121b-12 is provided. Conversely, the smaller the incident angle θ of the incident light (the larger the incident angle θ is in the negative direction), the larger the detection signal level of the photodiode 121e-12, because the light is incident on a range where the light shielding film 121b-12 is not provided.

These solid line and dotted line waveforms illustrated in the upper part of FIG. 7 can be changed according to the range of the light shielding film 121b. Accordingly, incident angle directivities different from each other can be provided in units of pixels depending on the range of the light shielding film 121b.

As described earlier, the incident angle directivity is a characteristic of the light receiving sensitivity of each pixel according to the incident angle θ, and it can be said that, for the pixels in the middle part of FIG. 7, this is a characteristic of the light shielding value according to the incident angle θ. That is, the light shielding film 121b provides shielding against incident light in a specific direction at a higher level, but cannot provide sufficient shielding against incident light from directions other than the specific direction. This change in level at which shielding against light can be provided produces different detection signal levels according to the incident angle θ as illustrated in the upper part of FIG. 7. Accordingly, if a direction in which light shielding can be provided at the highest level in each pixel is defined as the light shielding direction of each pixel, providing different incident angle directivities from each other in units of pixels is expressed in different terms as providing different light shielding directions from each other in units of pixels.

Furthermore, in the pixel in the left portion of the lower part of FIG. 7, similarly to the pixel in the left portion of the lower part of FIG. 6, by using only the signal of the photodiode 121f-11 in the left portion in the figure, incident angle directivity similar to the incident angle directivity of the pixel in the left portion of the middle part of FIG. 7 can be obtained. That is, when the incident angle θ of the incident light increases (when the incident angle θ increases in the positive direction), the detection signal level increases, because the light is converged in the range of the photodiode 121f-11, from which the signal is read. Conversely, the smaller the incident angle θ of the incident light (the larger the incident angle θ is in the negative direction), the smaller the detection signal level, because the light is converged in the range of the photodiode 121f-12, from which the signal is not read.

In addition, similarly, in the pixel in the right portion of the lower part of FIG. 7, similarly to the pixel in the right portion of the lower part of FIG. 6, by using only the signal of the photodiode 121f-14 in the right portion in the figure, incident angle directivity similar to the incident angle directivity of the pixel in the right portion of the middle part of FIG. 7 can be obtained. That is, when the incident angle θ of the incident light increases (when the incident angle θ increases in the positive direction), the level of the detection signal in units of pixels decreases, because the light is converged in the range of the photodiode 121f-13, which does not contribute to the output (detection signal). Conversely, the smaller the incident angle θ of the incident light (the larger the incident angle θ is in the negative direction), the larger the level of the detection signal in units of pixels, because the light is converged in the range of the photodiode 121f-14, which contributes to the output (detection signal).

Note that, as in the pixels in the lower part of FIG. 7, in a pixel in which a plurality of photodiodes is provided within the pixel and the photodiode that contributes to the output can be altered, in order to provide each photodiode with directivity with respect to the incident angle of incident light and produce the incident angle directivity in units of pixels, the on-chip lens 121c is an essential constituent for each pixel.

Note that, as for the incident angle directivity, it is desirable that the randomness be higher in units of pixels. This is because, for example, if neighboring pixels have the same incident angle directivity, there is a possibility that formulas (1) to (3) described above or formulas (4) to (6) described later are given as the same formula as each other; as a result, the number of formulas is insufficient with respect to an unknown, which is the solution of the simultaneous equations, and there is a possibility that pixel values constituting the restoration image cannot be found.

Note that, in the following description, an example in the case of using a pixel 121a that implements incident angle directivity using the light shielding film 121b like the pixel 121a in FIG. 4 will be mainly described. However, except for a case where the light shielding film 121b is essential, it is basically possible as well to use a pixel 121a that implements incident angle directivity by dividing the photodiode.

<About Configuration of Light Shielding Film>

In the above, as illustrated in FIG. 3, as the configuration of the light shielding film 121b of each pixel 121a of the imaging element 121, an example in which the entire light receiving surface is shielded in the vertical direction, and the light shielding width and position in the horizontal direction are changed is indicated; however, as a matter of course, each pixel 121a may be provided with incident angle directivity in such a manner that the entire light receiving surface is shielded with respect to the horizontal direction, and the width (height) and position in the vertical direction are changed.

Note that, hereinafter, as in the example in FIG. 3, a light shielding film 121b that shields the entire light receiving surface of the pixel 121a with respect to the vertical direction, and shields the light receiving surface by a predetermined width with respect to the horizontal direction will be referred to as a lateral belt-type light shielding film 121b. Furthermore, a light shielding film 121b that shields the entire light receiving surface of the pixel 121a with respect to the horizontal direction, and shields the light receiving surface by a predetermined height with respect to the vertical direction will be referred to as a longitudinal belt-type light shielding film 121b.

Figure 8:
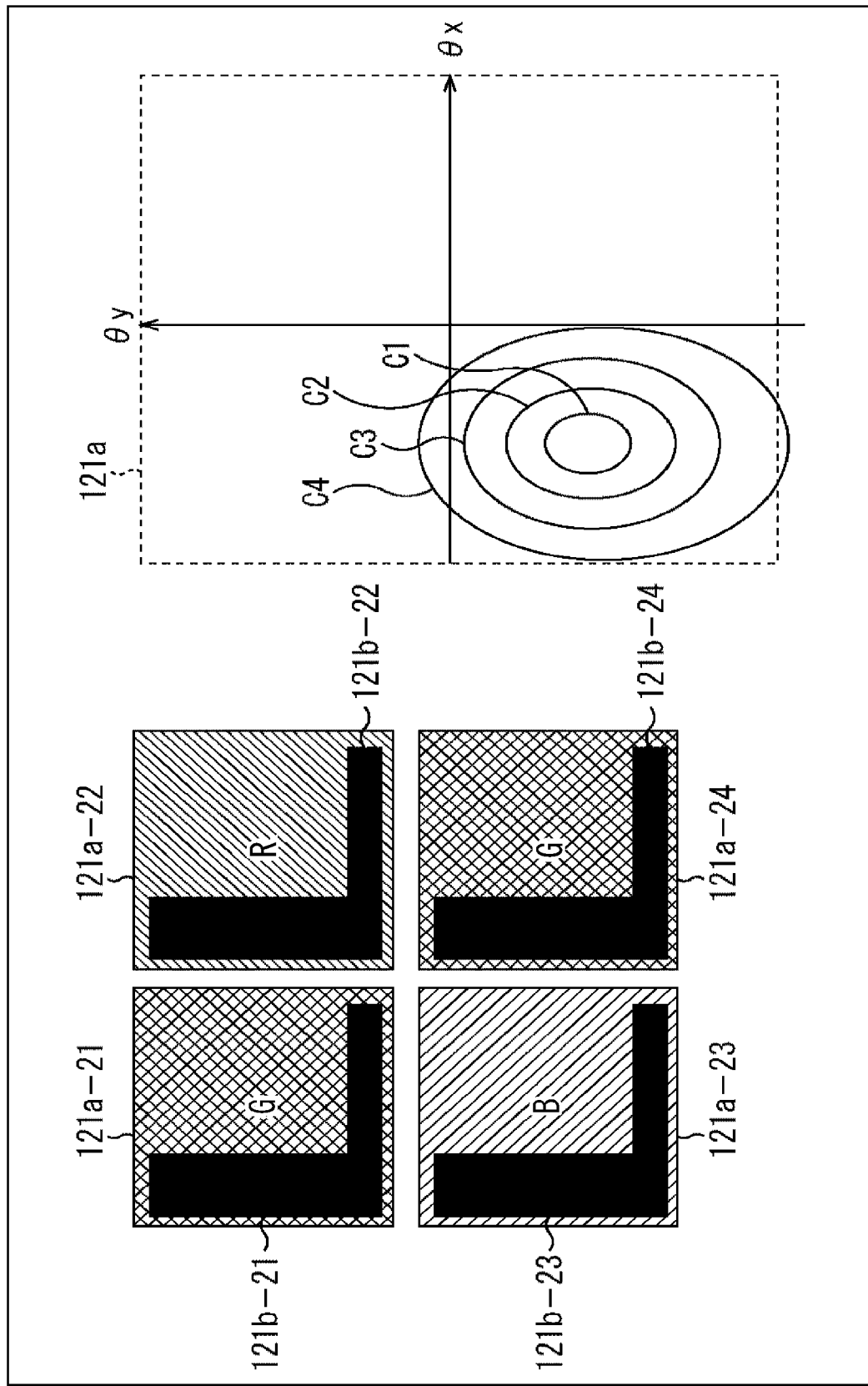
FIG. 8 is a diagram illustrating an example of the types of light shielding film.

In addition, as illustrated in the left portion of FIG. 8, longitudinal belt-type and lateral belt-type light shielding films 121b may be combined such that, for example, a light shielding film 121b having a shape like the letter "L" is provided for each pixel in the Bayer array.

Note that, in FIG. 8, the black range represents the light shielding film 121b, and will be similarly displayed in the subsequent drawings unless otherwise noted. Furthermore, in the example in FIG. 8, L-shaped light shielding films 121b-21 to 121b-24 are provided for respective ones of pixels 121a-21 and 121a-24 as green (G) pixels, a pixel 121a-22 as a red (R) pixel, and a pixel 121a-23 as a blue (B) pixel, which constitute a Bayer array.

In this case, each pixel 121a has incident angle directivity as illustrated in the right portion of FIG. 8. That is, the right portion of FIG. 8 illustrates the distribution of light receiving sensitivity of each pixel 121a, in which the abscissa axis represents an incident angle θx of the incident light in the horizontal direction (x direction), and the ordinate axis represents an incident angle θy of the incident light in the vertical direction (y direction). Then, the light receiving sensitivity within a range C4 is higher than the light receiving sensitivity outside the range C4, the light receiving sensitivity within a range C3 is higher than the light receiving sensitivity outside the range C3, the light receiving sensitivity within a range C2 is higher than the light receiving sensitivity outside the range C2, and the light receiving sensitivity within a range C1 is higher than the light receiving sensitivity outside the range C1.

Accordingly, in each pixel 121a, a detection signal level with respect to incident light whose incident angle θx in the horizontal direction (x direction) and incident angle θy in the vertical direction (y direction) fall within the range C1 is the highest. Then, the detection signal level lowers in the order of incident light whose incident angle θx and incident angle θy fall within the range C2, the range C3, the range C4, and a range other than the range C4. Note that the intensity distribution of the light receiving sensitivity illustrated in the right portion of FIG. 8 is determined depending on the range shielded by the light shielding film 121b in each pixel 121a, regardless of the Bayer array.

Note that, hereinafter, as in the L-shaped light shielding films 121b-21 to 121b-24 in FIG. 8, a light shielding film 121b having a shape in which a longitudinal belt-type light shielding film and a lateral belt-type light shielding film are joined at their respective end portions is collectively referred to as an L-shaped-type light shielding film 121b.

<Method for Setting Incident Angle Directivity>

Next, an example of a method for setting the incident angle directivity will be described with reference to FIG. 9.

Figure 9:
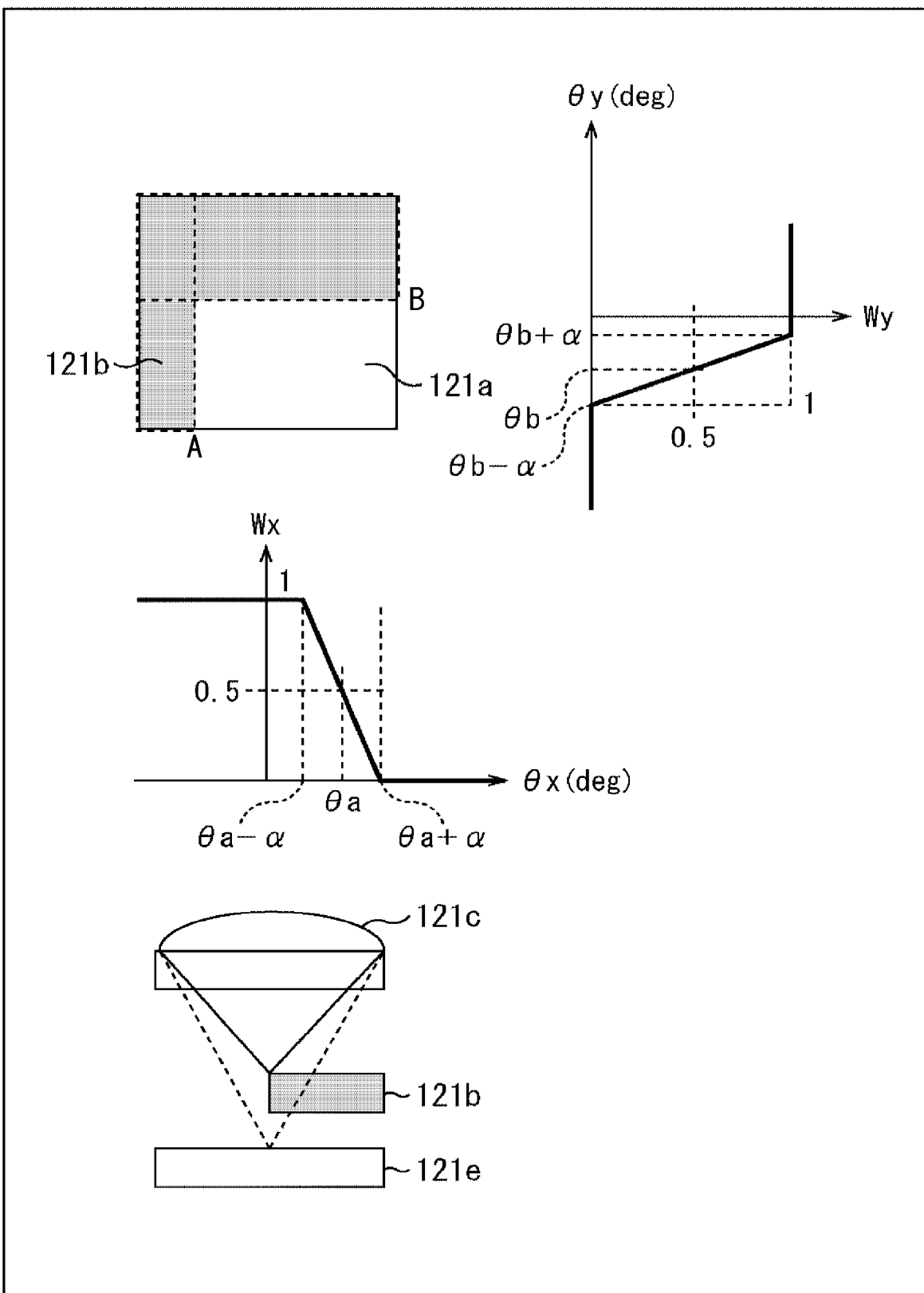
FIG. 9 is a diagram explaining the designing of incident angle directivity.

For example, as illustrated in the upper part of FIG. 9, a case where the light shielding range of the light shielding film 121b in the horizontal direction is shaped as a range from a left end portion to a position A of the pixel 121a, and the light shielding range in the vertical direction is shaped as a range from an upper end portion to a position B of the pixel 121a will be considered.

In this case, a weight Wx ranging from zero to one is set; the weight Wx is a weight according to the incident angle θx (deg) from the center position of each pixel in the horizontal direction, and serves as an index of the incident angle directivity in the horizontal direction. In more detail, in a case where it is assumed that the weight Wx is given as 0.5 at the incident angle θx=θa corresponding to the position A, the weight Wx is set such that the weight Wx is given as 1 at the incident angle θx<θa−α, the weight Wx is given as (−(θx−θa)/2α+0.5) at θa−α≤the incident angle θx≤θa+α, and the weight Wx is given as 0 at the incident angle θx>θa+α.

Similarly, a weight Wy ranging from zero to one is set; the weight Wy is a weight according to the incident angle θy (deg) from the center position of each pixel in the vertical direction, and serves as an index of the incident angle directivity in the vertical direction. In more detail, in a case where it is assumed that the weight Wy is given as 0.5 at the incident angle θy=θb corresponding to the position B, the weight Wy is set such that the weight Wy is given as 0 at the incident angle θy<θb−α, the weight Wy is given as ((θy−θb)/2α+0.5) at θb−α≤the incident angle θy≤θb+α, and the weight Wy is given as 1 at the incident angle θy>θb+α.

Note that the weights Wx and Wy change as in the graph in FIG. 9 in a case where the ideal conditions are satisfied.

Then, by using the weights Wx and Wy thus found, the incident angle directivity, that is, a coefficient corresponding to the light receiving sensitivity characteristic of each pixel 121a can be found. For example, a value obtained by multiplying a weight Wx corresponding to the incident angle θx of incident light from a certain point light source on the subject surface 31 and a weight Wy corresponding to the incident angle θy of the incident light is set as a coefficient for this certain point light source.

Furthermore, at this time, the gradient (½α) indicating the change in weight in a range where the weight Wx in the horizontal direction and the weight Wy in the vertical direction are given as around 0.5 can be set by using the on-chip lenses 121c having different focal lengths.

For example, as indicated by the solid line in the lower part of FIG. 9, in a case where the focal length of the on-chip lens 121c matches an outer surface of the light shielding film 121b, the gradients (½α) of the weight Wx in the horizontal direction and the weight Wy in the vertical direction are steep. That is, the weights Wx and Wy suddenly change to 0 or 1 near the boundaries with the incident angle θx=θa in the horizontal direction and the incident angle θy=θb in the vertical direction, where the values are given as near 0.5.

Furthermore, for example, as indicated by the dotted line in the lower part of FIG. 9, in a case where the focal length of the on-chip lens 121c matches an outer surface of the photodiode 121e, the gradients (½α) of the weight Wx in the horizontal direction and the weight Wy in the vertical direction are moderate. That is, the weights Wx and Wy gradually change to 0 or 1 near the boundaries with the incident angle θx=θa in the horizontal direction and the incident angle θy=θb in the vertical direction, where the values are given as near 0.5.

For example, the focal length of the on-chip lens 121c changes depending on the curvature of the on-chip lens 121c. Accordingly, by using the on-chip lenses 121c having different curvatures and changing the focal length of the on-chip lens 121c, different incident angle directivities, that is, different light receiving sensitivity characteristics can be obtained.

Consequently, the incident angle directivity of the pixel 121a can be adjusted by a combination of the range in which the photodiode 121e is shielded by the light shielding film 121b and the curvature of the on-chip lens 121c. Note that the curvature of the on-chip lens may be the same for all the pixels 121a of the imaging element 121 or may be different for some of the pixels 121a.

For example, as an index representing the incident angle directivity of each pixel 121a of the imaging element 121, the characteristics of the weights Wx and Wy as indicated in the graph in FIG. 9 are set for each pixel 121a, on the basis of the position of each pixel 121a, the shape, position, and range of the light shielding film 121b of each pixel 121a, the curvature of the on-chip lens 121c, and the like. Furthermore, the incident angle of a light ray from a certain point light source on the subject surface 31 having a predetermined subject distance to a certain pixel 121a of the imaging element 121 is found on the basis of the positional relationship between the certain point light source and the certain pixel 121a. Then, the coefficient of the certain pixel 121a with respect to the certain point light source is found on the basis of the found incident angle and the characteristics of the weights Wx and Wy of the certain pixel 121a.

Similarly, by finding the coefficients as described above for the combinations of the respective point light sources on the subject surface 31 and the respective pixels 121a of the imaging element 121, a coefficient set group for the imaging element 121 with respect to the subject surface 31, such as one including the coefficient set α1, β1, γ1, the coefficient set α2, β2, γ2, and the coefficient set α3, β3, γ3 in above-described formulas (1) to (3), can be found.

Note that, as will be described later with reference to FIG. 13, when the subject distance from the subject surface 31 to the light receiving surface of the imaging element 121 is different, the incident angle of the light ray from each point light source on the subject surface 31 to the imaging element 121 is different, such that different coefficient set groups are required for each subject distance.

Furthermore, even on the subject surfaces 31 having the same subject distance, if the number and arrangement of the point light sources to be set are different, the incident angles of the light rays from the respective point light sources to the imaging element 121 are different. Accordingly, a plurality of coefficient set groups is sometimes required for the subject surfaces 31 having the same subject distance. In addition, the incident angle directivity of each pixel 121a needs to be set so as to ensure the independence of the simultaneous equations described above.

<Difference Between On-Chip Lens and Imaging Lens>

In the imaging apparatus 101 of the present disclosure, the imaging element 121 has a configuration that does not require an optical block or a pinhole including an imaging lens, but as described above, the on-chip lens 121c is provided. Here, the on-chip lens 121c and the imaging lens have different physical actions.

Figure 10:
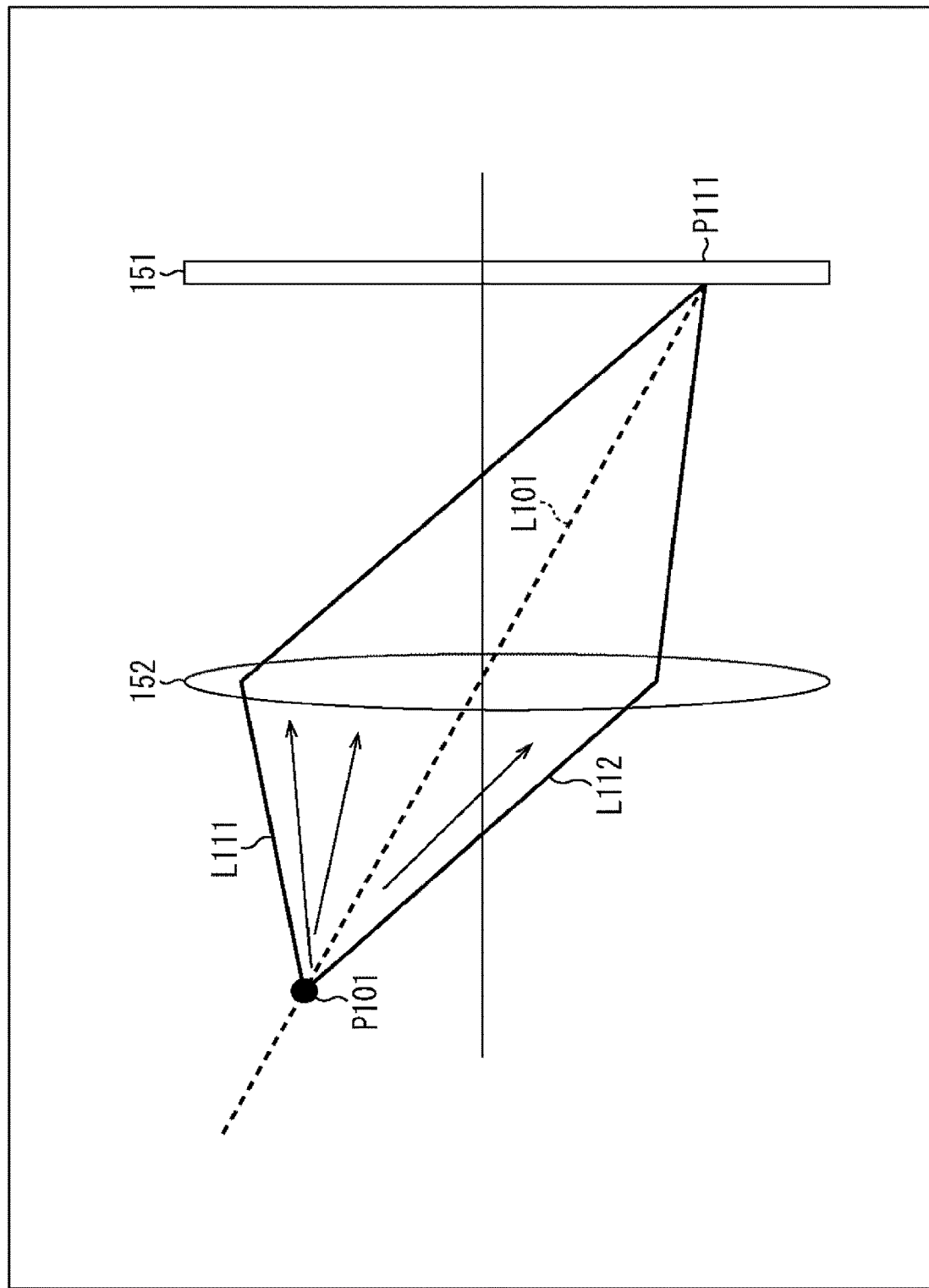
FIG. 10 is a diagram explaining a difference between an on-chip lens and an imaging lens.

For example, as illustrated in FIG. 10, light that has been incident on an imaging lens 152, out of diffused light dispersed from a point light source P101 is converged at a pixel position P111 on an imaging element 151. That is, the imaging lens 152 is designed to converge diffused light incident at different angles from the point light source P101 at the pixel position P111 and form a figure of the point light source P101 as an image. This pixel position P111 is specified by a principal ray L101 passing through the point light source P101 and the center of the imaging lens 152.

Figure 11:
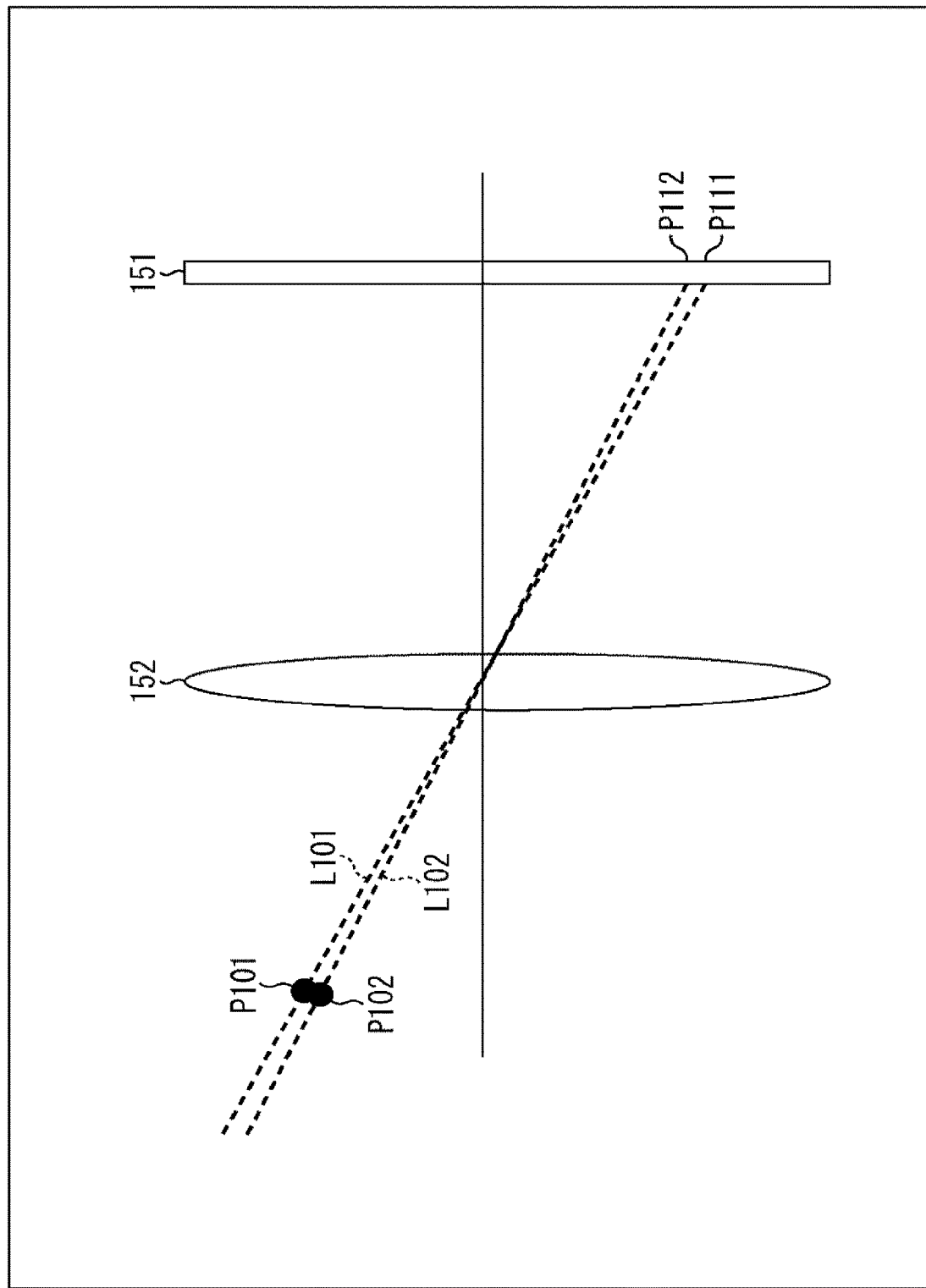
FIG. 11 is a diagram explaining a difference between an on-chip lens and an imaging lens.

Furthermore, for example, as illustrated in FIG. 11, light that has been incident on the imaging lens 152, out of diffused light dispersed from a point light source P102 different from the point light source P101 is converged at a pixel position P112 different from the pixel position P111 on the imaging element 151. That is, the imaging lens 152 is designed to converge diffused light incident at different angles from the point light source P102 at the pixel position P112 and form a figure of the point light source P102 as an image. This pixel position P112 is specified by a principal ray L102 passing through the point light source P102 and the center of the imaging lens 152.

In this manner, the imaging lens 152 forms images of figures of the point light sources P101 and P102 having different principal rays at the different pixel positions P111 and P112 on the imaging element 151, respectively.

Figure 12:
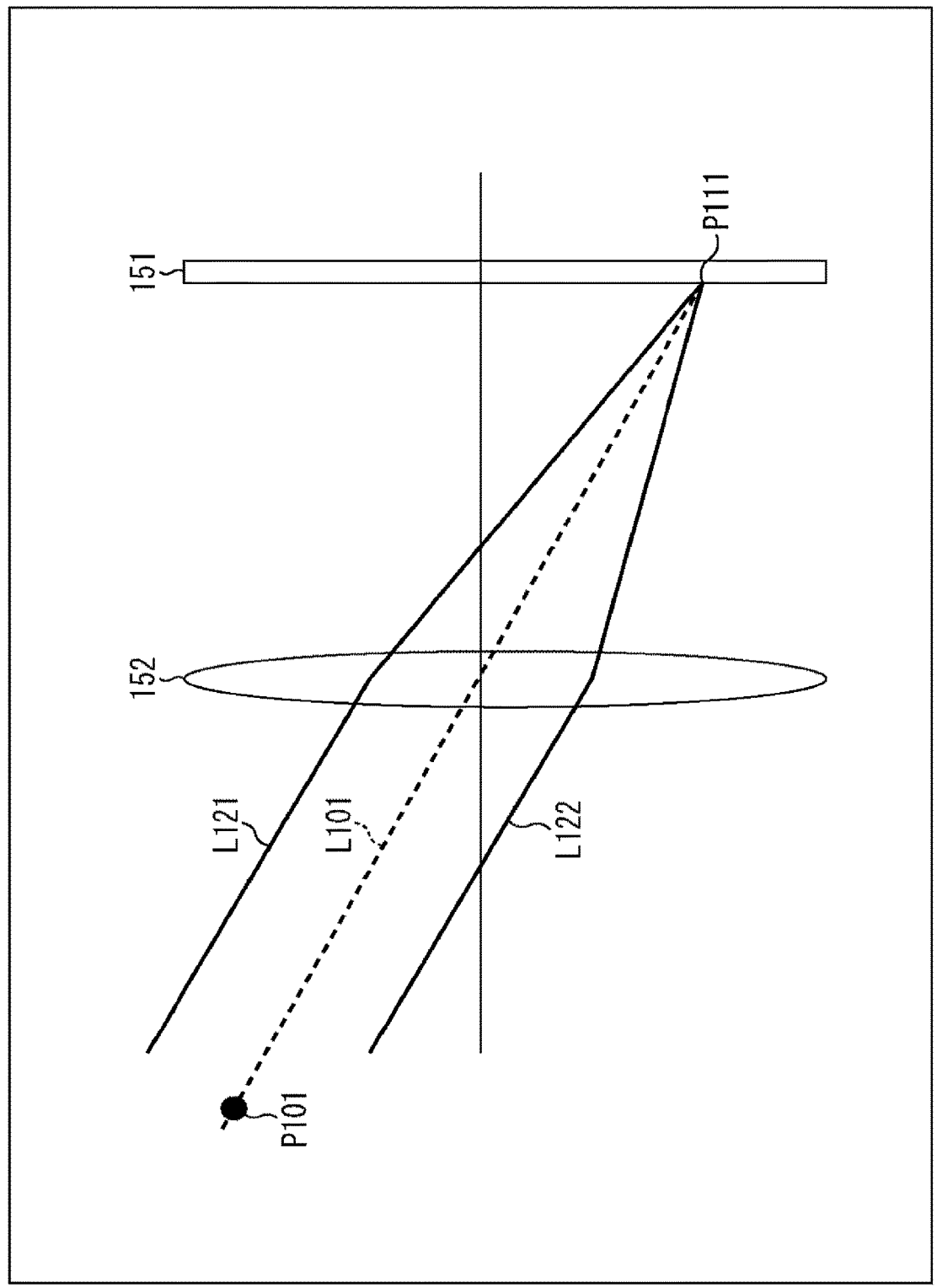
FIG. 12 is a diagram explaining a difference between an on-chip lens and an imaging lens.

Moreover, as illustrated in FIG. 12, in a case where the point light source P101 is present at infinity, a part of diffused light dispersed from the point light source P101 is incident on the imaging lens 152 as parallel light parallel to the principal ray L101. For example, parallel light including light rays between light rays L121 and L122 parallel to the principal ray L101 is incident on the imaging lens 152. Then, the parallel light that has been incident on the imaging lens 152 is converged at the pixel position P111 on the imaging element 151. That is, the imaging lens 152 is designed to converge parallel light from the point light source P101 present at infinity at the pixel position P111 and form a figure of the point light source P101 as an image.

Accordingly, the imaging lens 152 has a light converging function to cause, for example, diffused light from a point light source having a principal ray incident angle θ1 to be incident on a pixel (pixel output unit) P1, and cause diffused light from a point light source having a principal ray incident angle θ2 different from the principal ray incident angle θ1 to be incident on a pixel (pixel output unit) P2 different from the pixel P1. That is, the imaging lens 152 has a light converging function for causing diffused light from light sources having different incident angles of principal rays to be incident on a plurality of pixels (pixel output units) adjacent to each other. However, for example, light from point light sources that are in proximity to each other or point light sources that are present at infinity and are substantially in proximity is sometimes incident on the same pixel (pixel output unit).

In contrast, for example, as described with reference to FIGS. 4 and 5, light passing through the on-chip lens 121c is incident only on the light receiving surface of the photodiode 121e or 121f constituting the corresponding pixel (pixel output unit). In different terms, the on-chip lens 121c is provided for each pixel (pixel output unit), and converges incident light incident on this particular on-chip lens 121c only on the corresponding pixel (pixel output unit). That is, the on-chip lens 121c does not have a light converging function for causing light from different point light sources to be incident on different pixels (pixel output units).

Note that, in a case where a pinhole is used, the relationship between the position of each pixel (pixel output unit) and the incident angle of light is uniquely resolved. Accordingly, in the case of a configuration using a pinhole and a conventional imaging element, the incident angle directivity cannot be set independently and freely for each pixel.

<Relationship Between Subject Surface and Imaging Element>

Next, the relationship of distance between the subject surface and the imaging element 121 will be described with reference to FIG. 13.

Figure 13:
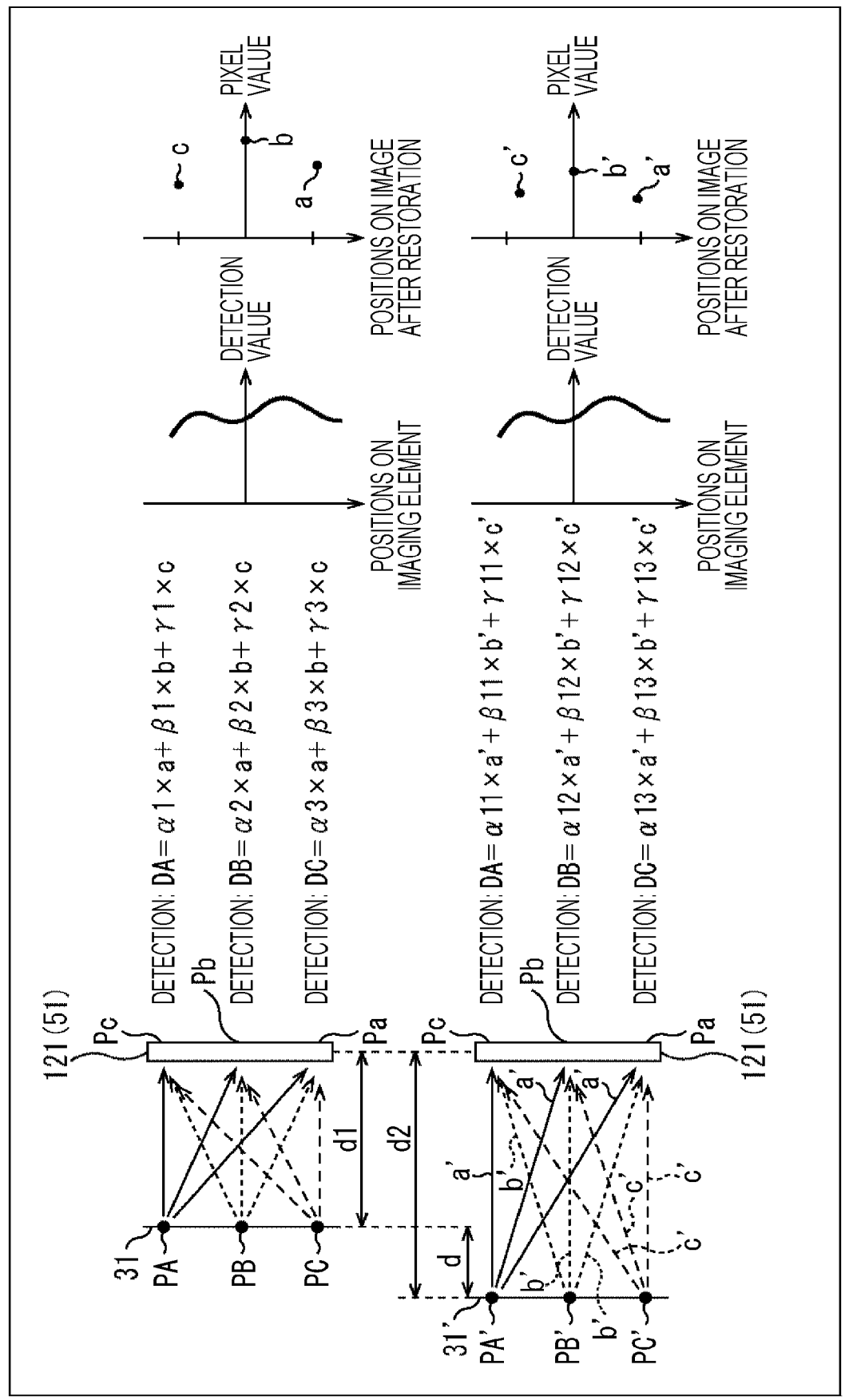
FIG. 13 is a diagram explaining a relationship between a subject distance and a coefficient indicating incident angle directivity.

Note that, as illustrated in the upper left of FIG. 13, it is assumed that, in a case where the subject distance between the imaging element 121 (similar to the imaging element 51 in FIG. 1) and the subject surface 31 is a distance d1, detection signal levels DA, DB, and DC at pixels Pc, Pb, and Pa on the imaging element 121 are represented by the same formulas as formulas (1) to (3) described above.

$$DA = \alpha 1 \times a + \beta 1 \times b + \gamma 1 \times c \tag{1}$$

$$DB = \alpha 2 \times a + \beta 2 \times b + \gamma 2 \times c \tag{2}$$

$$DC = \alpha 3 \times a + \beta 3 \times b + \gamma 3 \times c \tag{3}$$

Furthermore, as illustrated in the lower left of FIG. 13, also in a case where a subject surface 31' whose subject distance from the imaging element 121 is a distance d2 larger than the distance d1 by d, that is, the subject surface 31' located farther than the subject surface 31 as viewed from the imaging element 121 is considered, the detection signal levels at the pixels Pc, Pb, and Pa on the imaging element 121 are given as being similar in the detection signal levels DA, DB, and DC, as illustrated in the center portion of the lower part of FIG. 13.

However, in this case, light rays having light intensities a', b', and c' from the point light sources PA', PB', and PC' on the subject surface 31' are received by each pixel of the imaging element 121. In addition, since the incident angles of the light rays having the light intensities a', b', and c' to the imaging element 121 are different (change), coefficient set groups different from each other are required. Accordingly, the detection signal levels DA, DB, and DC in the pixels Pa, Pb, and Pc, respectively, are represented by following formulas (4) to (6), for example.

$$DA = \alpha 11 \times a' + \beta 11 \times b' + \gamma 11 \times c' \tag{4}$$

$$DB = \alpha 12 \times a' + \beta 12 \times b' + \gamma 12 \times c' \tag{5}$$

$$DC = \alpha 13 \times a' + \beta 13 \times b' + \gamma 13 \times c' \tag{6}$$

Here, a coefficient set group including a coefficient set α11, β11, γ11, a coefficient set α12, β12, γ12, and a coefficient set α13, β13, γ13 is a coefficient set group for the subject surface 31' corresponding to the coefficient set α1, β1, γ1, the coefficient set α2, β2, γ2, and the coefficient set α3, β3, γ3 for the subject surface 31.

Accordingly, by solving the simultaneous equations including formulas (4) to (6) using the preset coefficient set group α11, β11, γ11, α12, β12, γ12, α13, β13, γ13, the light intensities a', b', and c' of light rays from the point light sources PA', PB', and PC' on the subject surface 31' can be found, as illustrated in the lower right of FIG. 13, using a similar approach to a case where the light intensities a, b, and c of light rays from the point light sources PA, PB, and PC on the subject surface 31 are found. As a result, the restoration image of the subject surface 31' can be restored.

Accordingly, in the imaging apparatus 101 in FIG. 2, by preparing a coefficient set group for each distance (subject distance) from the imaging element 121 to the subject surface in advance, creating simultaneous equations by switching the coefficient set group for each subject distance, and solving the created simultaneous equations, restoration images of the subject surfaces at a variety of subject distances can be obtained on the basis of one detection image. For example, after capturing and recording a detection image once, the coefficient set group is switched according to the distance to the subject surface, and the restoration image is restored using the recorded detection image, whereby a restoration image of the subject surface at an arbitrary subject distance can be generated.

Furthermore, in a case where, for example, the subject distance and the angle of view can be specified, all the pixels may not be used but the detection signal of a pixel having incident angle directivity suitable for imaging the subject surface corresponding to the specified subject distance and angle of view may be used to generate the restoration image. Therefore, the restoration image can be generated using the detection signal of a pixel suitable for imaging the subject surface corresponding to the specified subject distance and angle of view.

Figure 14:
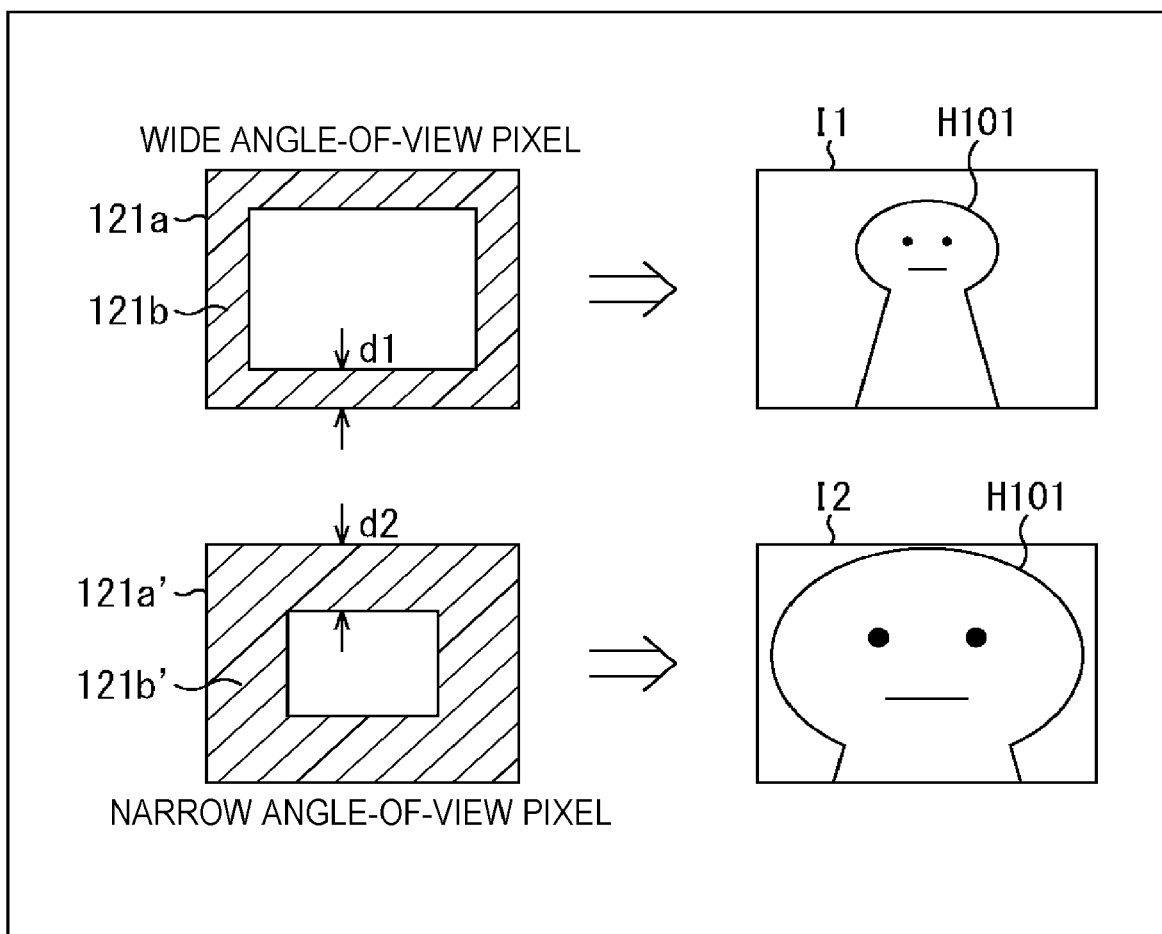
FIG. 14 is a diagram explaining a relationship between a narrow angle-of-view pixel and a wide angle-of-view pixel.

For example, a pixel 121a that is shielded by the light shielding film 121b by a width d1 from each end portion on the four sides, as illustrated in the upper part of FIG. 14, and a pixel 121a' that is shielded by the light shielding film 121b by a width d2 (>d1) from each end portion on the four sides, as illustrated in the lower part of FIG. 14 are considered.

Figure 15:
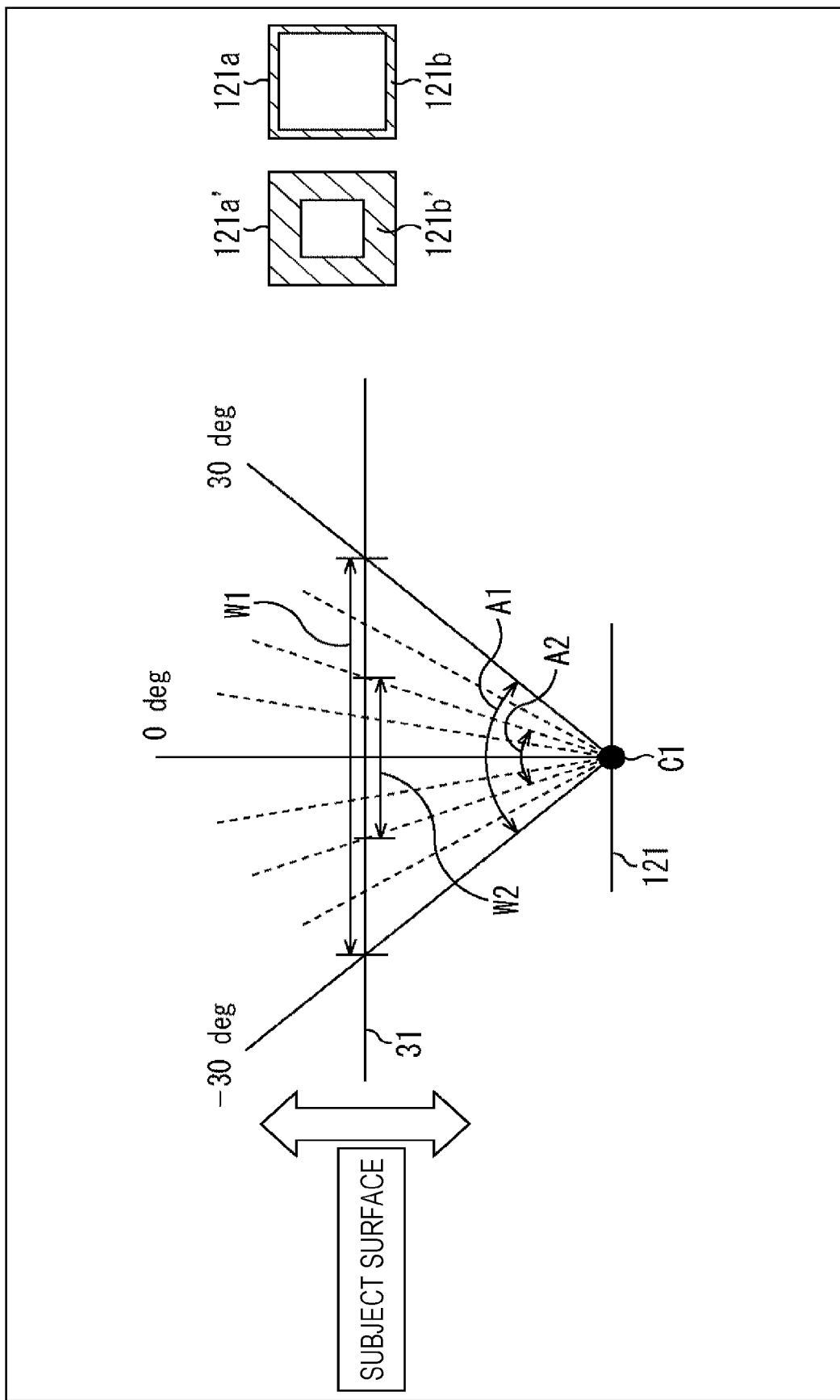
FIG. 15 is a diagram explaining a relationship between a narrow angle-of-view pixel and a wide angle-of-view pixel.

FIG. 15 illustrates an example of the incident angle of the incident light from the subject surface 31 to a center position C1 of the imaging element 121. Note that, in FIG. 15, while an example of the incident angle of the incident light in the horizontal direction is illustrated, this applies approximately similarly to the vertical direction. Furthermore, the pixels 121a and 121a' in FIG. 14 are illustrated on the right portion of FIG. 15.

For example, in a case where the pixel 121a in FIG. 14 is arranged at the center position C1 of the imaging element 121, the range of the incident angle of the incident light from the subject surface 31 to the pixel 121a has an angle A1 as illustrated in the left portion of FIG. 15. Accordingly, the pixel 121a can receive incident light for a width W1 of the subject surface 31 in the horizontal direction.

In contrast, in a case where the pixel 121a' in FIG. 14 is arranged at the center position C1 of the imaging element 121, the range of the incident angle of the incident light from the subject surface 31 to the pixel 121a' has an angle A2 (<A1) as illustrated in the left portion of FIG. 15, because the pixel 121a' has a wider light-shielded range than the pixel 121a. Accordingly, the pixel 121a' can receive incident light for a width W2 (<W1) of the subject surface 31 in the horizontal direction.

In other words, the pixel 121a with a narrower light shielding range is a wide angle-of-view pixel suitable for imaging a wider range on the subject surface 31, while the pixel 121a' with a wider light shielding range is a narrow angle-of-view pixel suitable for imaging a narrower range on the subject surface 31. Note that the wide angle-of-view pixel and the narrow angle-of-view pixel mentioned here are expressions for comparing both of the pixels 121a and 121a' in FIG. 14, and are not restricted to this expression when pixels with other angles of view are compared.

Accordingly, for example, the pixel 121a is used to restore an image I1 in FIG. 14. The image I1 is an image having an angle of view SQ1 corresponding to the subject width W1, which entirely includes a person H101 as a subject in the upper part of FIG. 16. In contrast, for example, the pixel 121a' is used to restore an image I2 in FIG. 14. The image I2 is an image having an angle of view SQ2 corresponding to the subject width W2 in which the periphery of the face of the person H101 in the upper part of FIG. 16 is zoomed up.

Figure 16:
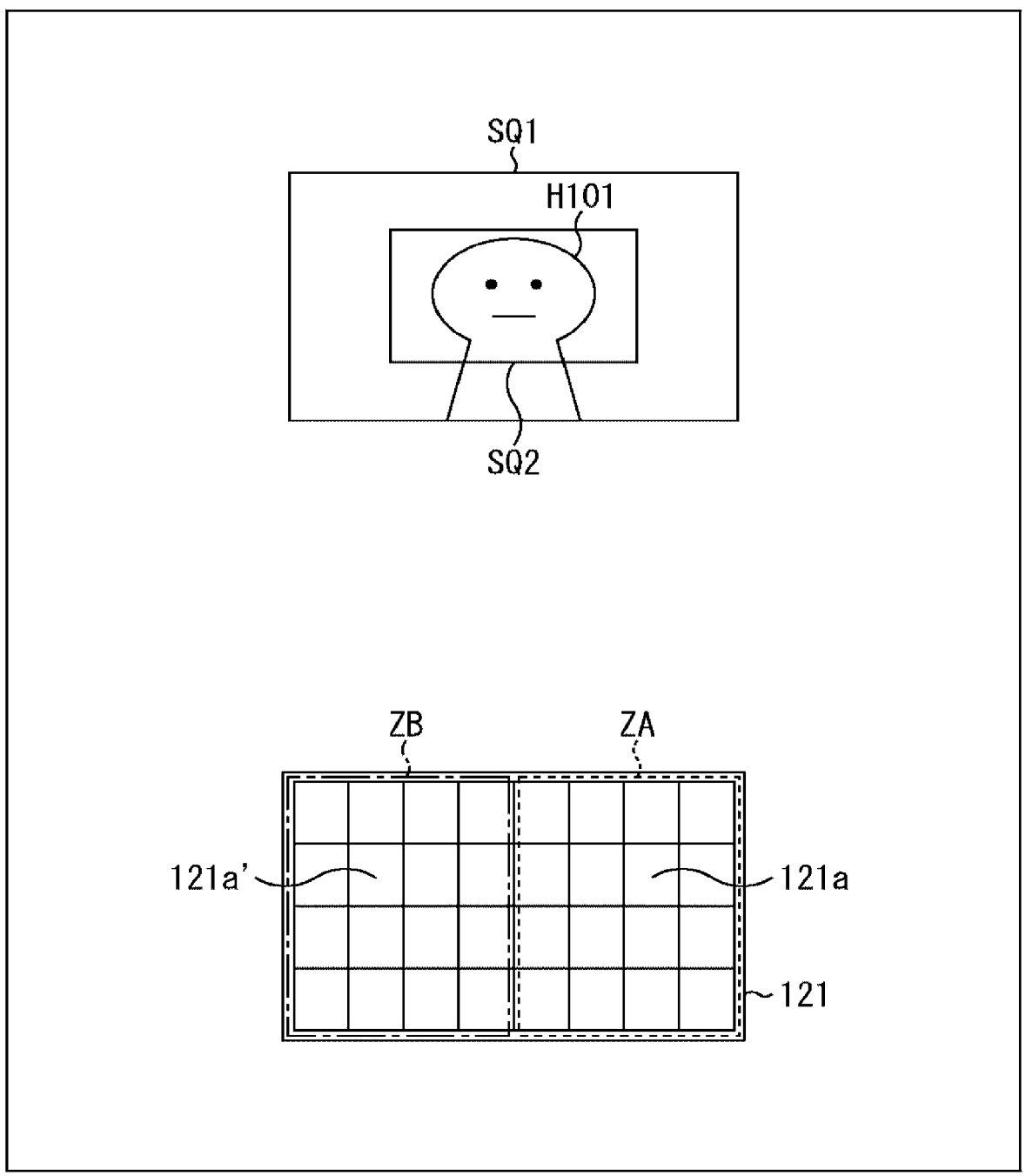
FIG. 16 is a diagram explaining a relationship between a narrow angle-of-view pixel and a wide angle-of-view pixel.

Furthermore, for example, as illustrated in the lower part of FIG. 16, it is conceivable to collect a predetermined number of the pixels 121a and the pixels 121a' in FIG. 14 to arrange in a range ZA of the imaging element 121 enclosed by the dotted line and a range ZB of the imaging element 121 enclosed by the alternate long and short dash line, respectively. Then, for example, when an image with the angle of view SQ1 corresponding to the subject width W1 is restored, an image with the angle of view SQ1 can be properly restored by using the detection signal of each pixel 121a in the range ZA. Meanwhile, when an image with the angle of view SQ2 corresponding to the subject width W2 is restored, an image with the angle of view SQ2 can be properly restored by using the detection signal of each pixel 121a' in the range ZB.

Note that, since the angle of view SQ2 is narrower than the angle of view SQ1, in a case where images with the angle of view SQ2 and the angle of view SQ1 are restored with the same number of pixels, a restoration image with higher image quality can be obtained when the image with the angle of view SQ2 is restored than when the image with the angle of view SQ1 is restored.

In other words, in a case where it is considered to obtain restoration images using the same number of pixels, a restoration image with higher image quality can be obtained when an image with a narrower angle of view is restored.

Figure 17:
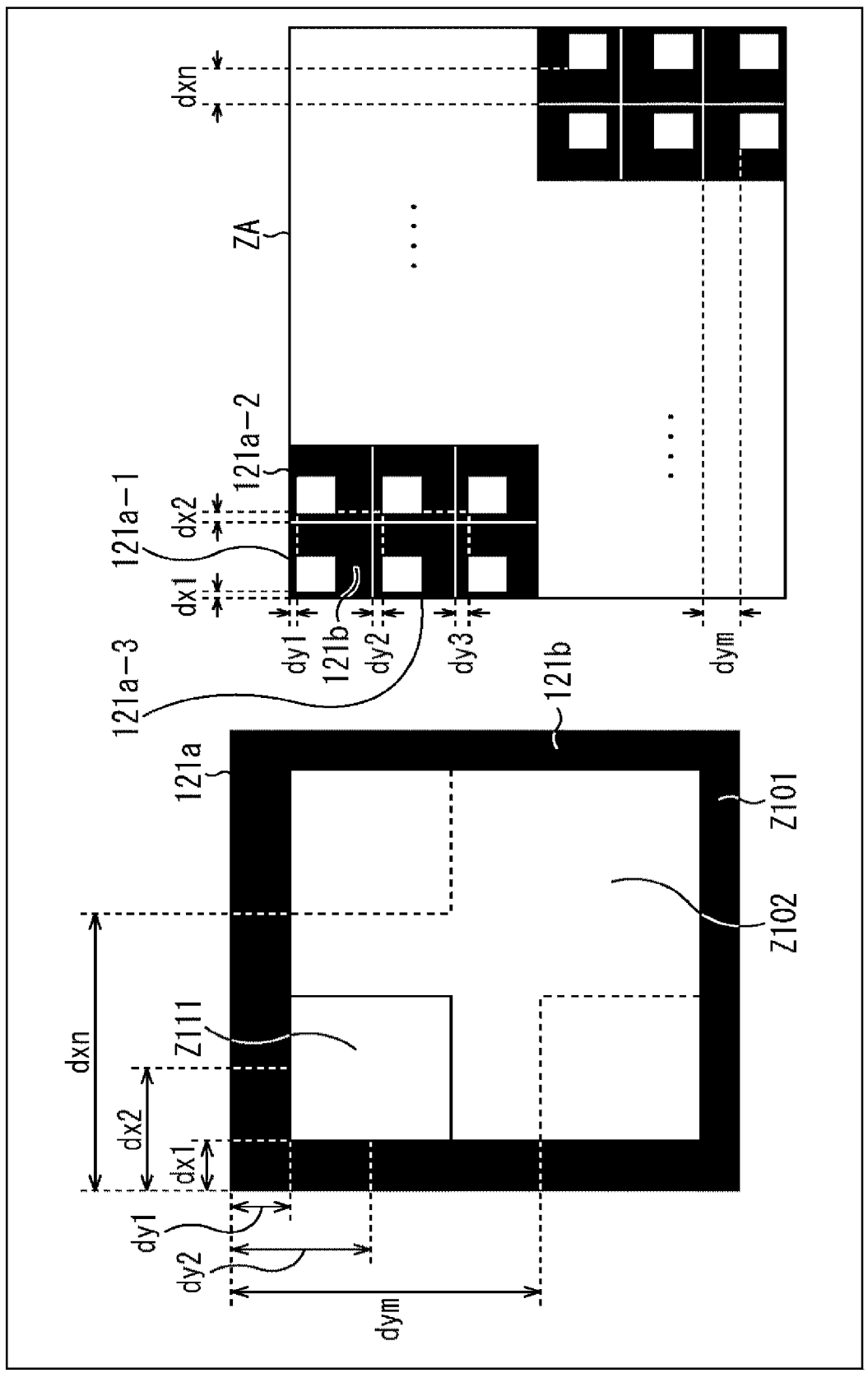
FIG. 17 is a diagram for explaining a difference in image quality between a narrow angle-of-view pixel and a wide angle-of-view pixel.

For example, the right portion of FIG. 17 illustrates a configuration example in the range ZA of the imaging element 121 in FIG. 16. The left portion of FIG. 17 illustrates a configuration example of the pixel 121a in the range ZA.

In FIG. 17, the range illustrated in black depicts the light shielding film 121b, and the light shielding range of each pixel 121a is determined, for example, in accordance with rules illustrated in the left portion of FIG. 17.

A main light shielding portion Z101 in the left portion of FIG. 17 (the black portion in the left portion of FIG. 17) is a range that is shielded in common in each pixel 121a. Specifically, the main light shielding portion Z101 has respective ranges having a width dx1 from the left and right sides of the pixel 121a toward the inside of the pixel 121a, and respective ranges having a height dy1 from the upper and lower sides of the pixel 121a toward the inside of the pixel 121a. Then, in each pixel 121a, a rectangular opening portion Z111 that is not shielded by the light shielding film 121b is provided in a range Z102 inside the main light shielding portion Z101. Accordingly, in each pixel 121a, a range other than the opening portion Z111 is shielded by the light shielding film 121b.

Here, the opening portions Z111 of the respective pixels 121a are regularly arranged. Specifically, the position in the horizontal direction of the opening portion Z111 in each pixel 121a is the same among the pixels 121a in the same column in the vertical direction. Furthermore, the position in the vertical direction of the opening portion Z111 in each pixel 121a is the same among the pixels 121a in the same row in the horizontal direction.

Meanwhile, the position in the horizontal direction of the opening portion Z111 in each pixel 121a is shifted at a predetermined interval according to the position of the pixel 121a in the horizontal direction. That is, as the position of the pixel 121a advances in the right direction, the left side of the opening portion Z111 moves to a position shifted in the right direction by widths dx1, dx2, . . . , and dxn in order from the left side of the pixel 121a. The interval between the widths dx1 and dx2, the interval between the widths dx2 and dx3, . . . , and the interval between the widths dxn−1 and dxn are each given as a value obtained by dividing a length obtained by subtracting the width of the opening portion Z111 from the width of the range Z102 in the horizontal direction, by the number of pixels n−1 in the horizontal direction.

Furthermore, the position in the vertical direction of the opening portion Z111 in each pixel 121a is shifted at a predetermined interval according to the position of the pixel 121a in the vertical direction. That is, as the position of the pixel 121a advances in a down direction, the upper side of the opening portion Z111 moves to a position shifted in the down direction by heights dy1, dy2, . . . , and dyn in order from the upper side of the pixel 121a. The interval between the heights dy1 and dy2, the interval between the heights dy2 and dy3, . . . , and the interval between the heights dyn−1 and dyn are each given as a value obtained by dividing a length obtained by subtracting the height of the opening portion Z111 from the height of the range Z102 in the vertical direction, by the number of pixels m−1 in the vertical direction.

Figure 18:
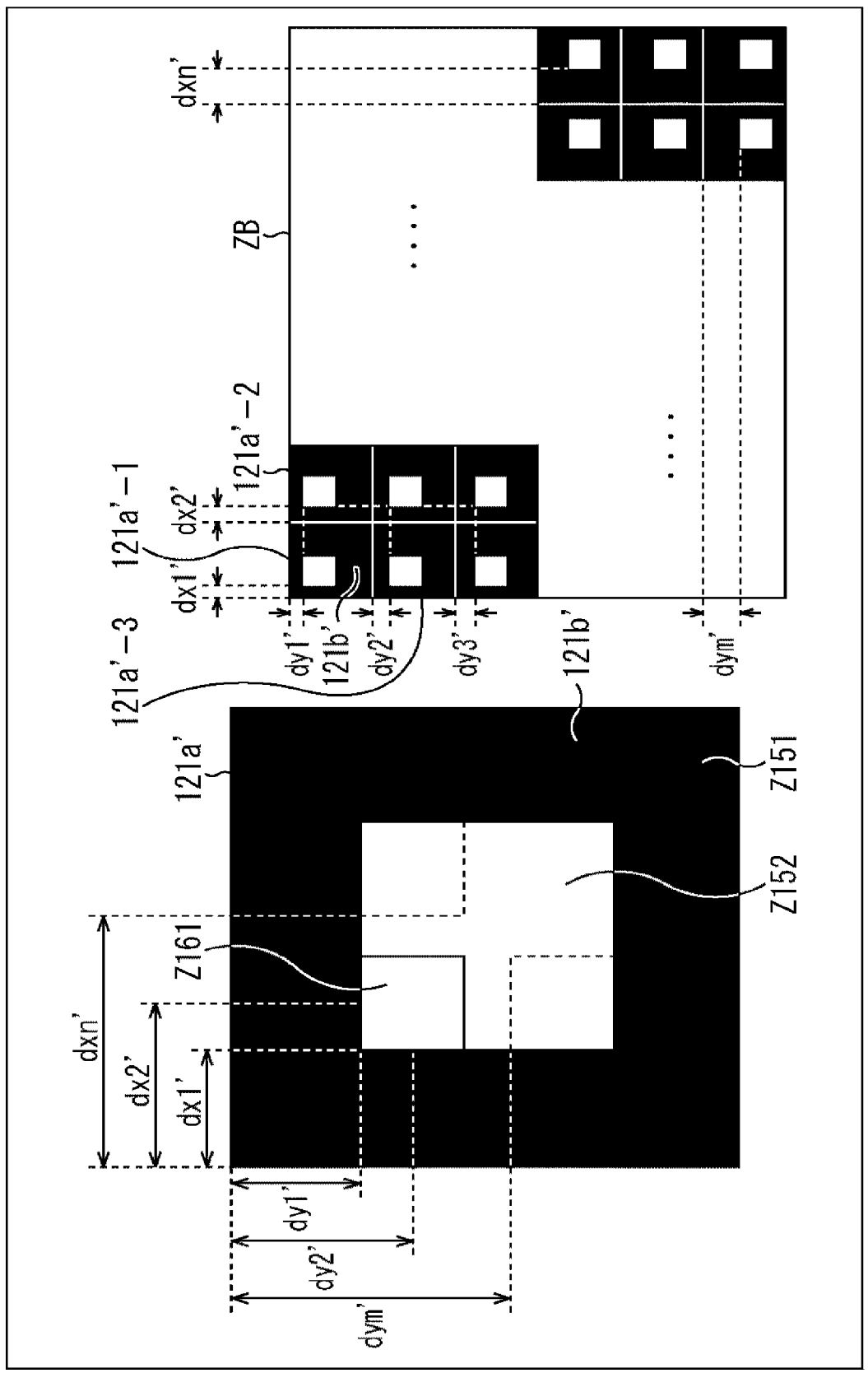
FIG. 18 is a diagram for explaining a difference in image quality between a narrow angle-of-view pixel and a wide angle-of-view pixel.

The right portion of FIG. 18 illustrates a configuration example in the range ZB of the imaging element 121 in FIG. 16. The left portion of FIG. 18 illustrates a configuration example of the pixel 121a' in the range ZB.

In FIG. 18, the range illustrated in black depicts the light shielding film 121b', and the light shielding range of each pixel 121a' is determined, for example, in accordance with rules illustrated in the left portion of FIG. 18.

A main light shielding portion Z151 in the left portion of FIG. 18 (the black portion in the left portion of FIG. 18) is a range that is shielded in common in each pixel 121a'. Specifically, the main light shielding portion Z151 has respective ranges having a width dx1' from the left and right sides of the pixel 121a' toward the inside of the pixel 121a', and respective ranges having a height dy1' from the upper and lower sides of the pixel 121a' toward the inside of the pixel 121a'. Then, in each pixel 121a', a rectangular opening portion Z161 that is not shielded by the light shielding film 121b' is provided in a range Z152 inside the main light shielding portion Z151. Accordingly, in each pixel 121a', a range other than the opening portion Z161 is shielded by the light shielding film 121b'.

Here, the opening portions Z161 of the respective pixels 121a' are regularly arranged similarly to the opening portions Z111 of the respective pixels 121a in FIG. 17. Specifically, the position in the horizontal direction of the opening portion Z161 in each pixel 121a' is the same among the pixels 121a' in the same column in the vertical direction. Furthermore, the position in the vertical direction of the opening portion Z161 in each pixel 121a' is the same among the pixels 121a' in the same row in the horizontal direction.

Meanwhile, the position in the horizontal direction of the opening portion Z161 in each pixel 121a' is shifted at a predetermined interval according to the position of the pixel 121a' in the horizontal direction. That is, as the position of the pixel 121a' advances in the right direction, the left side of the opening portion Z161 moves to a position shifted in the right direction by widths dx1', dx2', . . . , and dxn' in order from the left side of the pixel 121a'. The interval between the widths dx1' and dx2', the interval between the widths dx2' and dx3', . . . , and the interval between the widths dxn−1' and dxn' are each given as a value obtained by dividing a length obtained by subtracting the width of the opening portion Z161 from the width of the range Z152 in the horizontal direction, by the number of pixels n−1 in the horizontal direction.

Furthermore, the position in the vertical direction of the opening portion Z161 in each pixel 121a' is shifted at a predetermined interval according to the position of the pixel 121a' in the vertical direction. That is, as the position of the pixel 121a' advances in the down direction, the upper side of the opening portion Z161 moves to a position shifted in the down direction by heights dy1', dy2', . . . , and dyn' in order from the upper side of the pixel 121a'. The interval between the heights dy1' and dy2', the interval between the heights dy2' and dy3', . . . , and the interval between the heights dyn−1' and dyn' are each given as a value obtained by dividing a length obtained by subtracting the height of the opening portion Z161 from the height of the range Z152 in the vertical direction, by the number of pixels m−1 in the vertical direction.

Here, a length obtained by subtracting the width of the opening portion Z111 from the width in the horizontal direction of the range Z102 of the pixel 121a in FIG. 17 is larger than a width obtained by subtracting the width of the opening portion Z161 from the width in the horizontal direction of the range Z152 of the pixel 121a' in FIG. 18. Accordingly, the change intervals between the widths dx1, dx2, . . . , and dxn in FIG. 17 are larger than the change intervals between the widths dx1', dx2', . . . , and dxn' in FIG. 18.

Furthermore, a length obtained by subtracting the height of the opening portion Z111 from the height in the vertical direction of the range Z102 of the pixel 121a in FIG. 17 is larger than a length obtained by subtracting the height of the opening portion Z161 from the height in the vertical direction of the range Z152 of the pixel 121a' in FIG. 18. Accordingly, the change intervals between the heights dy1, dy2, . . . , and dyn in FIG. 17 are larger than the change intervals between the heights dy1', dy2', . . . , and dyn' in FIG. 18.

As described above, the position change intervals in the horizontal and vertical directions between the opening portions Z111 of the light shielding films 121b of the respective pixels 121a in FIG. 17 differ from the position change intervals in the horizontal and vertical directions between the opening portions Z161 of the light shielding films 121b' of the respective pixels 121a' in FIG. 18. Then, this difference in intervals causes the difference in subject resolving power (angular resolving power) in the restoration image. That is, the position change intervals in the horizontal and vertical directions between the opening portions Z161 of the light shielding films 121b' of the respective pixels 121a' in FIG. 18 are narrower than the position change intervals in the horizontal and vertical directions between the opening portions Z111 of the light shielding films 121b of the respective pixels 121a in FIG. 17. Accordingly, a restoration image restored using the detection signal of each pixel 121a' in FIG. 18 has higher subject resolving power and higher image quality than a restoration image restored using the detection signal of each pixel 121a in FIG. 17.

In this manner, by changing the combination of the light shielding range of the main light shielding portion and the opening range of the opening portion, the imaging element 121 including pixels having a variety of angles of view (having a variety of incident angle directivities) can be implemented.

Note that, in the above, an example in which the pixels 121a and 121a' are split and arranged in the ranges ZA and ZB is described; however, this is for the sake of simplicity of explanation, and it is desirable to mix pixels 121a corresponding to different angles of view to arrange in the same region.

Figure 19:
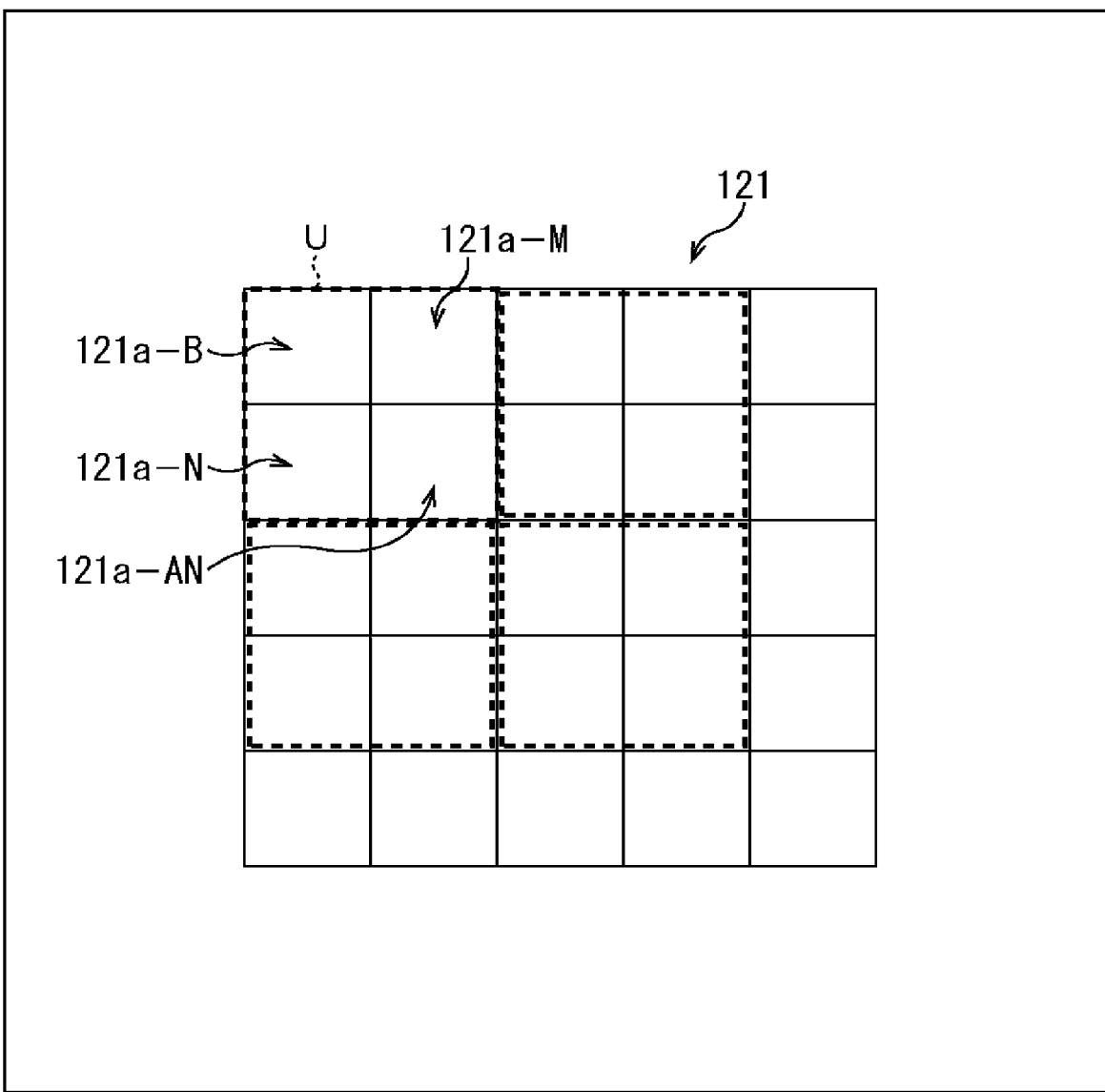
FIG. 19 is a diagram explaining an example of combining pixels having a plurality of angles of view.

For example, as illustrated in FIG. 19, four pixels including 2 pixels×2 pixels indicated by the dotted line are regarded as one unit U, and each unit U is constituted by four pixels, namely, a pixel 121a-W with a wider angle of view, a pixel 121a-M with a medium angle of view, a pixel 121a-N with a narrower angle of view, and a pixel 121a-AN with an extremely narrower angle of view.

In this case, for example, in a case where the number of pixels of all the pixels 121a is assumed as X, the restoration image can be restored using a detection image made up of every X/4 pixels each having the four types of angles of view. At this time, four different types of coefficient set groups are used for each angle of view, and restoration images having angles of view different from each other are restored by four different types of simultaneous equations.

Accordingly, by restoring the restoration image using the detection image obtained from a pixel suitable for imaging with the angle of view of the restoration image to be restored, a proper restoration image according to the four types of angles of view can be obtained.

Furthermore, an image having an angle of view in the middle of the four types of angles of view or images having angles of view before and after the four types of angles of view may be interpolated and generated from images having the four types of angles of view, and pseudo optical zoom may be implemented by seamlessly generating images having a variety of angles of view.

Note that, for example, in a case where an image having a wider angle of view is obtained as a restoration image, all the wide angle-of-view pixels may be used, or some of the wide angle-of-view pixels may be used. In addition, for example, in a case where an image having a narrower angle of view is obtained as a restoration image, all the narrow angle-of-view pixels may be used, or some of the narrow angle-of-view pixels may be used.

<Imaging Process by Imaging Apparatus 101>

Next, an imaging process by the imaging apparatus 101 in FIG. 2 will be described with reference to a flowchart in FIG. 20.

In step S1, the imaging element 121 images a subject. With this step, a detection signal indicating a detection signal level according to the light amount of incident light from the subject is output from each pixel 121a of the imaging element 121 having different incident angle directivities, and the imaging element 121 supplies a detection image including the detection signal of each pixel 121a to the restoration unit 122.

In step S2, the restoration unit 122 finds a coefficient used for image restoration. Specifically, the restoration unit 122 sets a distance to the subject surface 31 to be restored, that is, a subject distance. Note that an arbitrary method can be adopted as a method for setting the subject distance. For example, the restoration unit 122 sets a subject distance input by the user via the input unit 124 or a subject distance detected by the detection unit 125 as the distance to the subject surface 31 to be restored.

Next, the restoration unit 122 reads a coefficient set group in correspondence with the set subject distance from the storage unit 128.

In step S3, the restoration unit 122 restores an image using the detection image and the coefficients. Specifically, the restoration unit 122 creates the simultaneous equations described with reference to above-described formulas (1) to (3) or (4) to (6), using the detection signal level of each pixel of the detection image and the coefficient set group acquired in the process in step S2. Next, the restoration unit 122 calculates the light intensity of each point light source on the subject surface 31 corresponding to the set subject distance by solving the created simultaneous equations. Then, by placing pixels having pixel values according to the calculated light intensities in accordance with the arrangement of the respective point light sources on the subject surface 31, the restoration unit 122 generates a restoration image on which a figure of the subject is formed as an image.

In step S4, the imaging apparatus 101 performs various processes on the restoration image. For example, the restoration unit 122 performs a demosaic process, γ correction, white balance adjustment, a conversion process to a predetermined compression format, and the like on the restoration image as necessary. Furthermore, the restoration unit 122, for example, supplies the restoration image to the display unit 127 to display, or supplies the restoration image to the recording/playback unit 129 to record on the recording medium 130, or outputs the restoration image to other instruments via the communication unit 131, as necessary.

Thereafter, the imaging process ends.

Note that, in the above, an example in which the restoration image is restored from the detection image using the coefficient set group in correspondence with the imaging element 121 and the subject distance has been described; however, as described earlier, for example, a coefficient set group corresponding to the angle of view of the restoration image may be further prepared in addition to a coefficient set group corresponding to the subject distance such that the restoration image is restored using the coefficient set groups corresponding to the subject distance and the angle of view. In addition, the resolving power with respect to the subject distance and the angle of view depends on the number of prepared coefficient set groups.

Figure 20:
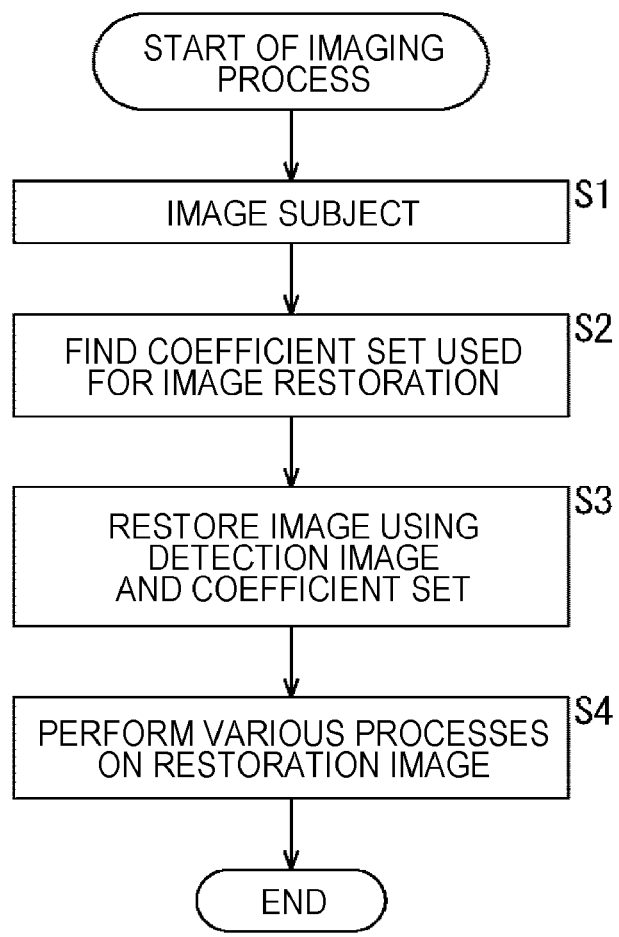
FIG. 20 is a flowchart explaining an imaging process by the imaging apparatus in FIG. 2.

Furthermore, in the description of the process using the flowchart in FIG. 20, the example of using the detection signals of all the pixels included in the detection image has been described; however, a detection image including the detection signal of a pixel having incident angle directivity corresponding to the specified subject distance and angle of view, among the pixels constituting the imaging element 121, may be generated such that the restoration image is restored using the generated detection image. By such a process, the restoration image can be restored with a detection image suitable for the subject distance and the angle of view of the restoration image to be found, and the restoration accuracy and image quality of the restoration image are improved. That is, in a case where an image corresponding to the specified subject distance and angle of view is, for example, an image corresponding to the angle of view SQ1 in FIG. 16, an image having the angle of view SQ1 can be restored with higher accuracy by selecting the pixels 121a having incident angle directivity corresponding to the angle of view SQ1, and restoring the restoration image with a detection image obtained from these selected pixels 121a.

Through the above process, the imaging apparatus 101 having, as an essential constituent, the imaging element 121 in which each pixel is provided with incident angle directivity can be implemented.

As a result, an imaging lens, a pinhole, and the optical filters described in the above-mentioned Patent Document and the like are no longer necessary, such that the degree of freedom in apparatus designing can be enhanced; besides, an optical element that is configured separately from the imaging element 121 and is supposed to be equipped together with the imaging element 121 at the stage of configuration as an imaging apparatus is no longer necessary, such that downsizing of an apparatus with respect to the incident direction of incident light can be implemented, and manufacturing costs can be reduced. Furthermore, a lens corresponding to an imaging lens for forming an optical image, such as a focus lens, becomes unnecessary. However, a zoom lens that changes the magnification may be provided.

Note that, in the above description, the process of restoring the restoration image corresponding to a predetermined subject distance promptly after the detection image is captured has been described; however, for example, the detection image may be recorded on the recording medium 130 or output to other instruments via the communication unit 131 without performing the restoration process promptly, such that the restoration image is thereafter restored using the detection image at a desired timing. In this case, the restoration image may be restored by the imaging apparatus 101 or another apparatus. In this case, for example, a restoration image with respect to a subject surface having an arbitrary subject distance or angle of view can be obtained by solving simultaneous equations created using a coefficient set group corresponding to the arbitrary subject distance or angle of view and finding the restoration image, and refocusing or the like can be implemented.

For example, in a case where an imaging apparatus including an imaging lens and a conventional imaging element is used, in order to obtain images having a variety of focal lengths and angles of view, it is necessary to perform imaging while variously changing the focal length and angle of view. On the other hand, in the imaging apparatus 101, a restoration image having an arbitrary subject distance and angle of view can be restored by switching the coefficient set group as described above, such that a process such as repeatedly performing imaging while variously changing the focal length (that is, the subject distance) and the angle of view becomes unnecessary.

In this case, for example, the user also can obtain a restoration image having a desired subject distance or angle of view while displaying, on the display unit 127, respective restoration images restored while switching coefficient set groups corresponding to different subject distances or angles of view.

Note that, in a case where the detection image is recorded, metadata used for restoration may be associated with the detection image when the subject distance and angle of view at the time of restoration are known. For example, the detection image is associated with metadata by adding metadata to image data including the detection image, giving the same ID to the detection image and metadata, or recording the detection image and metadata on the same recording medium 130.

Note that, in a case where the same ID is given to the detection image and metadata, the detection image and the metadata can be recorded on different recording media or individually output from the imaging apparatus 101.

Furthermore, the metadata may or may not include the coefficient set group used for restoration. In the latter case, for example, the subject distance and angle of view at the time of restoration are included in the metadata, and coefficient set groups corresponding to the included subject distance and angle of view are acquired from the storage unit 128 or the like at the time of restoration.

Moreover, in a case where the restoration image is restored promptly at the time of imaging, for example, an image to be recorded or output to the outside can be selected from the detection image and the restoration image. For example, both of the images may be recorded or output to the outside, or only one of the images may be recorded or output to the outside.

In addition, similarly, also in a case where a video is captured, it is possible to select whether or not to restore the restoration image at the time of imaging, and to select an image to be recorded or output to the outside. For example, the restoration image of each frame can be restored promptly while capturing a video, and also both or one of the restoration image and the detection image before restoration can be recorded or output to the outside. In this case, it is possible to display the restoration image of each frame as a live view image at the time of imaging. Alternatively, for example, the detection image of each frame can be recorded or output to the outside without performing the restoration process at the time of imaging.

Moreover, at the time of capturing a video, for example, whether or not the restoration image is restored, and an image to be recorded or output to the outside can be selected for each frame. For example, it is possible to switch whether or not to restore the restoration image for each frame. Furthermore, for example, it is possible to individually switch whether or not to record the detection image and whether or not to record the restoration image for each frame. In addition, for example, the detection images of all the frames may be recorded while giving metadata to the detection image of a useful frame likely to be used later.

Besides, an autofocus function also can be implemented as in an imaging apparatus using an imaging lens. For example, the autofocus function can be implemented by determining the optimum subject distance by the hill-climbing scheme similar to the contrast auto focus (AF) scheme on the basis of the restoration image.

Moreover, as compared with an imaging apparatus or the like including the optical filters described in above-mentioned Patent Document and the like and a conventional imaging element, since the restoration image can be generated using a detection image captured by the imaging element 121 having incident angle directivities in units of pixels, the expansion of the number of pixels can be implemented, and a restoration image with higher resolution and higher angular resolving power can be obtained. On the other hand, in an imaging apparatus including an optical filter and a conventional imaging element, it is difficult to implement to provide a higher resolution and the like to the restoration image, because it is difficult to miniaturize the optical filter even if the pixels are miniaturized.

Furthermore, the imaging apparatus 101 of the present disclosure has the imaging element 121 as an essential constituent and does not require, for example, the optical filters and the like described in above-mentioned Patent Document and the like; thus, a phenomenon such that the temperature rises in the use environment and the optical filter is distorted due to heat is unlikely to occur, and an imaging apparatus with higher environmental resistance can be implemented.

Moreover, the imaging apparatus 101 of the present disclosure does not require an imaging lens, a pinhole, and the optical filters described in above-mentioned Patent Document and the like, such that the degree of freedom in designing a configuration having an imaging function can be improved.

<Method of Reducing Processing Load>

Incidentally, in a case where the light shielding range (that is, the incident angle directivity) of the light shielding film 121b of each pixel 121a of the imaging element 121 is provided with randomness, the larger the disorder of the differences in the light shielding ranges, the larger the load for the process by the restoration unit 122. Thus, the processing load may be reduced by reducing the disorder by making a part of the change in the light shielding range of the light shielding film 121b between the respective pixels 121a regular.

For example, an L-shaped-type light shielding film 121b combining the longitudinal belt-type and the lateral belt-type is configured such that, for a predetermined column direction, lateral belt-type light shielding films 121b having the same width are combined, and for a predetermined row direction, longitudinal belt-type light shielding films 121b having the same height are combined. With this configuration, the light shielding range of the light shielding film 121b of each pixel 121a changes randomly in units of pixels while having regularity in the column and row directions. As a result, the differences in the light shielding ranges of the light shielding films 121b between the respective pixels 121a, that is, the disorder of the differences in incident angle directivities can be reduced, and the processing load on the restoration unit 122 can be reduced.

Figure 21:
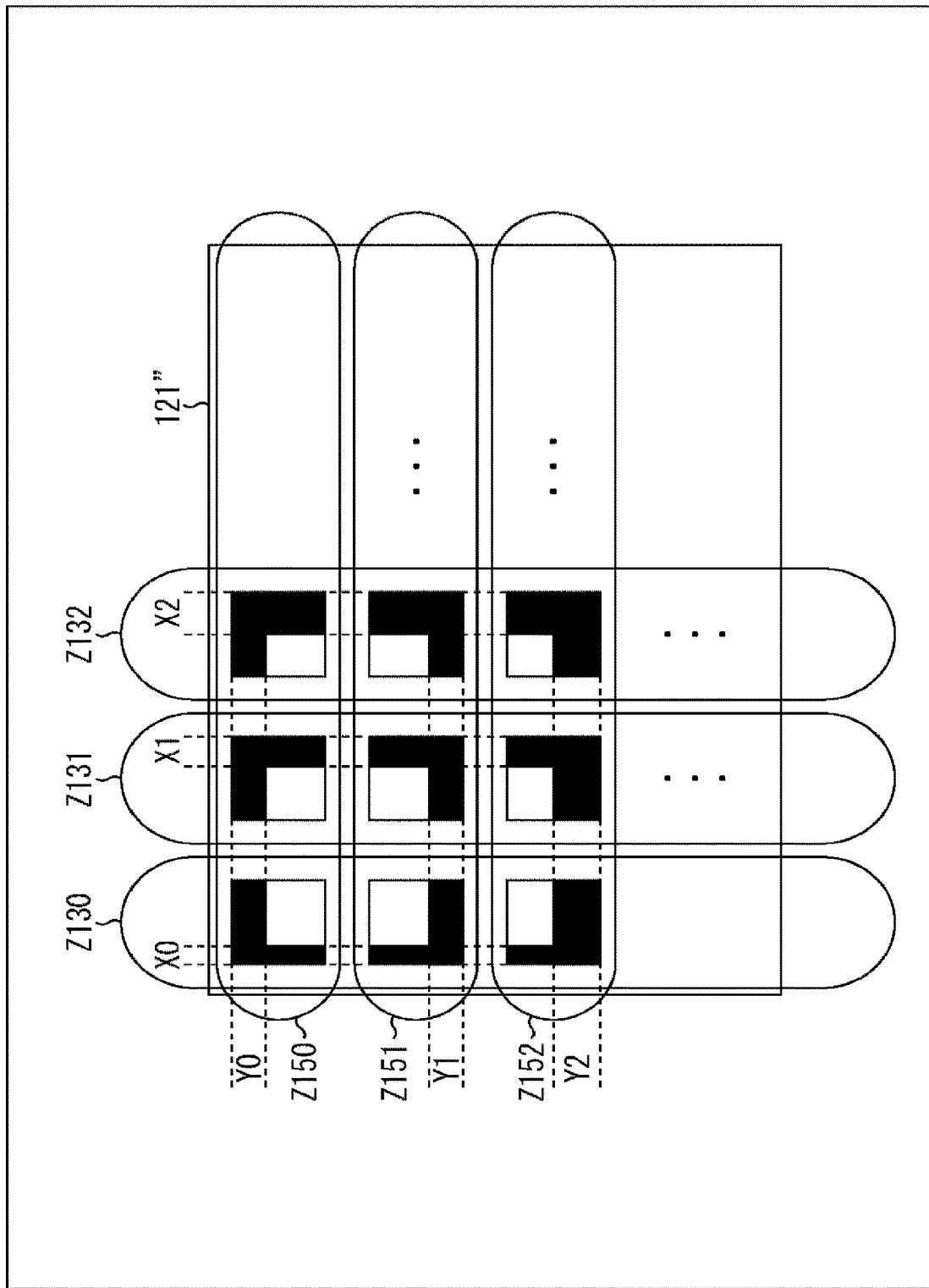
FIG. 21 is a diagram explaining a method of reducing a processing load.

Specifically, for example, as illustrated in an imaging element 121" in FIG. 21, lateral belt-type light shielding films 121b each having the same width X0 are used for pixels in the same column indicated by a range Z130, while longitudinal belt-type light shielding films 121b having the same height Y0 are used for pixels in the same row indicated by a range 2150. As a result, for each pixel 121a specified by the row and column, an L-shaped-type light shielding film 121b in which these types of light shielding films are combined is used.

Similarly, lateral belt-type light shielding films 121b each having the same width X1 are used for pixels in the same column indicated by a range Z131 adjacent to the range Z130, while longitudinal belt-type light shielding films 121b having the same height Y1 are used for pixels in the same row indicated by a range Z151 adjacent to the range Z150. As a result, for each pixel 121a specified by the row and column, an L-shaped-type light shielding film 121b in which these types of light shielding films are combined is used.

Moreover, lateral belt-type light shielding films 121b each having the same width X2 are used for pixels in the same column indicated by a range Z132 adjacent to the range Z131, while longitudinal belt-type light shielding films 121b having the same height Y2 are used for pixels in the same row indicated by a range Z152 adjacent to the range Z151. As a result, for each pixel 121a specified by the row and column, an L-shaped-type light shielding film 121b in which these types of light shielding films are combined is used.

By configuring in this manner, the range of the light shielding film can be set to different values in units of pixels while providing regularity to the width and position in the horizontal direction and the height and position in the vertical direction of the light shielding film 121b; thus, the disorder of the change in incident angle directivity can be restrained. As a result, the coefficient set patterns can be reduced, and the processing load of the arithmetic process in the restoration unit 122 can be reduced.

Figure 22:
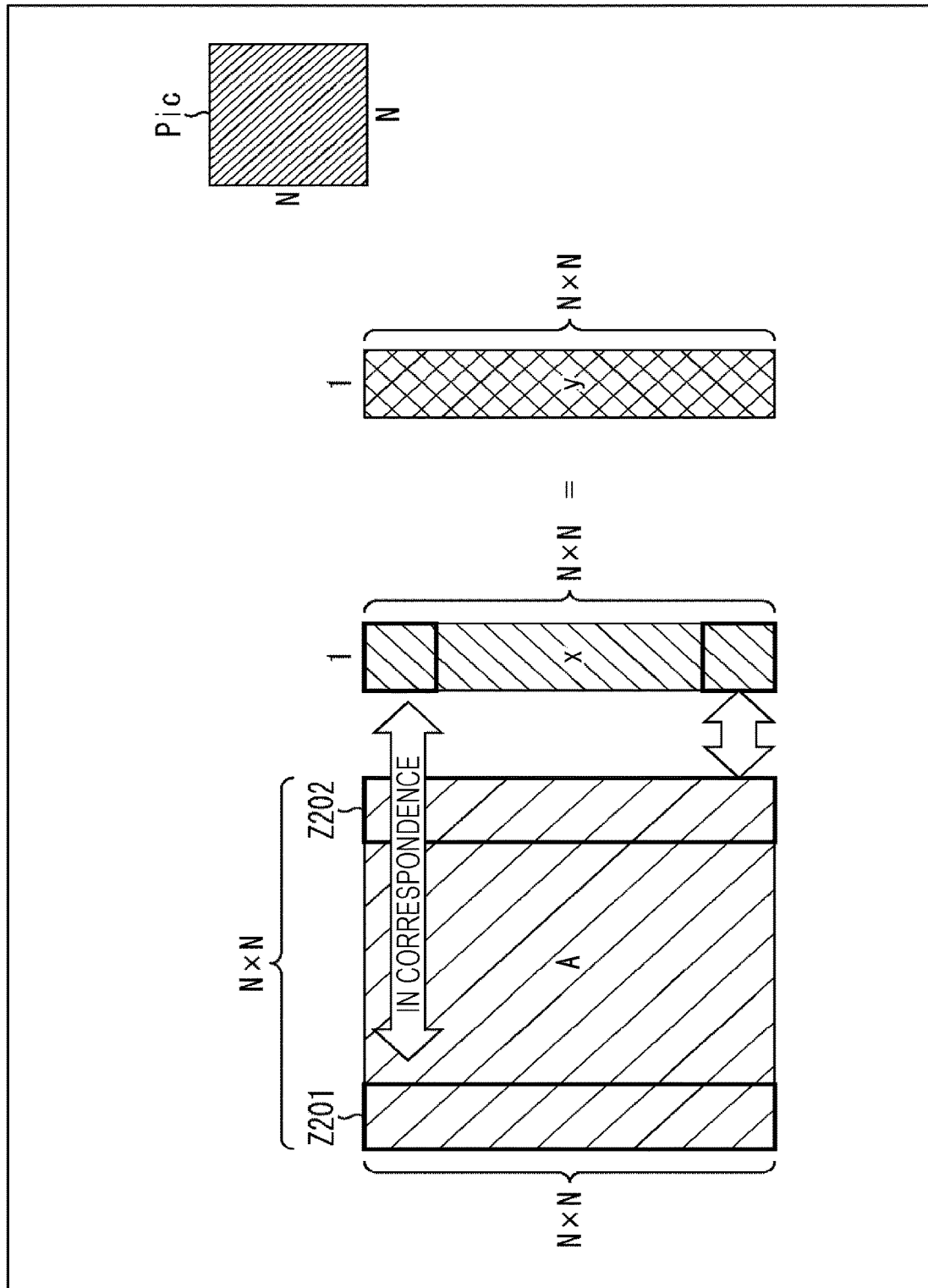
FIG. 22 is a diagram explaining a method of reducing a processing load.

In more detail, as illustrated in the upper right portion of FIG. 22, in a case where the restoration image of N×N pixels is found from a detection image Pic of N×N pixels, the relationship as illustrated in the left portion of FIG. 22 is established by a vector X containing the pixel value of each pixel of the restoration image of (N×N) rows×1 column as an element, a vector Y containing the pixel value of each pixel of the detection image of (N×N) rows×1 column as an element, and a matrix A of (N×N) rows×(N×N) columns including the coefficient set group.

That is, FIG. 22 indicates that the result of multiplying each element of the matrix A of (N×N) rows×(N×N) columns including coefficient set group, by the vector X of (N×N) rows×1 column representing the restoration image is given as the vector Y of (N×N) rows×1 column representing the detection image. Then, for example, simultaneous equations corresponding to above-described formulas (1) to (3) or formulas (4) to (6) are constructed from this relationship.

Note that FIG. 22 indicates that each element of the first column of the matrix A indicated by a range Z201 corresponds to the element of the first row of the vector X, and each element of the N×N-th column of the matrix A indicated by a range Z202 corresponds to the element of the N×N-th row of the vector X.

In addition, in the case of using a pinhole, and the case of using a light converging function of an imaging lens or the like for causing incident light incident from the same direction to be incident on two pixel output units adjacent to each other, since the relationship between the position of each pixel and the incident angle of light is uniquely resolved, the matrix A is given as a diagonal matrix in which all the diagonal components to the lower right are given as 1. Conversely, in a case where neither a pinhole nor an imaging lens is used as in the imaging apparatus 101 in FIG. 2, the relationship between the position of each pixel and the incident angle of light is not uniquely resolved, and thus the matrix A is not given as a diagonal matrix.

In different terms, the restoration image is found by solving simultaneous equations based on the determinant illustrated in FIG. 22 and finding each element of the vector X.

Figure 23:
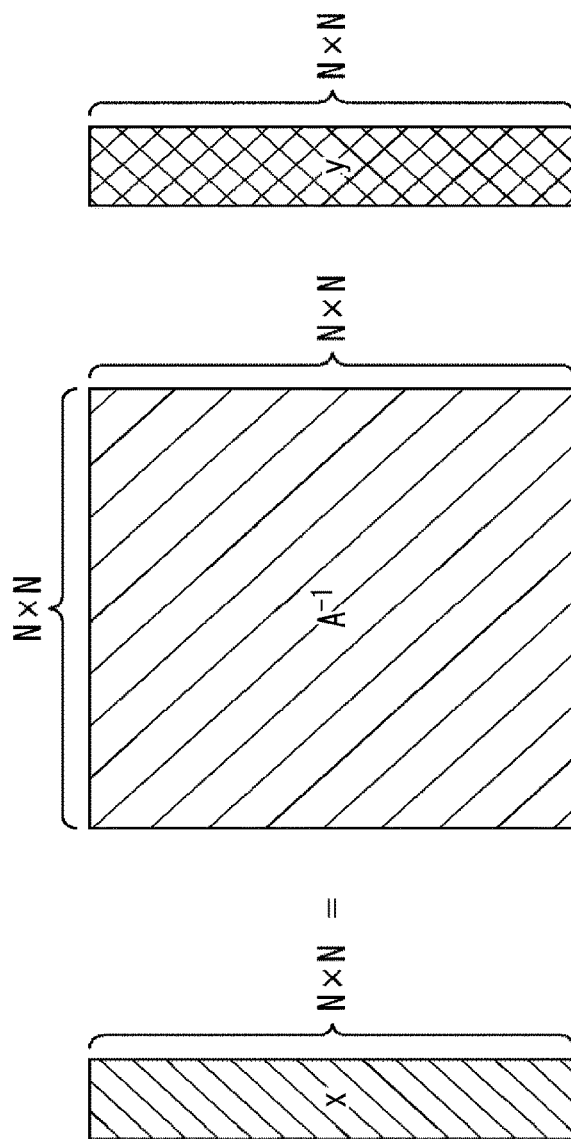
FIG. 23 is a diagram explaining a method of reducing a processing load.

Incidentally, in general, the determinant in FIG. 22 is transformed as illustrated in FIG. 23 by multiplying both sides by an inverse matrix $A^{-1}$ of the matrix A from the left, and each element of the vector X, which is the detection image, is found by multiplying the vector Y as the detection image by the inverse matrix $A^{-1}$ from the left.

However, in reality, for example, the matrix A cannot be found precisely, the matrix A cannot be measured precisely, the basis vector of the matrix A cannot be solved in a case of nearly linear dependence, and noise is included in each element of the detection image. Then, for any of these reasons or a combination thereof, the simultaneous equations cannot be solved in some cases.

Thus, for example, considering a robust configuration with respect to a variety of errors, following formula (7) using the concept of the regularized least squares method is used.

[Mathematical Formula 1]

$$\hat{X} = \min \|A\hat{x} - y\|^2 + \|\gamma \hat{x}\mu\|^2 \quad (7)$$

Here, the member with "^" at the top of x in formula (7) represents the vector X, A represents the matrix A, Y represents the vector Y, γ represents a parameter, and ‖A‖ represents the L2 norm (root sum square). Here, the first term on the right side is a norm for when minimizing both sides in FIG. 22, and the second term on the right side is a regularization term.

When this formula (7) is solved for x, following formula (8) is obtained.

[Mathematical Formula 2]

$$\hat{X} = (A^t A + \gamma I)^{-1} A^t y \quad (8)$$

Here, $A^t$ denotes a transposed matrix of the matrix A, and I denotes a unit matrix.

However, since the matrix A has an enormous size, the computation amount and the required memory amount are larger.

Figure 24:
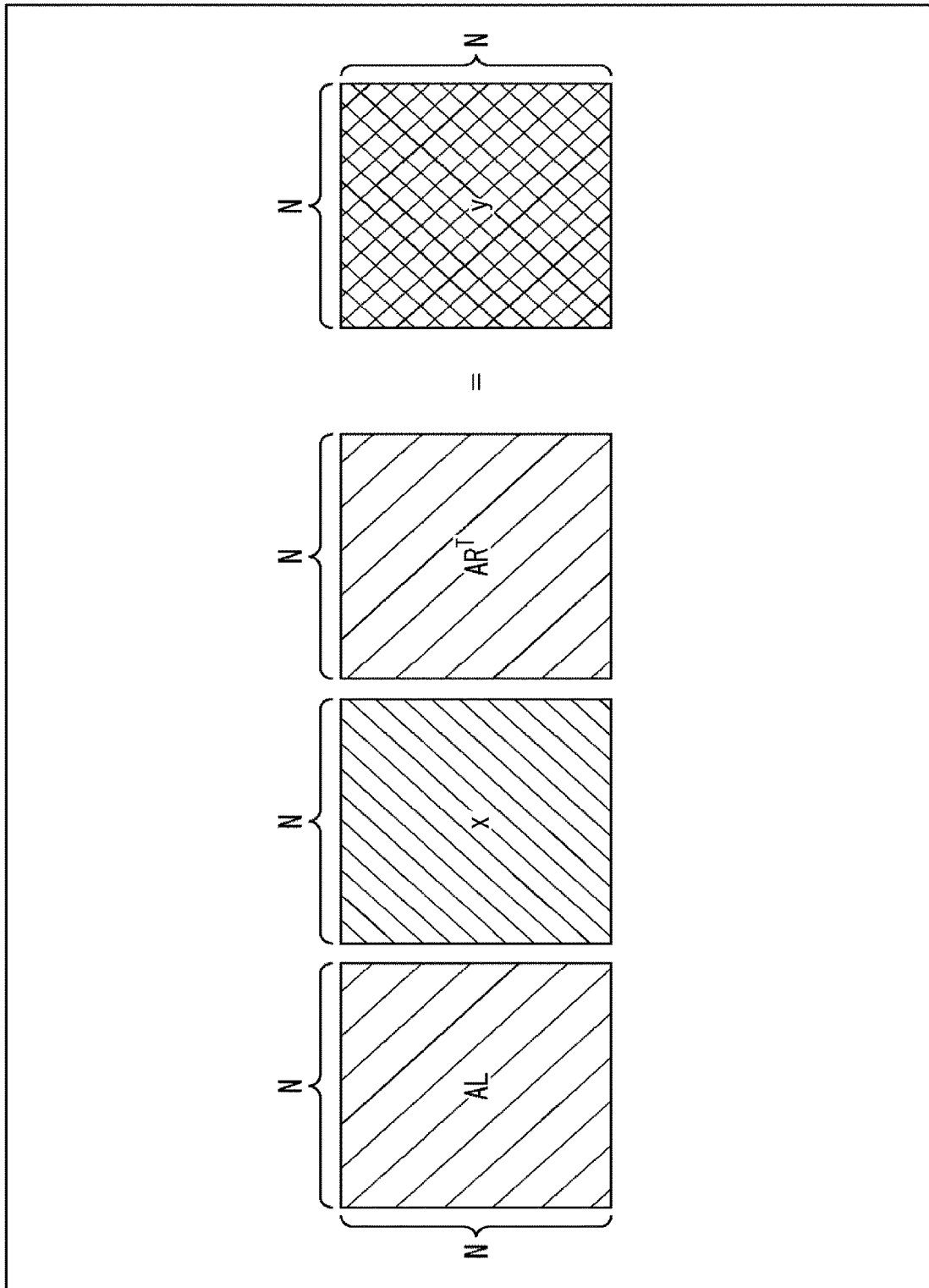
FIG. 24 is a diagram explaining a method of reducing a processing load.

Thus, for example, as illustrated in FIG. 24, the matrix A is decomposed into a matrix AL of N rows×N columns and a matrix $AR^T$ of N rows×N columns such that a result obtained by multiplying the preceding stage and the succeeding stage of a matrix X of N rows×N columns each representing the restoration image is given as a matrix Y of N rows×N columns representing the detection image. In consequence, for the matrix A with the number of elements (N×N)×(N×N), the matrices AL and $AR^T$ have the number of elements (N×N), and the number of elements in each matrix is given as 1/(N×N). As a result, the computation amount and the required memory amount can be reduced.

The determinant illustrated in FIG. 24 is implemented, for example, by assigning the matrix in parentheses in formula (8) as the matrix AL and the inverse matrix of the transposed matrix of the matrix A as the matrix $AR^T$.

Figure 25:
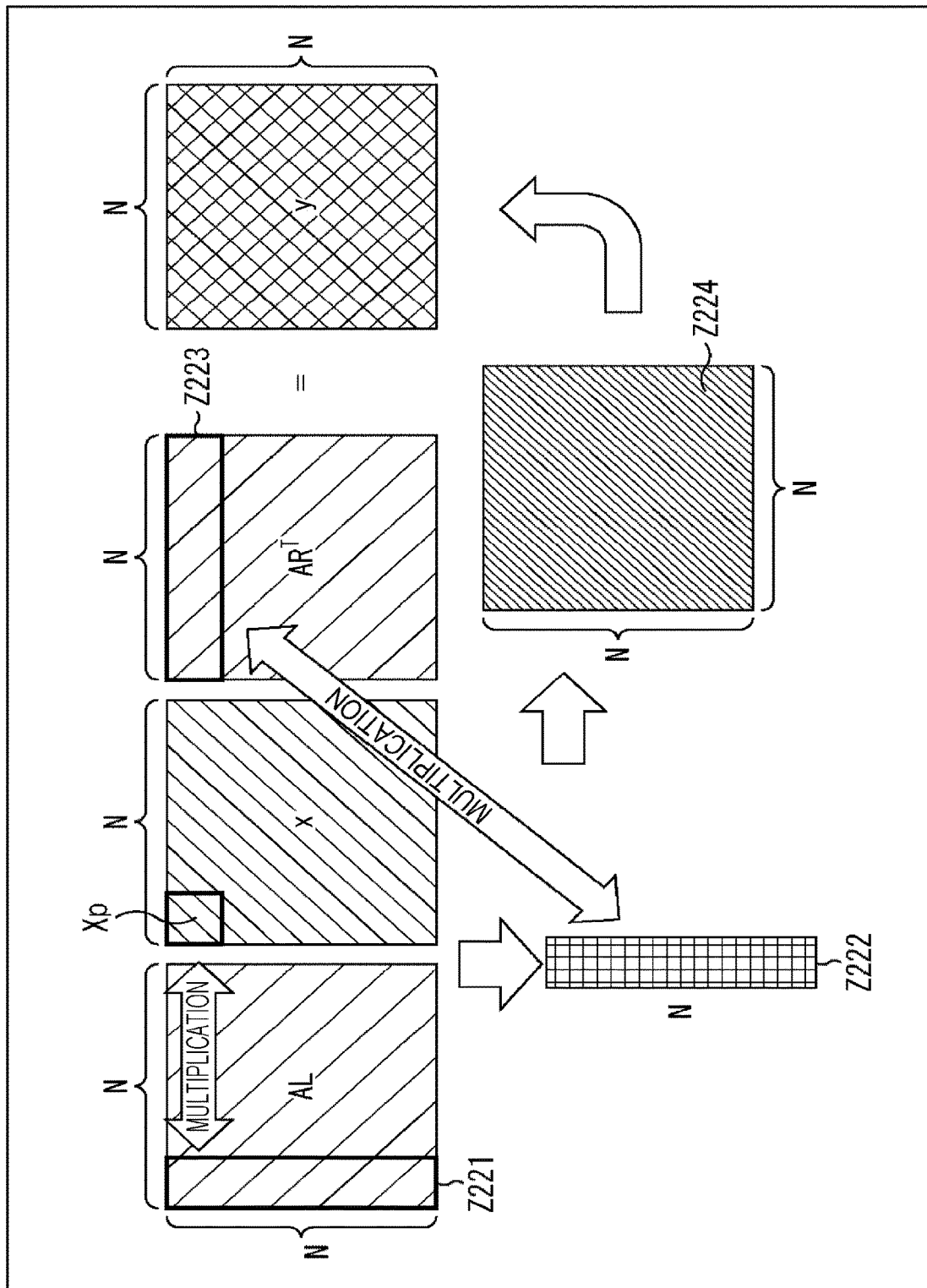
FIG. 25 is a diagram explaining a method of reducing a processing load.

In the computation as illustrated in FIG. 24, an element group Z222 is found by multiplying an element of interest Xp in the matrix X by each element of the element group Z221 of a corresponding column of the matrix AL, as illustrated in FIG. 25. Moreover, a two-dimensional response Z224 corresponding to the element of interest Xp is found by multiplying the element group Z222 by the elements of a row corresponding to the element of interest Xp in the matrix $AR^T$. Then, the matrix Y is found by integrating the two-dimensional responses Z224 corresponding to all the elements of the matrix X.

Thus, for example, for the element group Z221 of each column of the matrix AL, coefficients corresponding to the incident angle directivity of the lateral belt-type pixels 121a set to the same width for each column in the imaging element 121 illustrated in FIG. 21 are used.

Similarly, for example, for the element group Z223 of each row of the matrix $AR^T$, coefficients corresponding to the incident angle directivity of the longitudinal belt-type pixels 121a set to the same height for each row in the imaging element 121 illustrated in FIG. 21 are used.

As a result, since a matrix used when restoring the restoration image can be made smaller on the basis of the detection image, the computation amount can be reduced, the processing speed can be improved, and the power consumption related to the computation can be reduced. Furthermore, since the matrix can be made smaller, the capacity of a memory used for the computation can be reduced, and the apparatus cost can be reduced.

Note that, FIG. 21 illustrates an example in which the light shielding range (light receiving range) is changed in units of pixels while providing a predetermined regularity in the horizontal and the vertical directions; in this manner, in the present disclosure, the light shielding range (light receiving range) set at random in units of pixels to some extent although not being set completely at random is also deemed as being set at random. In different terms, in the present disclosure, a case where the light shielding range (light receiving range) is not only set completely at random in units of pixels, but also set at random to some extent (for example, a case where some of all the pixels include a range provided with regularity but other ranges are at random), or an arrangement that seems to have no regularity to some extent (a case of an arrangement in which not all pixels can be confirmed to be arranged in accordance with rules as described with reference to FIG. 21) is also deemed to be at random.

3. First Embodiment

Next, a first embodiment of the present disclosure will be described with reference to FIGS. 26 to 32.

As described above, the imaging element 121 using pixels having incident angle directivities does not require an imaging lens, an optical filter, or the like, and thus has a higher degree of freedom in arranging each pixel 121a. In the first embodiment of the present disclosure, by making use of such a degree of freedom in arranging each pixel 121a of the imaging element 121, the imaging element 121 is provided at a position where at least a part of a user wearing or using an electronic instrument is capturable in various electronic instruments, and at least a part of the user is imaged such that various application processes are executed using the restoration image obtained by the restoration process.

Here, at least a part of the user is, for example, an arbitrary part of the user's body, such as the user's whole body, face, eye, head, torso, hand, or foot. Furthermore, for example, in the case of a medical instrument or the like, at least a part of the user sometimes includes not only outside the user but also inside the user (for example, in the oral cavity, internal organs, and the like).

<Configuration Example of Electronic Instrument 301>

Figure 26:
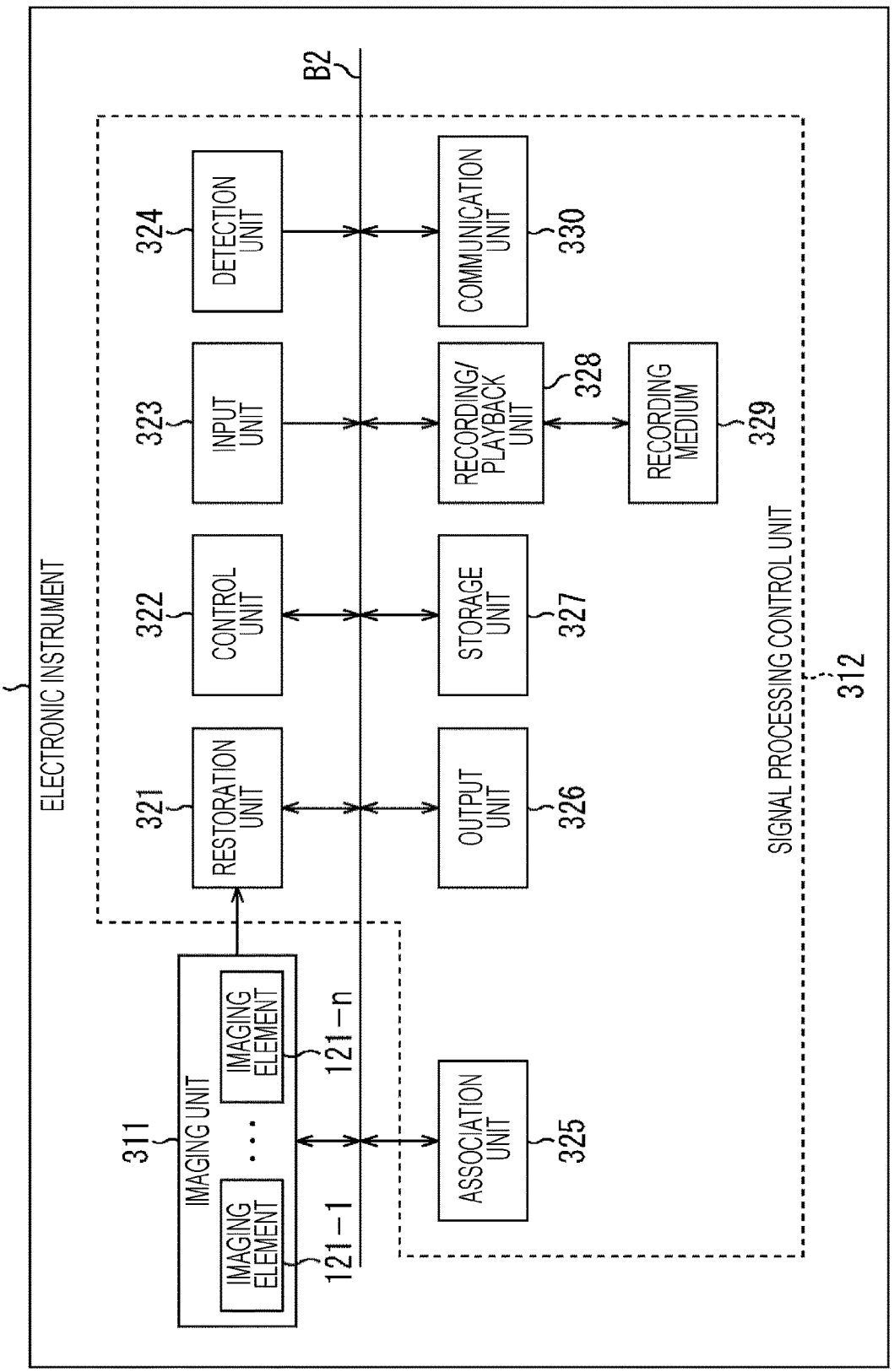
FIG. 26 is a block diagram illustrating a configuration example of an electronic instrument to which the technology of the present disclosure is applied.

FIG. 26 is a block diagram illustrating a configuration example of an electronic instrument 301 according to the first embodiment of the present disclosure. Note that, in FIG. 26, parts corresponding to the imaging apparatus 101 in FIG. 2 are denoted by the same reference numerals and the description thereof will be appropriately omitted.

The electronic instrument 301 is constituted by, for example, a portable information terminal worn or carried by a user such as a wearable device, a smartphone, a tablet, or a mobile phone, a personal computer, a wearable device, a game machine, a video playback apparatus, a music playback apparatus, or the like. Furthermore, for example, various schemes such as a head-worn type that is worn on the user's head, a wristwatch type, a bracelet type, a necklace type, and a neckband type can be adopted as the wearable device. In addition, the head-worn type wearable devices include, for example, glasses type, goggles type, head mounted side, earphones type, headset type, mask type, hat type, and the like. Note that, for example, depending on the shape and the like of the wearable device, there is a case where one wearable device corresponds to a plurality of schemes (for example, goggles type and head mounted type).

The electronic instrument 301 includes an imaging unit 311 and a signal processing control unit 312.

The imaging unit 311 includes n imaging elements 121-1 to 121-n equal to or greater than one.

Each imaging element 121 supplies a detection signal set including detection signals output from respective pixels 121a to a restoration unit 321 or outputs the detection signal set to a bus B2.

Note that the detection image is generated from the detection signal set from each imaging element 121. Accordingly, in a case where the imaging unit 311 includes only one imaging element 121, the detection image is generated from one detection signal set from the one imaging element 121.

Furthermore, each imaging element 121 may be installed in the same casing or may be installed in different casings.

The signal processing control unit 312 includes the restoration unit 321, a control unit 322, an input unit 323, a detection unit 324, an association unit 325, an output unit 326, a storage unit 327, a recording/playback unit 328, a recording medium 329, and a communication unit 330.

The restoration unit 321, the control unit 322, the input unit 323, the detection unit 324, the association unit 325, the output unit 326, the storage unit 327, the recording/playback unit 328, and the communication unit 330 are connected to each other via the bus B2, and for example, transmit and receive data via the bus B2. Note that, in the following, in order to simplify the explanation, description of the bus B2 in cases where each unit of the electronic instrument 301, for example, transmits and receives data via the bus B2 will be omitted.

The restoration unit 321 performs a restoration process for the restoration image, and the like by a process similar to the process of the restoration unit 122 of the imaging apparatus 101 in FIG. 2, using the detection signal set acquired from each imaging element 121. The restoration unit 321 outputs the restoration image to the bus B2.

The control unit 322 includes, for example, various processors to control each unit of the electronic instrument 301, perform various application processes, and the like.

The input unit 323 includes an input device for operating the electronic instrument 301, inputting data used for processes, and the like (for example, a key, a switch, a button, a dial, a touch panel, a remote controller, or the like). The input unit 323 outputs an operation signal, input data, and the like to the bus B2.

The association unit 325 associates the detection signal set of each imaging element 121 with metadata corresponding to each detection signal set.

The output unit 326 includes, for example, an output device that outputs an image, sound, light, vibration, and the like, such as a display, a speaker, a lamp, a buzzer, and a vibration element, and outputs various types of information and data.

The storage unit 327 includes one or more storage apparatuses such as a ROM, a RAM, and a flash memory, and stores, for example, programs and data used for processes of the electronic instrument 301. For example, the storage unit 327 stores a coefficient set group corresponding to each imaging element 121. This coefficient set group is prepared for each supposed subject distance and angle of view, for example.

The recording/playback unit 328 records data on the recording medium 329, and plays back (reads) data recorded on the recording medium 329. For example, the recording/playback unit 328 records the restoration image on the recording medium 329 or reads the restoration image from the recording medium 329. Furthermore, for example, the recording/playback unit 328 records the detection signal set and corresponding metadata on the recording medium 329, or reads the detection signal set and corresponding metadata from the recording medium 329.

The recording medium 329 includes, for example, any of an HDD, an SSD, a magnetic disk, an optical disc, a magneto-optical disk, a semiconductor memory, and the like, or a combination thereof, or the like.

The communication unit 330 communicates with other instruments using a predetermined communication scheme. Note that the communication scheme of the communication unit 330 may be either wired or wireless. Furthermore, the communication unit 330 can also support a plurality of communication schemes.

<Arrangement Example of Imaging Element 121>

Next, arrangement examples of the imaging element 121 will be described with reference to FIGS. 27 to 31, giving specific examples of the electronic instrument 301.

Figure 27:
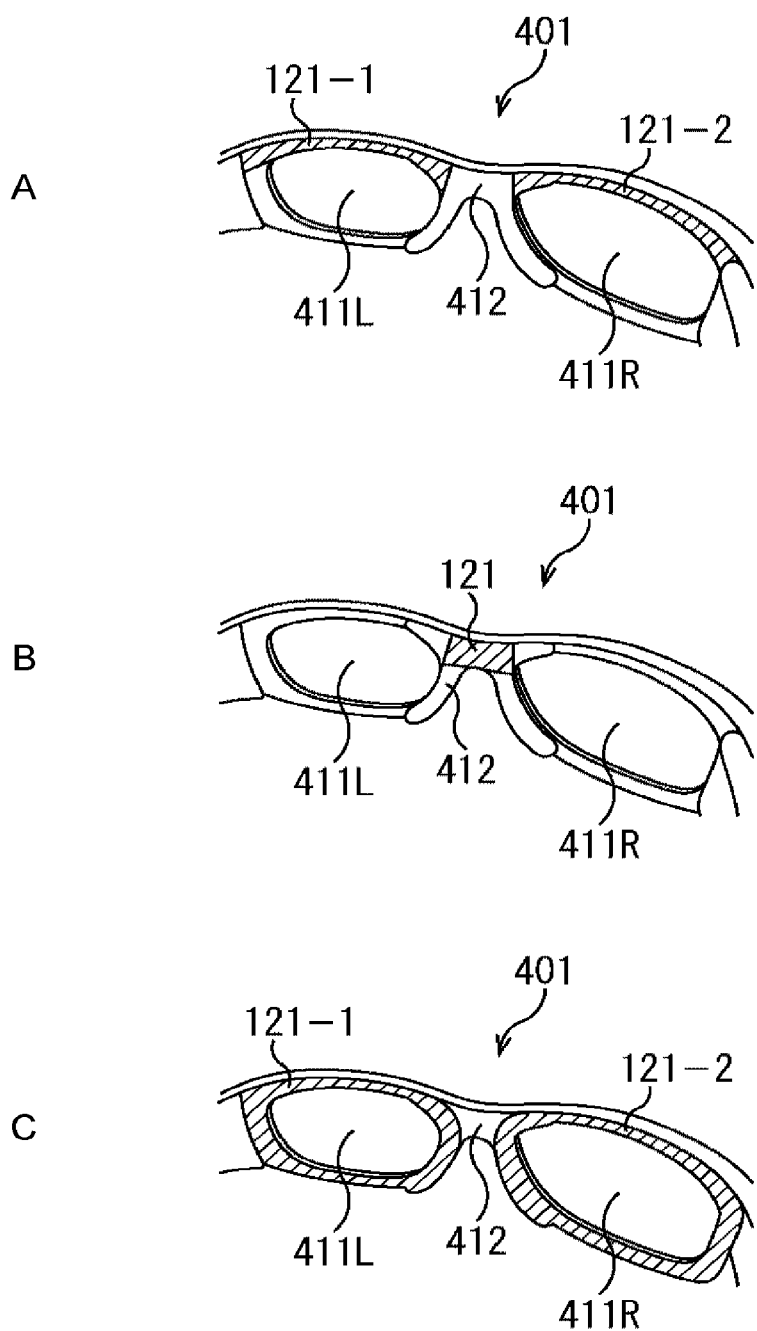
FIG. 27 is a diagram illustrating arrangement examples of imaging elements in a wearable device.

A to C of FIG. 27 schematically illustrate a part of a glasses-type wearable device 401 that is worn so as to cover the eyes of the user, as an example of the electronic instrument 301. Furthermore, A to C of FIG. 27 illustrate examples in which the imaging elements 121 (respective pixels 121a of the imaging elements 121) are arranged around a left lens 411L and a right lens 411R, which form an eyepiece unit of the wearable device 401.

Here, the eyepiece unit is a part in proximity to the eyes of the user wearing or using the electronic instrument 301, and includes, for example, eyepiece lenses such as the left lens 411L and the right lens 411R. In a case where the eyepiece unit includes proximity lenses, for example, the user can view a figure (for example, a figure or moving picture of a subject and the like) through the proximity lens.

Specifically, in the example in A of FIG. 27, the imaging element 121-1 is arranged above the left lens 411L on a back surface of a frame 412, that is, a surface facing the user's face in a case where the user wears the wearable device 401, and the imaging element 121-2 is arranged above the right lens 411R on a back surface of the frame 412.

In the example in B of FIG. 27, the imaging element 121 is arranged near a bridge on a back surface of the frame 412.

In the example in C of FIG. 27, the imaging element 121-1 is arranged so as to surround the circumference of the left lens 411L on a back surface of the frame 412, and the imaging element 121-2 is arranged so as to surround the circumference of the right lens 411R on a back surface of the frame 412.

As described above, the imaging element 121 can be arranged in an empty space of the frame 412 of the wearable device 401 while a growth in size and a deterioration in design are suppressed. Furthermore, the imaging element 121 is arranged at a position where an area near both eyes of the user wearing the wearable device 401 is capturable, and can image the periphery of both eyes of this user.

Note that it is desirable that the incident angle directivity of each pixel 121a of each imaging element 121 in A to C of FIG. 27 be set such that the light receiving sensitivity with respect to the directions of the user's eyes in proximity to the left lens 411L and the right lens 411R when the wearable device 401 is worn is higher. With such setting, in each pixel 121a, the light receiving sensitivity with respect to incident light from the directions of the user's eyes, which are the main imaging targets, is heightened, and the user's eyes can be imaged more clearly.

Figure 28:
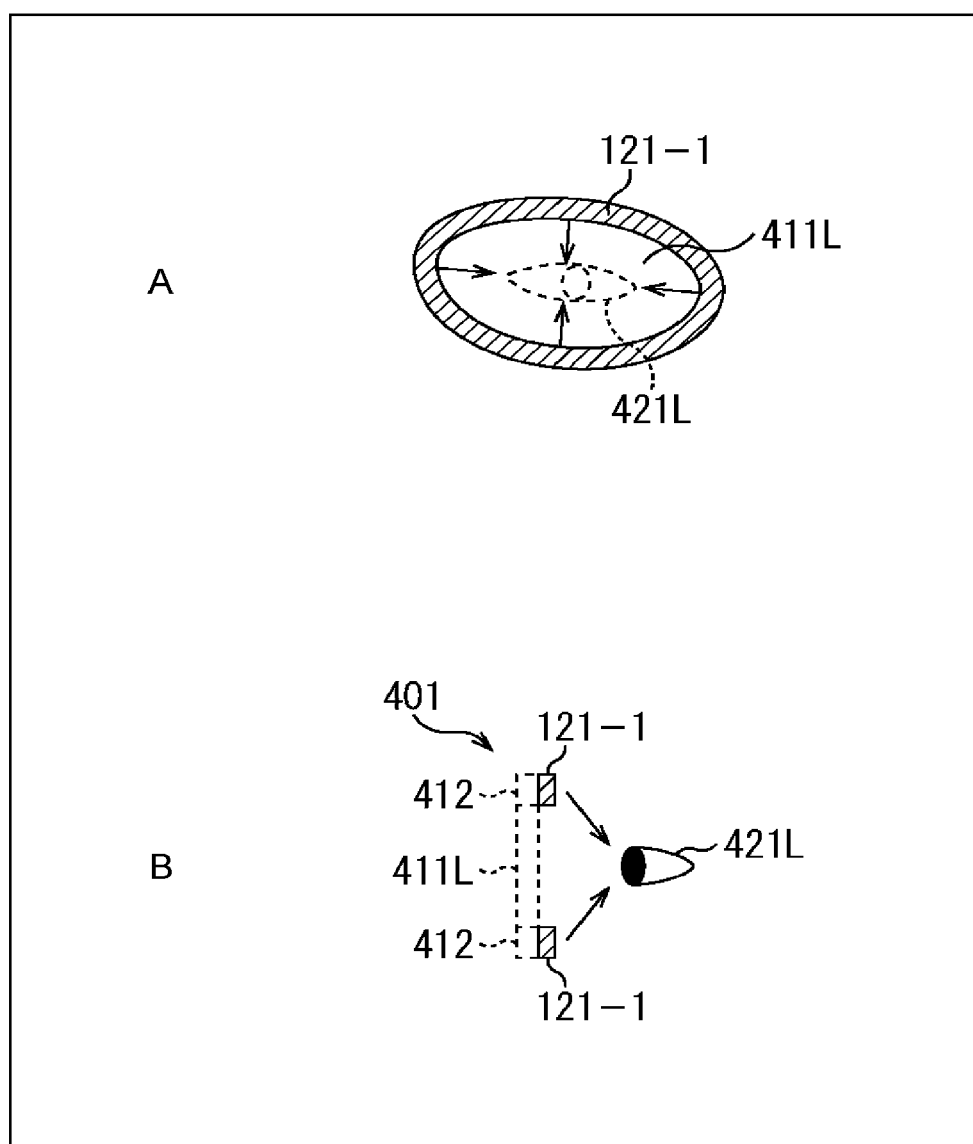
FIG. 28 is a diagram illustrating an example of incident angle directivity of an imaging element.

For example, A and B of FIG. 28 schematically illustrate an example of the incident angle directivity of the imaging element 121-1 in C of FIG. 27. A and B of FIG. 28 schematically illustrate the positional relationship between a left eye 421L of the user in a state of wearing the wearable device 401, the left lens 411L, and the imaging element 121-1. A of FIG. 28 illustrates a diagram of the left lens 411L as viewed from the inside (the side of a surface facing the user's eyes), and B of FIG. 28 illustrates a cross-sectional view of the left lens 411L as viewed from the side.

Note that the arrows in FIG. 28 indicate the tendency of the incident angle directivities of the pixels 121a in each region of the imaging element 121-1. Furthermore, hereinafter, in A and B of FIG. 28, a direction from the left lens 421L toward the left eye 421 (the right direction in B of FIG. 28) is assumed as a backward direction.

The pixel 121a in a region on an upper side of the imaging element 121-1 has an incident angle directivity set in a diagonally downward backward direction, and the light receiving sensitivity with respect to the direction of the left eye 421L is made higher. The pixel 121a in a region on a left side of the imaging element 121-1 has an incident angle directivity set in a diagonally backward right direction, and the light receiving sensitivity with respect to the direction of the left eye 421L is made higher. The pixel 121a in a region on a right side of the imaging element 121-1 has an incident angle directivity set in a diagonally backward left direction, and the light receiving sensitivity with respect to the direction of the left eye 421L is made higher. The pixel 121a in a region on a lower side of the imaging element 121-1 has an incident angle directivity set in a diagonally upward backward direction, and the light receiving sensitivity with respect to the direction of the left eye 421L is made higher.

With such setting, in the imaging element 121-1, the light receiving sensitivity with respect to incident light from the direction of the user's left eye 421L, which is the main imaging target, is heightened, and the left eye 421L can be imaged more clearly.

Note that, although illustration is omitted, also in the imaging element 121-2 arranged around the right lens 411R, the incident angle directivity of each pixel 121a is set in the direction of the user's right eye 421R, which is the main imaging target. With such setting, the light receiving sensitivity with respect to incident light from the user's right eye 421R is heightened, and the right eye 421R can be imaged more clearly.

Note that, among examples in A to C of FIG. 27, from the viewpoint of the image quality of the restoration image, it is more desirable to arrange the imaging element 121 as in C of FIG. 27, and making variations in the incident angle directivities of the respective pixels 121a. This is because making variations in the incident angle directivities of the respective pixel 121a heightens the diversity of coefficient set groups for the simultaneous equations used to restore the restoration image, and improve the restoration accuracy.

In addition, the incident angle directivities of all the pixels 121a need not necessarily be set such that the light receiving sensitivity with respect to the directions of the user's eyes is higher. For example, it is only required that the number of pixels 121a having incident angle directivity that heightens the light receiving sensitivity with respect to the directions of the user's eyes is larger than the number of pixels 121a having other incident angle directivities.

Figure 29:
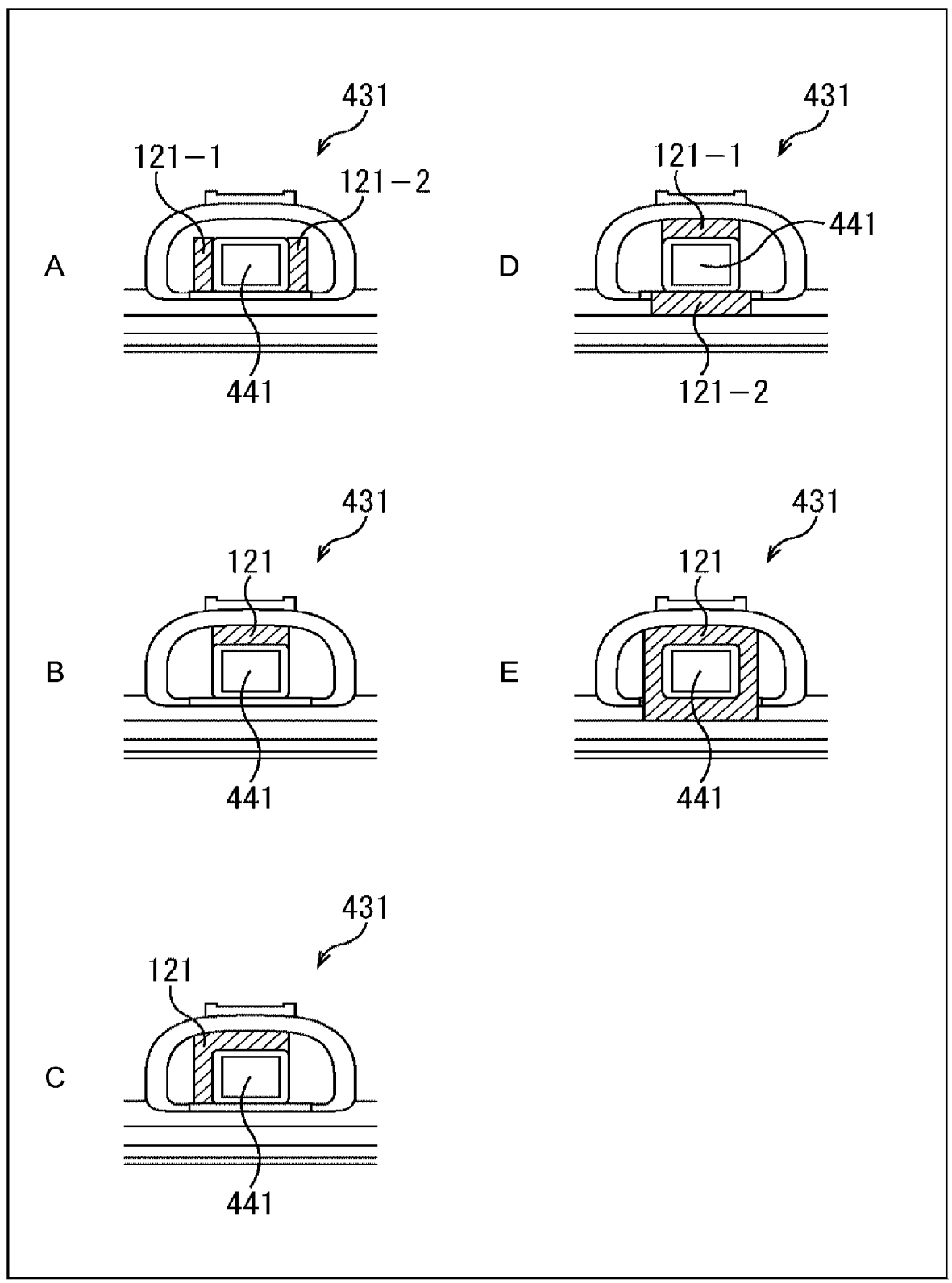
FIG. 29 is a diagram illustrating arrangement examples of imaging elements in a camera.

A to C of FIG. 29 schematically illustrate a camera 431 as an example of the electronic instrument 301. Note that A to C of FIG. 29 illustrate only the periphery of a viewfinder 441 of the camera 431; for example, a display unit such as a display or a touch panel and a user operation unit are provided on a rear surface of the camera 431 (a surface on the same side as the viewfinder 441).

Furthermore, A to C of FIG. 29 illustrate examples in which the respective imaging elements 121 (respective pixel 121a of the respective imaging elements 121) are arranged around the viewfinder 441, which is an eyepiece unit of the camera 431.

Specifically, in the example in A of FIG. 29, the imaging element 121-1 is arranged in a longitudinally long rectangular region on a left side of the viewfinder 441, and the imaging element 121-2 is arranged in a longitudinally long rectangular region on a right side of the viewfinder 441.

In the example in B of FIG. 29, the imaging element 121 is arranged in a laterally long rectangular region above the viewfinder 441.

In the example in C of FIG. 29, the imaging element 121 is arranged in an L-shaped region above and on a left side of the viewfinder 441.

In the example in D of FIG. 29, the imaging element 121-1 is arranged in a laterally long rectangular region above the viewfinder 441, and the imaging element 121-2 is arranged in a laterally long rectangular region below the viewfinder 441.

In the example in E of FIG. 29, the imaging element 121 is arranged so as to surround the circumference of the viewfinder 441.

As described above, the imaging element 121 can be arranged in an empty space around the viewfinder 441 of the camera 431 while a growth in size and a deterioration in design are suppressed. Furthermore, the imaging element 121 is arranged at a position where the periphery of the user's eye is capturable in a case where this user looks into the viewfinder 441 in order to capture an image using the camera 431, and can image the periphery of the eye of this user.

Note that it is desirable that the incident angle directivity of each pixel 121a of each imaging element 121 in A to E of FIG. 29 be set such that the light receiving sensitivity with respect to the direction of the user's eye in proximity to the viewfinder 441 when the viewfinder 441 is looked into (for example, ahead of the viewfinder 441) is higher.

Figure 30:
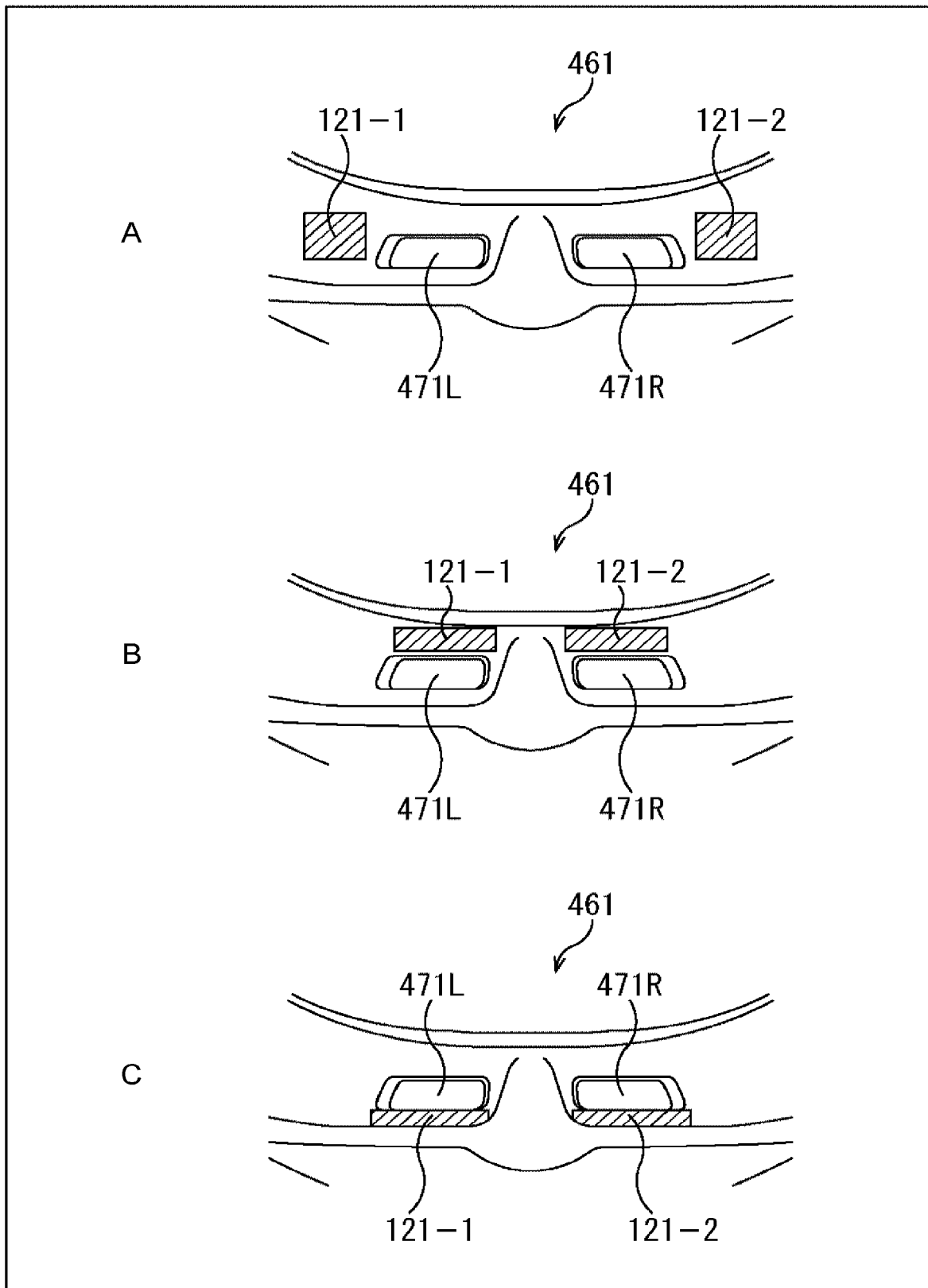
FIG. 30 is a diagram illustrating arrangement examples of imaging elements in a head mounted display.

A to C of FIG. 30 schematically illustrate a part of a goggles-type head mounted display 461 that is worn so as to cover the eyes of the user, as an example of the electronic instrument 301. Note that A to C of FIG. 30 illustrate an inner surface of the head mounted display 461, that is, a surface facing the user's face when the user wears the head mounted display 461, and illustrate an example in which the respective imaging element 121 (respective pixels 121a of the respective imaging elements 121) are arranged around a left lens 471L and a right lens 471R, which form an eyepiece unit of the head mounted display 461.

Specifically, in the example in A of FIG. 30, the imaging element 121-1 is arranged in a rectangular region on a left side of the left lens 471L, and the imaging element 121-2 is arranged in a rectangular region on a right side of the right lens 471R.

In the example in B of FIG. 30, the imaging element 121-1 is arranged in a laterally long rectangular region above the left lens 471L, and the imaging element 121-2 is arranged in a laterally long rectangular region above the right lens 471R.

In the example in C of FIG. 30, the imaging element 121-1 is arranged in a laterally long rectangular region below the left lens 471L, and the imaging element 121-2 is arranged in a rectangular region below the right lens 471R.

As described above, the imaging element 121 can be arranged in an empty space around the left lens 471L and the right lens 471R of the head mounted display 461 while a growth in size and a deterioration in design are suppressed. Then, for example, the periphery of both eyes of the user wearing the head mounted display 461 can be imaged.

Note that, similarly to the wearable device 401 in FIG. 27, it is desirable that the incident angle directivity of each pixel 121a of each imaging element 121 in A to C of FIG. 30 be set such that the light receiving sensitivity with respect to the directions of the user's eyes in a state in which the head mounted display 461 is worn is higher.

A to C of FIG. 31 schematically illustrate a notebook personal computer (PC) 491 as an example of the electronic instrument 301.

In the PC 491, a lid portion provided with a display 501, which is a display unit, and a bottom portion provided with a keyboard 503, which is a user operation unit, are rotatably connected by a hinge portion to allow the lid portion to be opened and closed. Then, the display 501 and the keyboard 503 are exposed to the outside in a state in which the lid portion is opened as illustrated in A to C of FIG. 31, and the user can use the PC 491. Note that, for example, by providing a touch panel on the display 501, the display 501 (strictly, the touch panel) can be employed as a user operation unit.

Furthermore, A to C of FIG. 31 illustrate examples in which the imaging elements 121 (respective pixel 121a of the imaging elements 121) are arranged around the display 501.

In the example in A of FIG. 31, the imaging element 121 is arranged on an upper side of a bezel 502 around the display 501.

In the example in B of FIG. 31, the imaging element 121-1 is arranged on a left side of the bezel 502, and the imaging element 121-2 is arranged on a right side of the bezel 502.

In the example in C of FIG. 31, the imaging element 121 is arranged on four sides of the bezel 502 so as to enclose the display 501.

As described above, the imaging element 121 can be arranged in an empty space of the bezel 502, and a narrower bezel can be implemented while a growth in size and a deterioration in design are suppressed. Furthermore, the imaging element 121 is arranged at a position directly in front of the user using the keyboard 503 while looking at the display 501 of the PC 491, where the periphery of the user's face is capturable, and can image the periphery of the face of this user.

Note that it is desirable that the incident angle directivity of each pixel 121a of each imaging element 121 in A to C of FIG. 31 be set such that the light receiving sensitivity with respect to the direction of the face of the user using the keyboard 503 while looking at the display 501 of the PC 491 (for example, ahead of the display 501) is higher.

<User Imaging Control Process>

Next, a user imaging control process executed by the electronic instrument 301 will be described with reference to a flowchart in FIG. 32.

In step S101, each imaging element 121 of the electronic instrument 301 images the user by a process similar to the process in step S1 in FIG. 20.

For example, in the case of the wearable device 401 in FIG. 27, the periphery of both eyes of the user wearing the wearable device 401 is imaged.

In the case of the camera 431 in FIG. 29, the periphery of the eye of the user looking into the viewfinder 441 is imaged.

In the case of the head mounted display 461 in FIG. 30, the periphery of both eyes of the user wearing the head mounted display 461 is imaged.

In the case of the PC 491 in FIG. 31, the periphery of the face of the user looking at the display 501 is imaged.

Each imaging element 121 supplies a detection signal set including a detection signal of each pixel 121a to the association unit 325.

In step S102, the restoration unit 321 finds a coefficient used for image restoration. Specifically, the restoration unit 321 sets the subject distance by the process similar to the process by the restoration unit 122 of the imaging apparatus 101 in step S2 in FIG. 20. Then, the restoration unit 321 reads a coefficient set group in correspondence with the set subject distance from the storage unit 327.

In step S103, the restoration unit 321 restores an image using the detection signal set and the coefficients. That is, the restoration unit 321 restores the restoration image using the detection signal set output from each imaging element 121 and the coefficient set group found in the process in step S102, by a process similar to the process by the restoration unit 122 of the imaging apparatus 101 in step S3 in FIG. 20.

In step S104, the electronic instrument 301 performs various processes on the restoration image. For example, the restoration unit 321 performs a demosaic process, γ correction, white balance adjustment, a conversion process to a predetermined compression format, and the like on the restoration image as necessary. Furthermore, the restoration unit 321, for example, supplies the restoration image to the output unit 326 to display, or supplies the restoration image to the recording/playback unit 328 to record on the recording medium 329, or outputs the restoration image to other instruments via the communication unit 330, as necessary.

In step S105, the electronic instrument 301 executes an application process using the restoration image (that is, the user's image).

For example, in the case of the wearable device 401 in FIG. 27, the control unit 322 detects the user's line of sight on the basis of the image of the user's eyes in the restoration image. Note that an arbitrary method can be used for line-of-sight detection. Then, for example, the control unit 322 generates an operation command corresponding to the movement of the user's line of sight, and transmits the generated operation command to another electronic instrument (not illustrated) via the communication unit 330. Therefore, the user can operate the another electronic instrument merely by wearing the wearable device 401 and moving his/her line of sight.

For example, in the case of the camera 431 in FIG. 29, the control unit 322 detects the user's line of sight on the basis of the image of the user's eye in the restoration image. Note that an arbitrary method can be used for line-of-sight detection. Then, for example, the control unit 322 controls each unit of the camera 431 to move the position of a subject to be focused (focus point) according to the movement of the user's line of sight, or to perform various processes of the camera 431. Therefore, the user can, for example, set the focus point and perform various operations on the camera 431 merely by looking into the viewfinder 441 and moving his/her line of sight.

Alternatively, for example, the control unit 322 performs a user recognition process or authentication process on the basis of inside the restoration image.

Here, the recognition process is, for example, a process of specifying a user or recognizing a user's features. Meanwhile, the authentication process is a process of, for example, judging whether or not a user is a user who is registered in advance or a legitimate user or the like, for example, by collating the restoration image with an image registered in advance (for example, a face image or an eye image). Note that the recognition process and the authentication process sometimes partially overlap without being definitely distinguished. Furthermore, an arbitrary method can be used for the user recognition process and authentication process. For example, various types of biometric authentication such as face authentication and iris authentication can be used for the recognition process.

Then, for example, the control unit 322 displays a user interface screen corresponding to the recognized or authenticated user on the display of the output unit 326 on the basis of the user recognition result or authentication result, or alters the setting of the camera 431, or gives permission to use a specific function (for example, playback and the like).

For example, in the case of the head mounted display 461 in FIG. 30, the control unit 322 detects the user's line of sight on the basis of the image of the user's eyes in the restoration image. Note that an arbitrary method can be used for line-of-sight detection. Then, for example, the control unit 322 controls each unit of the head mounted display 461 to perform various processes of the head mounted display 461 according to the movement of the user's line of sight. Therefore, the user can perform various operations on the head mounted display 461 merely by wearing the head mounted display 461 and moving his/her line of sight.

For example, in the case of the PC 491 in FIG. 31, the control unit 322 performs a user recognition process or authentication process on the basis of the image of the user's face in the restoration image. Then, for example, the control unit 322 displays a user interface screen corresponding to the recognized or authenticated user on the display of the output unit 326 on the basis of the user recognition result or authentication result, or alters the setting or the like of the PC 491 (for example, custom settings, image quality settings, and parental control settings), or gives permission to log in to a specific account, to access a specific folder or file, to use a specific function, and the like.

Thereafter, the user imaging control process ends.

Note that, in the above, an example in which the restoration image is restored from the detection signal set using the coefficient set group in correspondence with the imaging element 121 and the subject distance has been described; however, as described earlier, for example, a coefficient set group corresponding to the angle of view of the restoration image may be further prepared in addition to a coefficient set group corresponding to the subject distance such that the restoration image is restored using the coefficient set groups corresponding to the subject distance and the angle of view.

By configuring as described above, the imaging element 121 can be arranged while a growth in size and a deterioration in design of the electronic instrument 301 are suppressed, and a user using the electronic instrument can be imaged. Then, the image of the user can be restored, and various application processes can be executed on the basis of the restored image.

4. Second Embodiment

Next, a second embodiment of the present disclosure will be described with reference to FIGS. 33 to 41.

In the first embodiment described above, an example in which a user using the electronic instrument 301 is imaged and various application processes are executed using the image of the user obtained by the restoration process is indicated. Meanwhile, in the second embodiment, the surroundings of a user using the electronic instrument 301 are imaged and various application processes are executed using the image of the surroundings of the user obtained by a restoration process.

Note that, in the second embodiment, the electronic instrument 301 in FIG. 26 is used as in the first embodiment. On the other hand, in the second embodiment, unlike the first embodiment, the imaging element 121 is arranged at a position where the surroundings of the user wearing or using the electronic instrument 301 are capturable.

<Arrangement Example of Imaging Element 121>

Here, arrangement examples of the imaging element 121 will be described with reference to FIGS. 33 to 40, giving specific examples of the electronic instrument 301.

Figure 33:
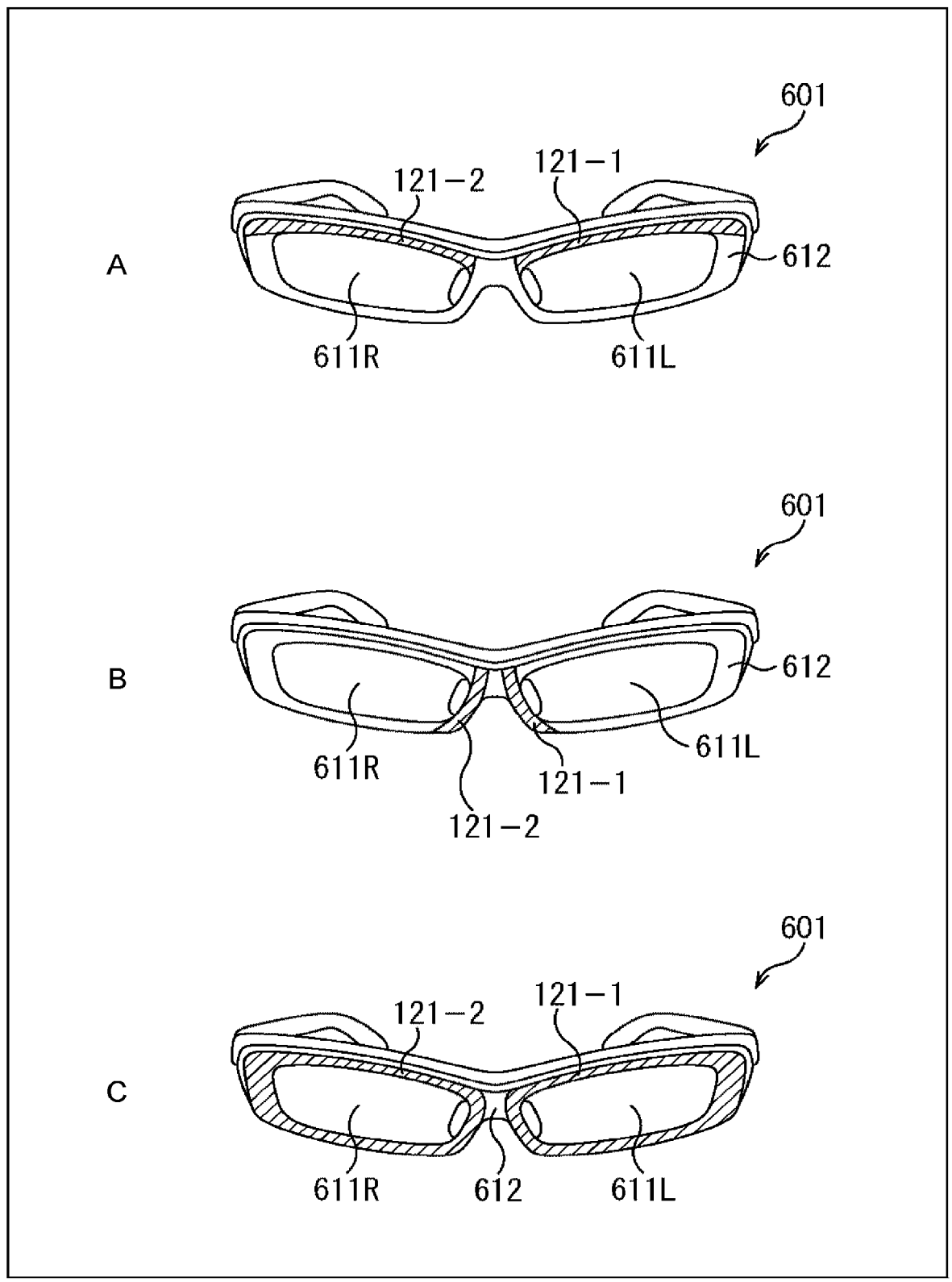
FIG. 33 is a diagram illustrating arrangement examples of imaging elements in a wearable device.

A to C of FIG. 33 schematically illustrate a glasses-type wearable device 601 that is worn so as to cover the eyes of the user, as an example of the electronic instrument 301. Furthermore, A to C of FIG. 33 illustrate examples in which the imaging elements 121 (respective pixels 121a of the imaging elements 121) are arranged on a front surface of a frame 612 exposed to the outside in a state in which the wearable device 601 is worn by the user.

Specifically, in the example in A of FIG. 33, the imaging element 121-1 is arranged above a left lens 611L on a front surface of the frame 612, and the imaging element 121-2 is arranged above a right lens 611R on a front surface of the frame 612.

In the example in B of FIG. 33, the imaging element 121-1 is arranged on a right side of the left lens 611L on a front surface of the frame 612, and the imaging element 121-2 is arranged on a left side of the right lens 611R on a front surface of the frame 612.

In the example in C of FIG. 33, the imaging element 121-1 is arranged so as to surround the circumference of the left lens 611L on a front surface of the frame 612, and the imaging element 121-2 is arranged so as to surround the circumference of the right lens 611R on a front surface of the frame 612.

As described above, the imaging element 121 can be arranged in an empty space of the frame 612 of the wearable device 601 while a growth in size and a deterioration in design are suppressed. Then, for example, an area ahead of the user wearing the wearable device 601 can be imaged.

Figure 34:
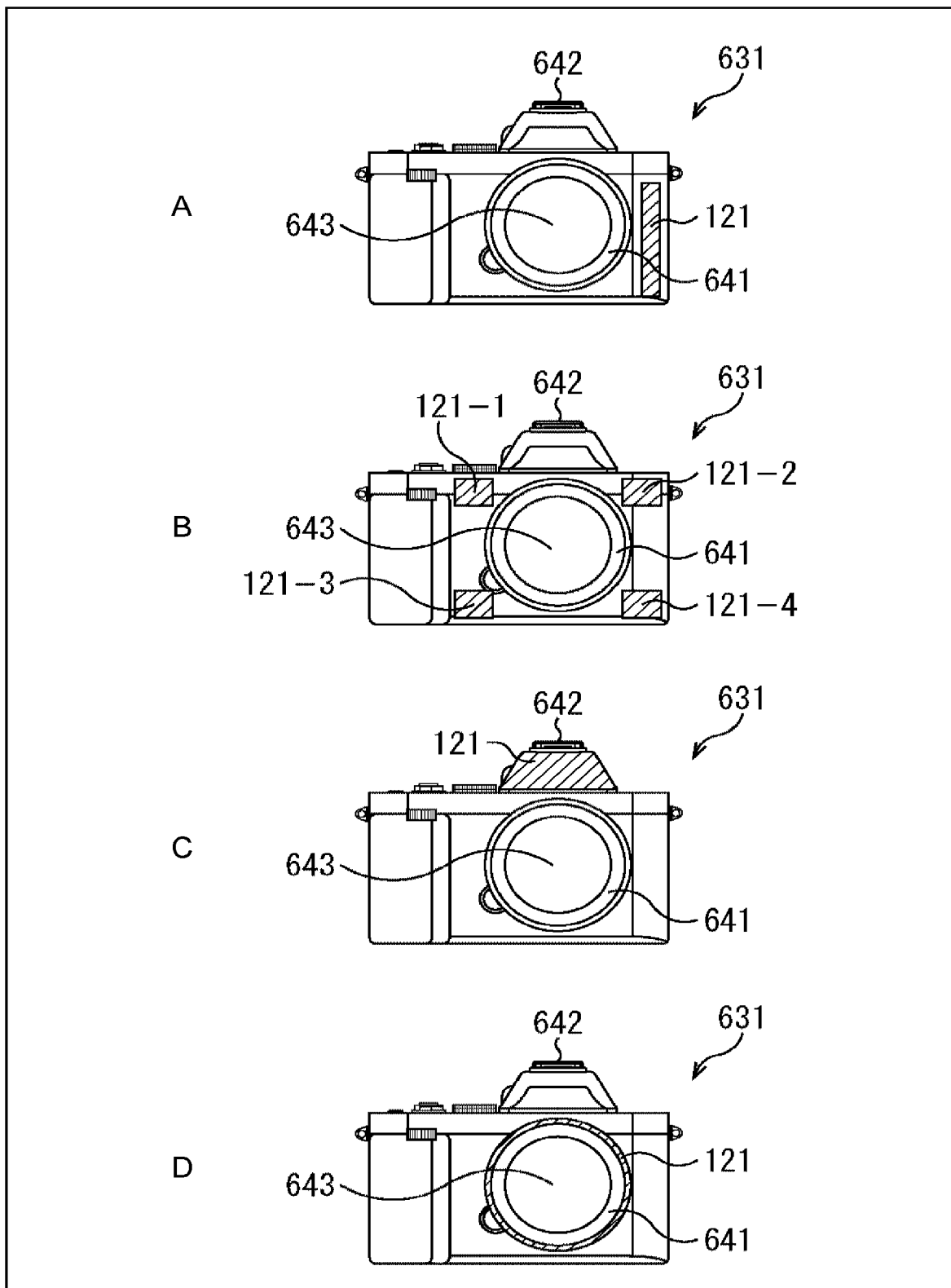
FIG. 34 is a diagram illustrating arrangement examples of imaging elements in a camera.

A to C of FIG. 34 schematically illustrate a camera 631 as an example of the electronic instrument 301. Furthermore, examples in which the imaging elements 121 (respective pixels 121a of the imaging elements 121) are arranged on a forward surface of a casing of the camera 631 are illustrated.

Specifically, in the example in A of FIG. 34, the imaging element 121 is arranged on a forward surface of a main body portion of the camera 631 in a longitudinally long rectangular region on a left side of a mount 641 near a left end of the camera 631.

In the example in B of FIG. 34, the respective imaging elements 121-1 to 121-4 are arranged on a forward surface of the main body portion of the camera 631 in four rectangular regions near four corners outside the mount 641.

In the example in C of FIG. 34, the imaging element 121 is arranged on a forward surface of a flash built-in unit 642 in which a flash of the camera 631 is built.

In the example in D of FIG. 34, the imaging element 121 is arranged in a ring-shaped region along an outer periphery of the mount 641 of the camera 631.

As described above, the imaging element 121 can be arranged in an empty space on a forward surface of the casing of the camera 631 while a growth in size and a deterioration in design are suppressed. Then, for example, an area in an imaging direction of the camera 631 can be imaged.

Figure 35:
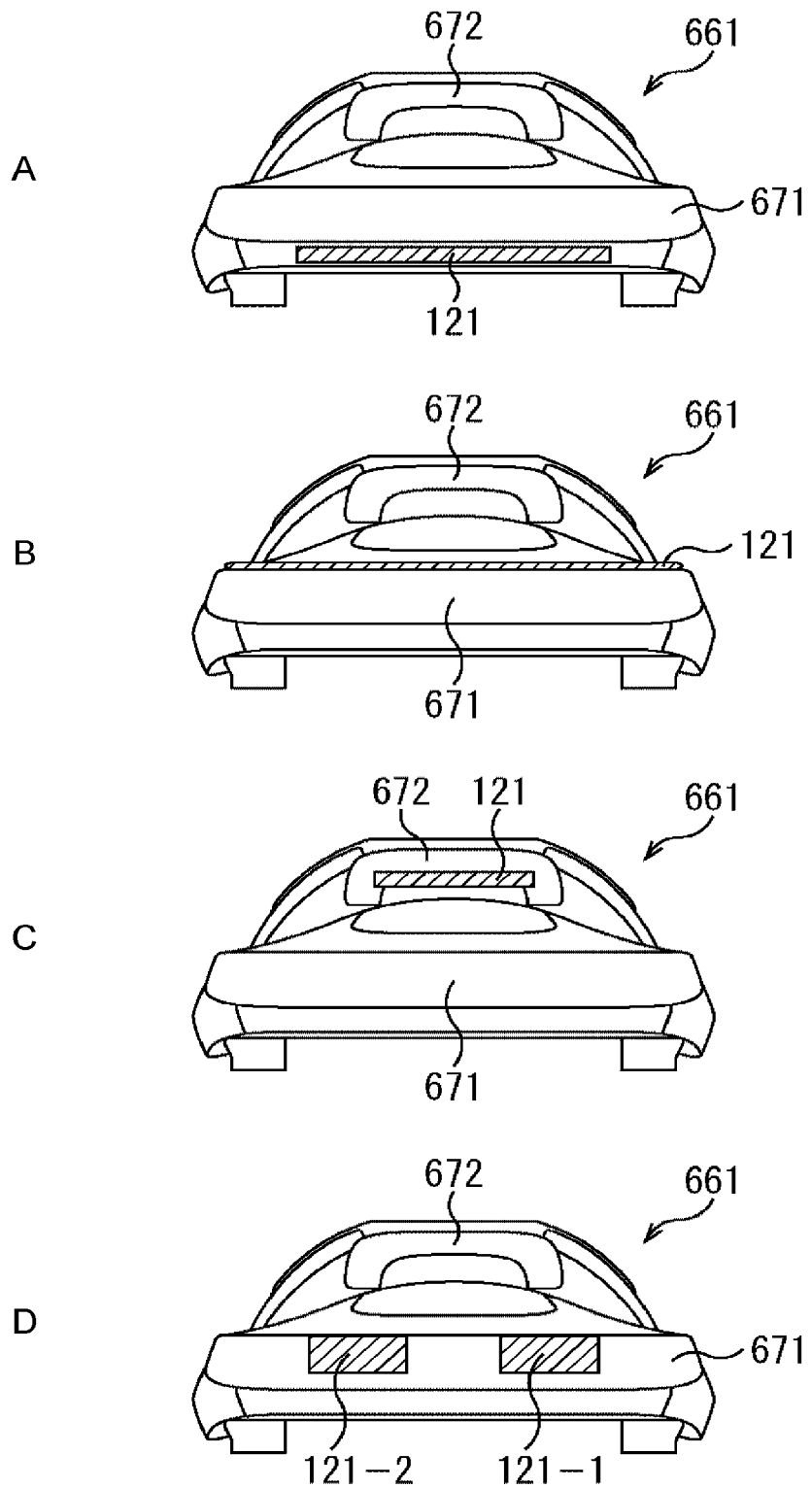
FIG. 35 is a diagram illustrating arrangement examples of imaging elements in a head mounted display.

A to D of FIG. 35 schematically illustrate a goggles-type head mounted display 661 that is worn so as to cover the eyes of the user, as an example of the electronic instrument 301. Furthermore, A to D of FIG. 35 illustrate examples in which the imaging elements 121 (respective pixels 121a of the imaging elements 121) are arranged on a forward surface of a casing exposed to the outside in a state in which the head mounted display 661 is worn by the user.

Specifically, in the example in A of FIG. 35, the imaging element 121 is arranged in a laterally long rectangular region on a lower side of a forward surface of a main body portion 671.

In the example in B of FIG. 35, the imaging element 121 is arranged in a laterally long region at an upper end of a forward surface of the main body portion 671.

In the example in C of FIG. 35, the imaging element 121 is arranged in a rectangular region on a forward surface of a head pad 672.

In the example in D of FIG. 35, the imaging elements 121-1 and 121-2 are arranged in rectangular regions on the left and right of a forward surface of the main body portion 671.

As described above, the imaging element 121 can be arranged in an empty space on a forward surface of the casing of the head mounted display 661 while a growth in size and a deterioration in design are suppressed. Then, for example, an area ahead of the user wearing the head mounted display 661 can be imaged.

Figure 36:
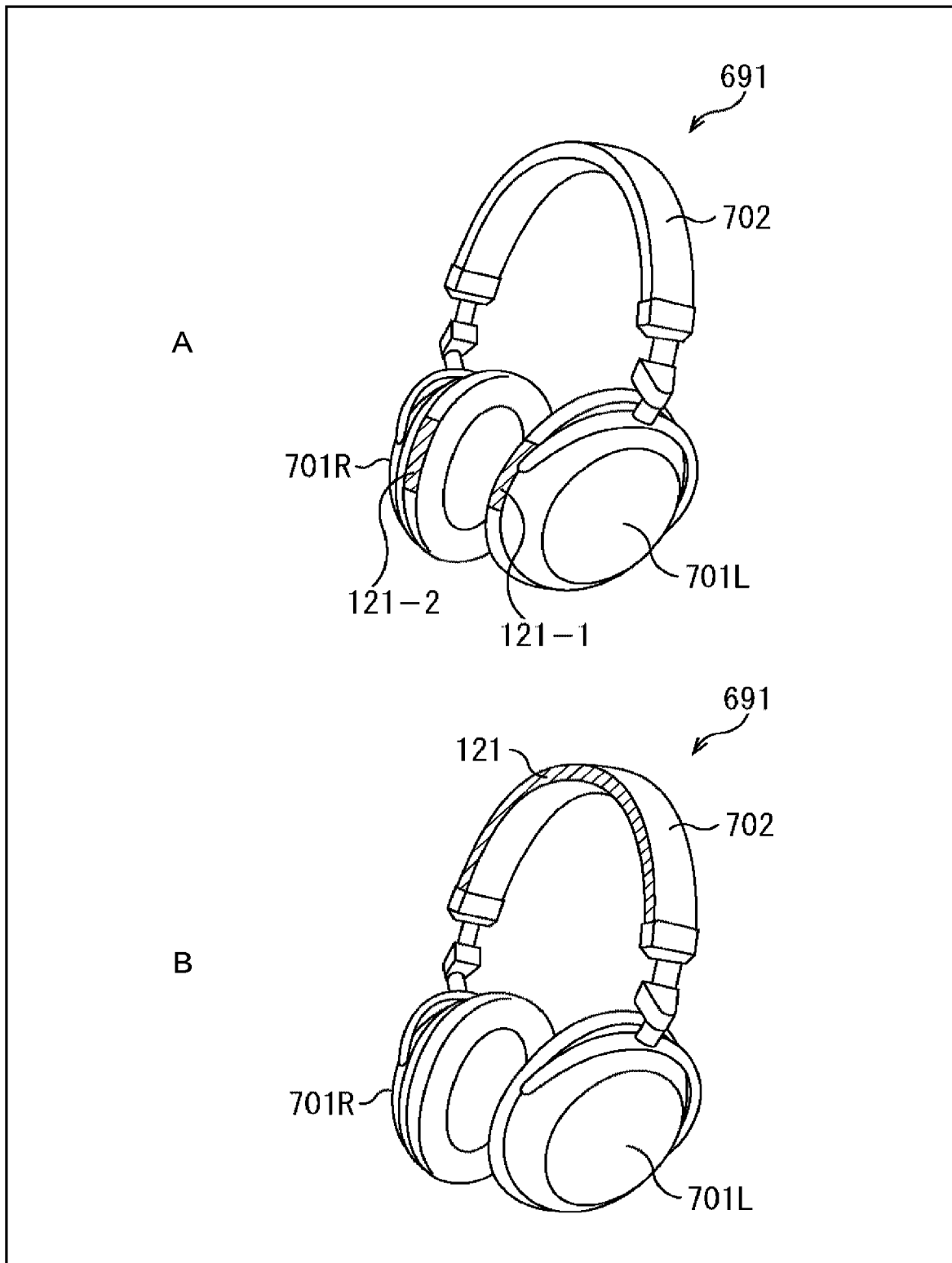
FIG. 36 is a diagram illustrating arrangement examples of imaging elements in overhead headphones.
Figure 37:
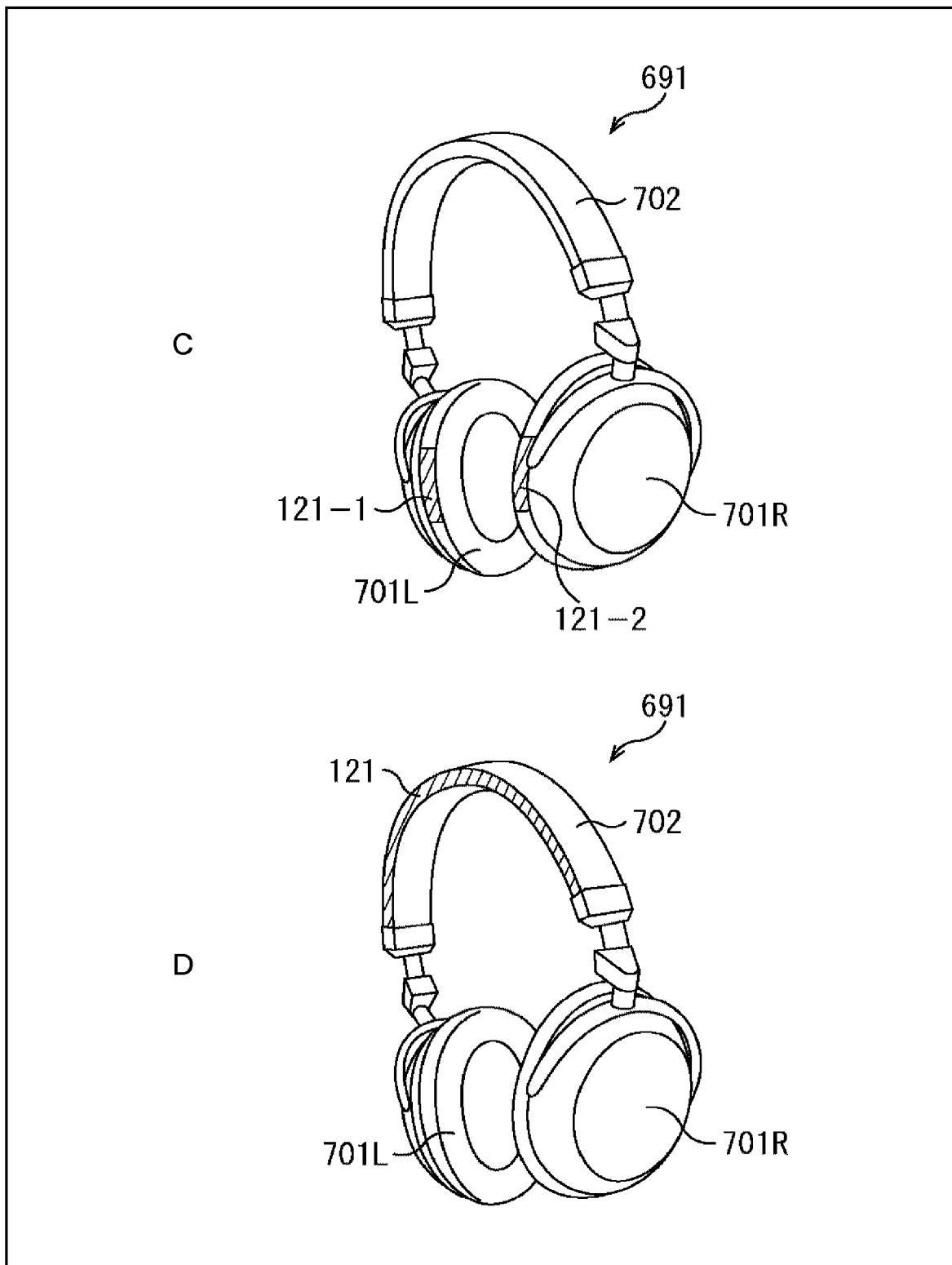
FIG. 37 is a diagram illustrating arrangement examples of imaging elements in overhead headphones.

A of FIG. 36 to D of FIG. 37 schematically illustrate overhead headphones 691 as an example of the electronic instrument 301. A and B of FIG. 36 illustrate perspective views of the headphones 691 as viewed diagonally from the front, and C and D of FIG. 37 illustrate perspective views of the headphones 691 as viewed diagonally from behind.

In the example in A of FIG. 36, the imaging element 121-1 is arranged near a forward center of a side surface of a housing 701L on the left side, and the imaging element 121-2 is arranged near a forward center of a side surface of a housing 701R on the right side.

In the example in B of FIG. 36, the imaging element 121 is arranged in a region along a forward surface of a headset 702.

In the example in C of FIG. 37, the imaging element 121-1 is arranged near a backward center of a side surface of the housing 701L on the left side, and the imaging element 121-2 is arranged near a backward center of a side surface of the housing 701R on the right side.

In the example in D of FIG. 37, the imaging element 121 is arranged in a region along a backward surface of the headset 702.

As described above, the imaging element 121 can be arranged in an empty space on a surface exposed to the outside in a state in which the headphones 691 are worn by the user, while a growth in size and a deterioration in design are suppressed. Then, for example, an area ahead of or behind the user wearing the headphones 691 can be imaged.

Figure 38:
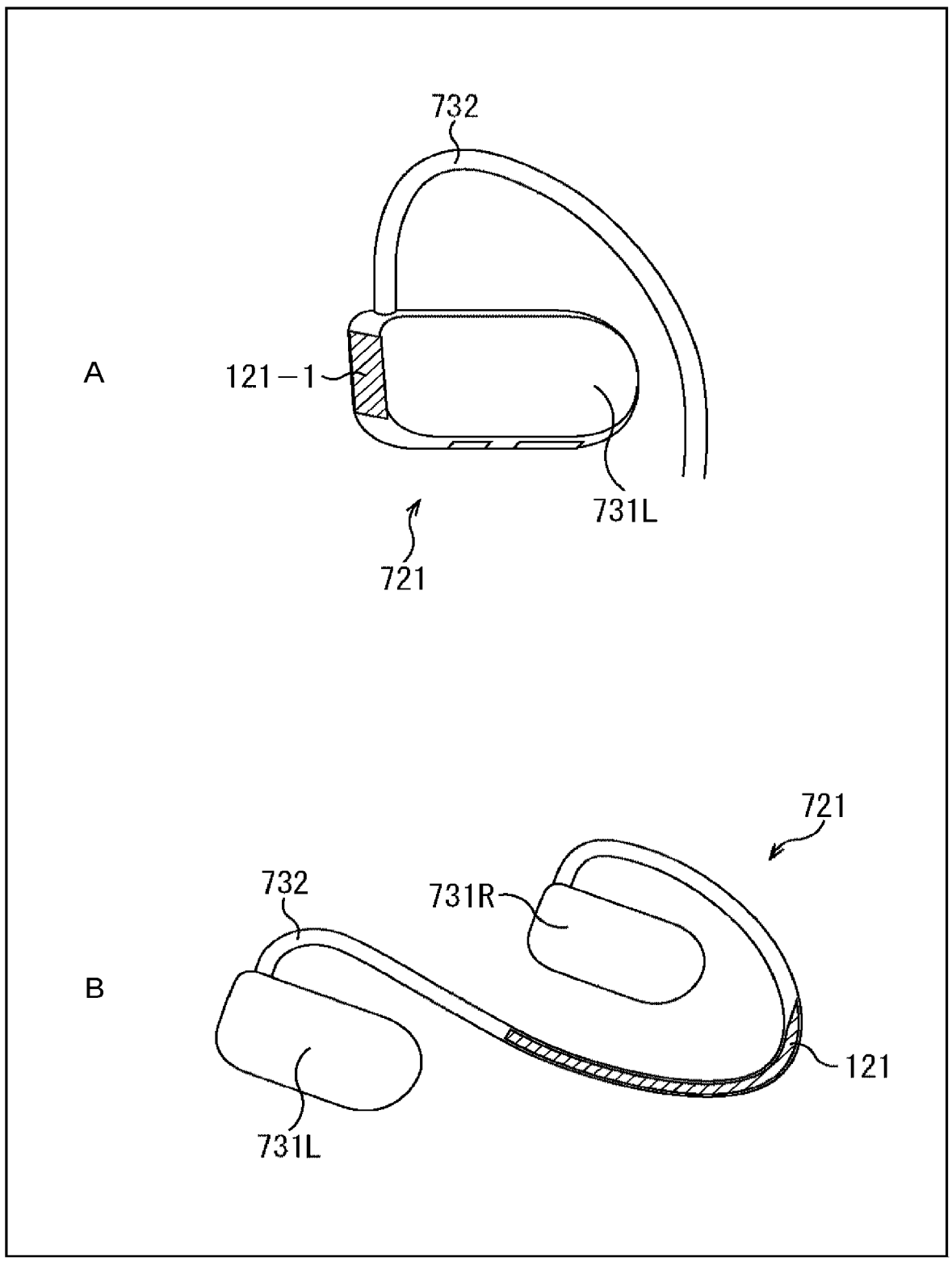
FIG. 38 is a diagram illustrating arrangement examples of imaging elements in neckband headphones.

A and B of FIG. 38 schematically illustrate neckband headphones 721 as an example of the electronic instrument 301.

In the example in A of FIG. 38, the imaging element 121-1 is arranged in a forward portion of a side surface of a housing 731L on the left side. Furthermore, although illustration is omitted, the imaging element 121-2 is arranged in a forward portion of a side surface of a housing 731R on the right side.

In the example in B of FIG. 38, the imaging element 121 is arranged near a backward portion of a neckband 732.

As described above, the imaging element 121 can be arranged in an empty space on a surface exposed to the outside in a state in which the headphones 721 are worn by the user, while a growth in size and a deterioration in design are suppressed. Then, for example, an area ahead of or behind the user wearing the headphones 721 can be imaged.

Note that, in the above examples, an example in which an area ahead of or behind the user is imaged is indicated; however, the respective imaging elements 121 may be installed so as to image other directions around the user (for example, areas on sides of, above, and below the user).

<User Surrounding Imaging Control Process>

Figure 39:
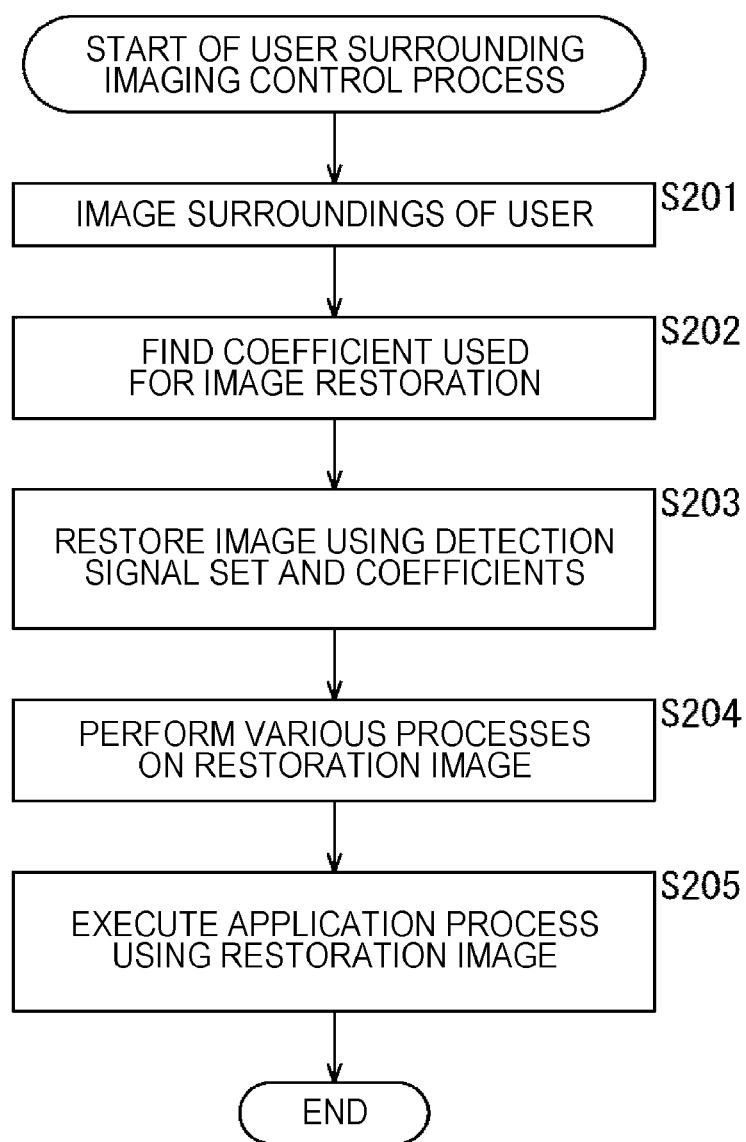
FIG. 39 is a flowchart explaining a user surrounding imaging control process.

Next, a user surrounding imaging control process executed by the electronic instrument 301 will be described with reference to a flowchart in FIG. 39.

In step S201, each imaging element 121 of the electronic instrument 301 images the surroundings of the user by a process similar to the process in step S1 in FIG. 20.

For example, in the case of the wearable device 601 in FIG. 33, an area ahead of the user wearing the wearable device 601 is imaged.

In the case of the camera 631 in FIG. 34, an area in the imaging direction of the camera 631 is imaged.

In the case of the head mounted display 661 in FIG. 35, an area ahead of the user wearing the head mounted display 661 is imaged.

In the case of the headphones 691 in FIGS. 36 and 37, an area ahead of or behind the user wearing the headphones 691 is imaged.

In the case of the headphones 721 in FIG. 38, an area ahead of or behind the user wearing the headphones 721 is imaged.

Each imaging element 121 supplies a detection signal set including a detection signal of each pixel 121a to the association unit 325.

In step S202, the restoration unit 321 finds a coefficient used for image restoration. Specifically, the restoration unit 321 sets the subject distance by the process similar to the process by the restoration unit 122 of the imaging apparatus 101 in step S2 in FIG. 20. Then, the restoration unit 321 reads a coefficient set group in correspondence with the set subject distance from the storage unit 327.

Note that, in a case where the imaging element 121 is arranged in a deformable part like the headset 702 of the headphones 691 in FIGS. 36 and 37 and the neckband 732 of the headphones 721 in FIG. 38, the relative position between the respective pixels 121a changes as the deformation occurs.

Meanwhile, the coefficient set group of simultaneous equations used for restoring the restoration image described above is set on the assumption that the relative position between the respective pixels 121a does not change.

Thus, in a case where the imaging element 121 is arranged in a deformable part of the electronic instrument 301, a coefficient set group according to the deformation status may be prepared in advance, and additionally, the deformation status may be detected such that a coefficient set group according to the detected deformation status is used.

Here, the deformable part is a part that can vary its shape in a case where, for example, the electronic instrument 301 is used or worn. Note that the type of deformation is not particularly limited, and includes, for example, stretching, shrinking, bending, shifting, twisting, separation, and the like. Furthermore, the deformable part includes, for example, a part that is deformed by a force imparted from the outside, and a part that actively varies its shape by an actuator or the like.

For example, a bending sensor may be provided in the headset 702 of the headphones 691 illustrated in FIGS. 36 and 37 such that a coefficient set group corresponding to the bending status of the headset detected by the bending sensor is used.

Figure 40:
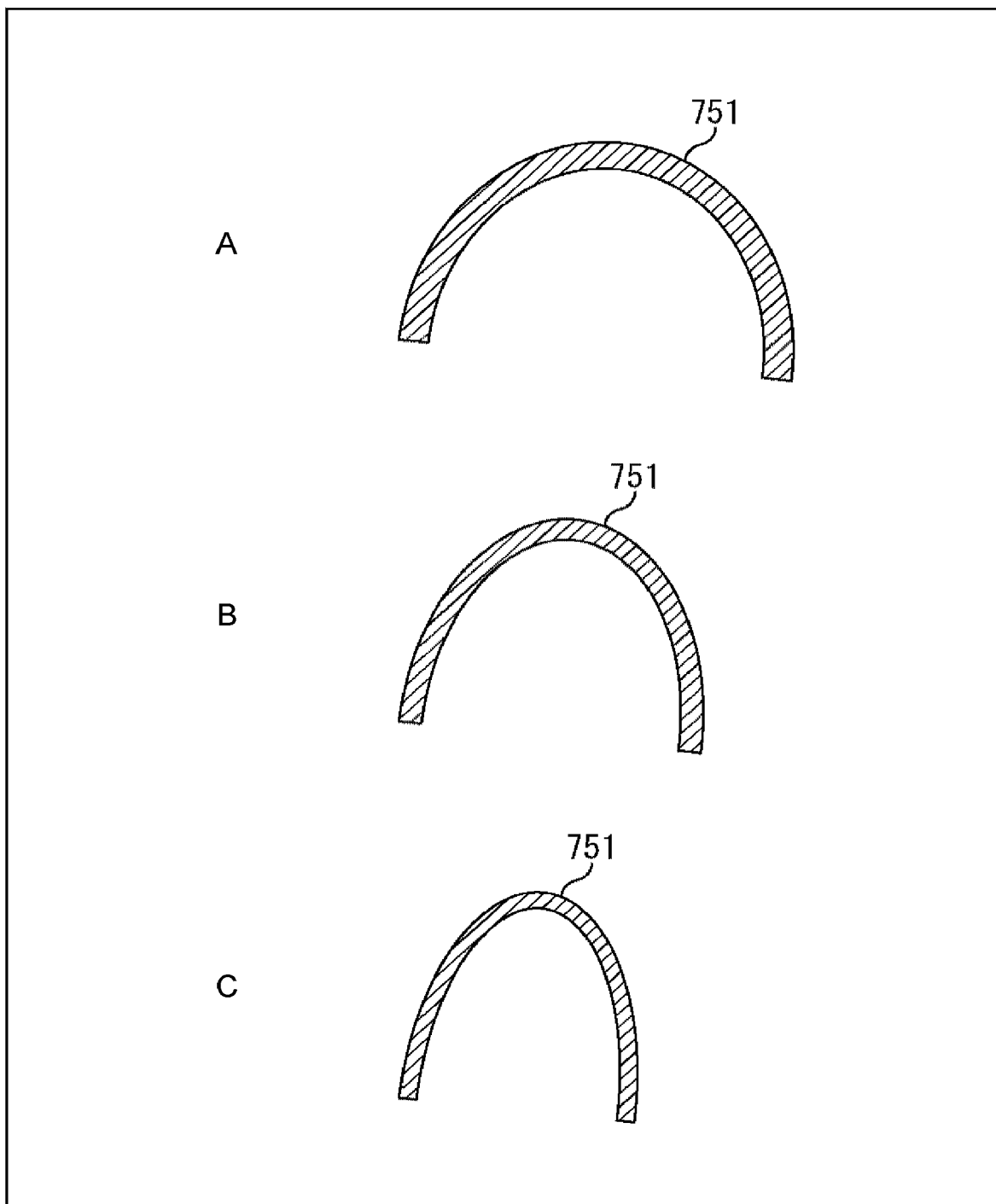
FIG. 40 is a diagram explaining a method of coping with deformation of the shape of the installation position of the imaging element.

For example, coefficient set groups corresponding to three patterns of bending statuses of a bending sensor 751 in A to C of FIG. 40 are prepared in advance. Then, the restoration image is restored using a coefficient set group corresponding to a bending status closest to the detection result of the bending sensor 751 in a case where the user wears the headphones 691.

Figure 32:
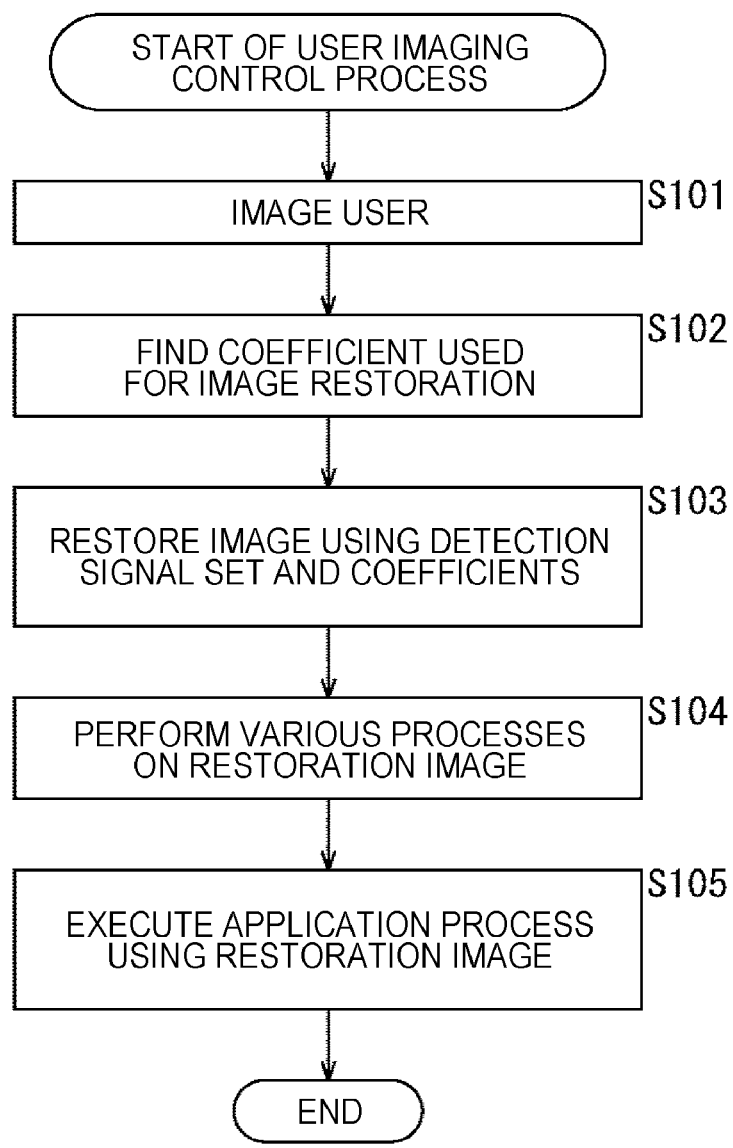
FIG. 32 is a flowchart explaining a user imaging control process.

In step S203, an image is restored using the detection signal set and the coefficients, as in the process in step S103 in FIG. 32.

In step S204, as in the process in step S104 in FIG. 32, various processes are executed on the restoration image.

In step S205, the electronic instrument 301 executes an application process using the restoration image (that is, an image of the surroundings of the user).

For example, in the case of the wearable device 601 in FIG. 33, the control unit 322 performs a recognition process for the surroundings of the user on the basis of the restoration image. Note that an arbitrary method can be used for the recognition process for the surroundings of the user. Then, for example, the control unit 322 controls the output unit 326 to superimpose an image and information corresponding to the environment around the user obtained by the recognition process, onto an area within the field of view visually recognized by the user via the left lens 611L and the right lens 611R, thereby implementing augmented reality (AR).

Alternatively, for example, the control unit 322 controls the recording/playback unit 328 to record the restoration image on the recording medium 329 as a user life log.

For example, in the case of the camera 631 in FIG. 34, the control unit 322 performs subject tracking, scene recognition, and the like by performing the recognition process for the surroundings of the user on the basis of the restoration image. Note that an arbitrary method can be used for the recognition process for the surroundings of the user. Therefore, for example, the subject can be tracked even during the working of a shutter of an imaging element (not illustrated) that performs imaging via a lens 643 of the camera 631. Furthermore, for example, subject tracking and scene recognition can be performed by sensing a range wider than the lens 643.

For example, in the case of the head mounted display 661 in FIG. 35, the control unit 322 controls the output unit 326 to superimpose a part or the whole of the restoration image onto an image that the user is visually recognizing.

For example, in the case of the headphones 691 in FIGS. 36 and 37 or the headphones 721 in FIG. 38, the control unit 322 performs the recognition process for the surroundings of the user on the basis of the restoration image. Note that an arbitrary method can be used for the recognition process for the surroundings of the user. Then, on the basis of the recognition result, the control unit 322 controls the output unit 326 and the like to, for example, assist the user. For example, a danger such as a vehicle coming closer is notified by vibration, sound, or the like in a case where the danger is detected, support by sound and the like is provided for the visually impaired, and the name of a recognized person is notified by sound.

Alternatively, for example, the control unit 322 controls the recording/playback unit 328 to record the restoration image on the recording medium 329 as a user life log.

Thereafter, the user surrounding imaging control process ends.

Note that, in the above, an example in which the restoration image is restored from the detection signal set using the coefficient set group in correspondence with the imaging element 121 and the subject distance has been described; however, as described earlier, for example, a coefficient set group corresponding to the angle of view of the restoration image may be further prepared in addition to a coefficient set group corresponding to the subject distance such that the restoration image is restored using the coefficient set groups corresponding to the subject distance and the angle of view.

By configuring as described above, the imaging element 121 can be arranged while a growth in size and a deterioration in design of the electronic instrument 301 are suppressed, and the surroundings of a user using the electronic instrument can be imaged. Then, the image of the surroundings of the user can be restored, and various application processes can be executed on the basis of the restored image.

Note that, in the above, an example in which the restoration image is recorded as a life log is indicated; however, the detection signal set may be recorded instead of the restoration image such that an image is restored as necessary.

In this case, for example, the detection signal set acquired by each imaging element 121 is associated with metadata corresponding to each detection signal set.

Note that the metadata may or may not include the coefficient set group at the time of restoration, for example. In the latter case, for example, the subject distance, angle of view, deformation information on a part where the imaging element 121 is arranged, and the like used at the time of restoration are included in the metadata.

Furthermore, the method for associating the detection signal set with metadata is not particularly limited as long as the correspondence between the detection signal set and the metadata can be specified. For example, the detection signal set is associated with metadata by adding metadata to data including the detection signal set, giving the same ID to the detection signal set and metadata, or recording the detection signal set and metadata on the same recording medium 329. In addition, metadata may be associated with each detection signal set individually, or metadata may be associated with data in which the detection signal sets are gathered into one piece.

5. Variations

Hereinafter, variations of the above-described embodiments of the present disclosure will be described.

<Variations Relating to Configuration Example of System>

FIG. 26 illustrates an example in which one electronic instrument 301 executes the imaging process for the user or the surroundings of the user, the restoration process for the restoration image, and the application process using the restoration image; however, these processes may be divided and allocated to two or more apparatuses.

Figure 41:
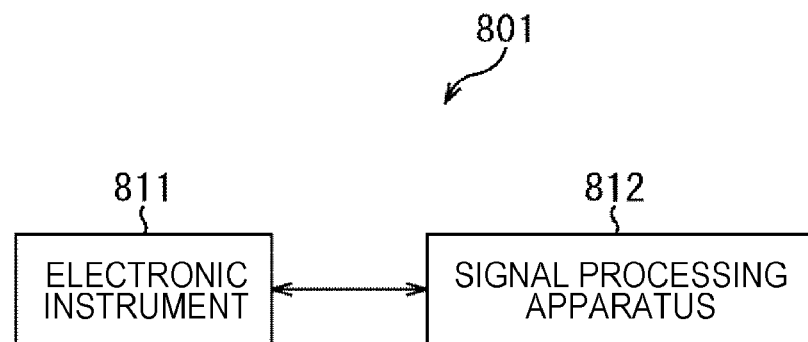
FIG. 41 is a block diagram illustrating a configuration example of an information processing system to which the technology of the present disclosure is applied.

For example, an information processing system 801 in FIG. 41 includes an electronic instrument 811 and a signal processing apparatus 812. Then, the electronic instrument 811 and the signal processing apparatus 812 may perform the imaging process, the restoration process, and the application process by each taking a share thereof.

For example, the electronic instrument 811 may perform the imaging process, and the signal processing apparatus 812 may perform the restoration process and application process. Alternatively, for example, the electronic instrument 811 may perform the imaging process and application process, and the signal processing apparatus 812 may perform the restoration process. Alternatively, the electronic instrument 811 and the signal processing apparatus 812 may perform some processes out of the imaging process, the restoration process, and the application process in coordination.

Furthermore, the present disclosure can be applied to an electronic instrument other than the above-described electronic instruments, having a function of imaging a user or the surroundings of the user. In an electronic instrument having a function of imaging the user, for example, as in the above-described examples, the imaging element 121 is arranged around the eyepiece unit or the display unit. In addition, in an electronic instrument having a function of imaging the surroundings of the user, for example, as in the above-described examples, the imaging element 121 is arranged on a surface exposed to the outside in a state in which the user is wearing the electronic instrument. Note that the arrangement of the imaging element 121 is not limited to the above-described examples, and can be appropriately altered according to the main imaging target and the like.

In addition, for example, the imaging element 121 also can be arranged not around the eyepiece unit or around the display unit of the electronic instrument but in the eyepiece unit or the display unit. For example, the imaging elements 121 can be arranged on front surfaces of the left lens 411L and the right lens 411R in FIG. 27, a front surface of the viewfinder 441 in FIG. 29, front surfaces of the left lens 471L and the right lens 471R in FIG. 30, a front surface of the display 501 in FIG. 31, and the like.

<Variations Relating to Imaging Apparatus and Imaging Element>

Furthermore, for example, the shape of the light shielding film 121b of each pixel 121a can adopt a shape other than the above-described lateral belt type, longitudinal belt type, L-shaped type, or type having a rectangular opening portion.

Moreover, for example, in the imaging element 121 described above with reference to FIG. 5, an example in which four photodiodes 121f in 2 rows×2 columns are provided in one pixel 121a is indicated; however, the number and arrangement of the photodiodes 121f are not limited to this example.

Figure 42:
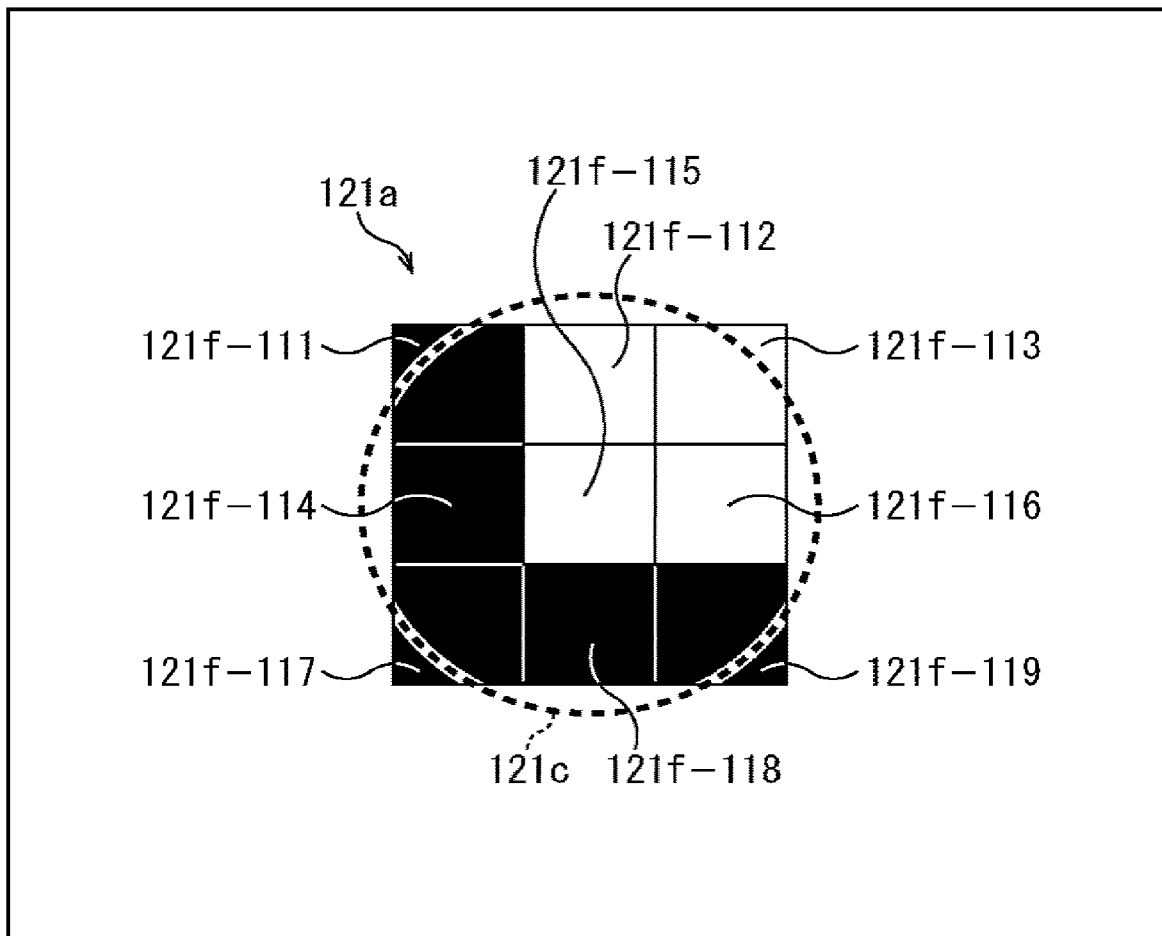
FIG. 42 is a diagram illustrating a variation of the imaging element in FIG. 5.

For example, as illustrated in FIG. 42, nine photodiodes 121f-111 to 121f-119 placed in 3 rows×3 columns may be provided in one pixel 121a for one on-chip lens 121c. That is, one pixel output unit may include nine photodiodes 121f.

Then, for example, by not reading signals from five pixels, namely, the photodiodes 121f-111, 121f-114, 121f-117 to 121f-119, an incident angle characteristic substantially similar to an incident angle characteristic of a pixel 121a including the L-shaped-type light shielding film 121b in which the light shielding film 121b is set in a range of the photodiodes 121f-111, 121f-114, 121f-117 to 121f-119 can be obtained.

By configuring in this manner, an incident angle characteristic similar to a case where the light shielding film 121b is provided can be obtained without providing the light shielding film 121b. Furthermore, by switching the pattern of the photodiodes 121f from which no signal is read, the incident angle directivity can be changed as in a case where the position and range shielded by the light shielding film 121b are varied.

In addition, in the above description, an example in which one pixel output unit is constituted by one pixel 121a is indicated; however, one pixel output unit also can be constituted by a plurality of pixels 121a.

Figure 43:
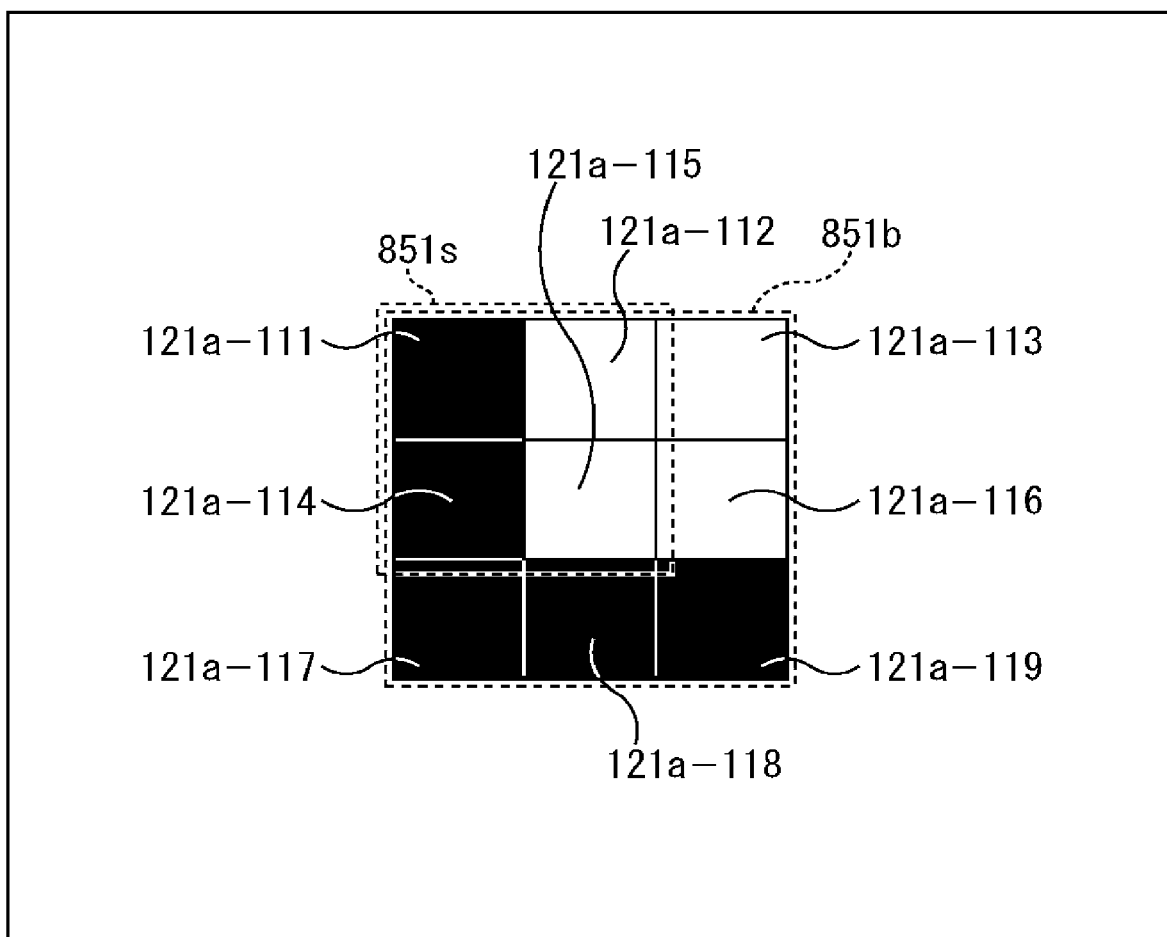
FIG. 43 is a diagram explaining a variation of the pixel output unit.

For example, as illustrated in FIG. 43, one pixel output unit 851b can be constituted by pixels 121a-111 to 121a-119 placed in 3 rows×3 columns. Note that each of the pixels 121a-111 to 121a-119 includes, for example, one photodiode and does not include an on-chip lens.

For example, by adding pixel signals from the respective pixels 121a, a detection signal for one pixel of the detection image is generated, and additionally by stopping the output of pixel signals from some pixels 121a or not adding pixel signals from some pixels 121a, the incident angle directivity of the pixel output unit 851b can be implemented. For example, by adding pixel signals of the pixels 121a-112, 121a-113, and 121a-115, and pixel 121a-116 to generate a detection signal, an incident angle directivity similar to a case where the L-shaped-type light shielding film 121b is provided in the range of the pixels 121a-111, pixel 121a-114, and 121a-117 to 121a-119 can be obtained.

In addition, by switching the pattern of the pixels 121a whose pixel signals are to be added to the detection signal, the incident angle directivity can be set to a different value as in a case where the position and the range shielded by the light shielding film 121b are varied.

Furthermore, in this case, for example, the range of the pixel output unit can be altered by altering the combination of the pixels 121a. For example, a pixel output unit 851s can be constituted by pixels 121a in 2 rows×2 columns including pixels 121a-111, 121a-112, 121a-114, and 121a-115.

Moreover, for example, the range of the pixel output unit can be set later by recording the pixel signals of all the pixels 121a and setting the combination of the pixels 121a later. Besides, by selecting a pixel 121a whose pixel signal to be added to the detection signal, from among the pixels 121a in the set pixel output unit, the incident angle directivity of the pixel output unit can be set later.

Figure 44:
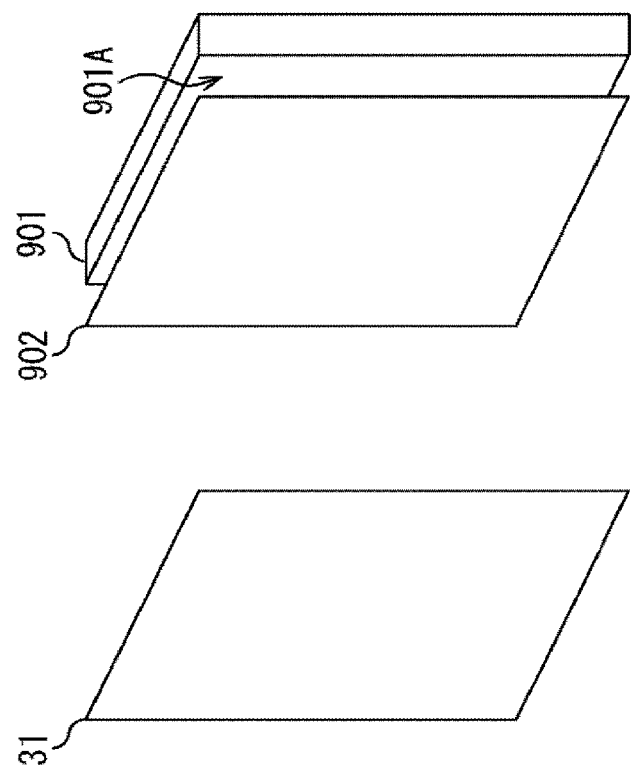
FIG. 44 is a diagram illustrating a variation of the imaging element.

In addition, FIG. 4 illustrates an example in which different incident angle directivities are provided for each pixel by using the light shielding film 121b as a modulation element or altering the combination of photodiodes that contribute to the output; in the present disclosure, however, for example, as illustrated in FIG. 44, an optical filter 902 that covers the light receiving surface of an imaging element 901 also can be used as a modulation element such that each pixel is provided with the incident angle directivity.

Specifically, the optical filter 902 is arranged at a predetermined interval from a light receiving surface 901A of the imaging element 901 so as to cover the entire surface of the light receiving surface 901A. Light from the subject surface 31 is modulated by the optical filter 902 and then is incident on the light receiving surface 901A of the imaging element 901.

Figure 45:
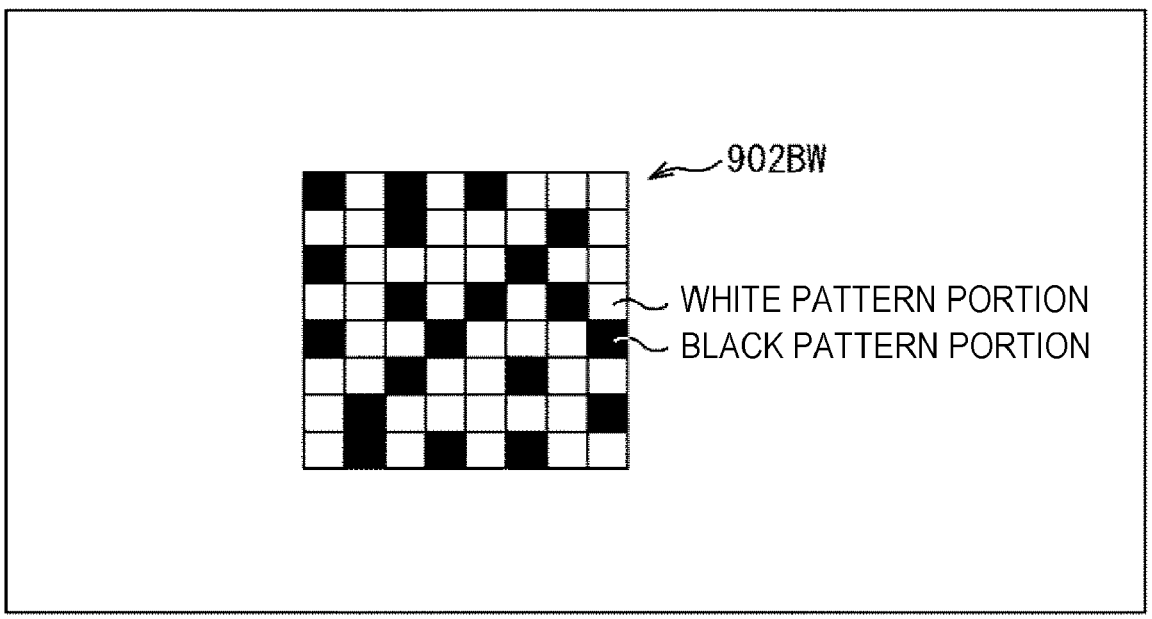
FIG. 45 is a diagram illustrating a variation of the imaging element.

For example, as the optical filter 902, an optical filter 902BW having a grating-like black and white pattern illustrated in FIG. 45 can be used. In the optical filter 902BW, a white pattern portion that transmits light and a black pattern portion that provides shielding from light are randomly arranged. The size of each pattern is set independently of the pixel size of the imaging element 901.

Figure 46:
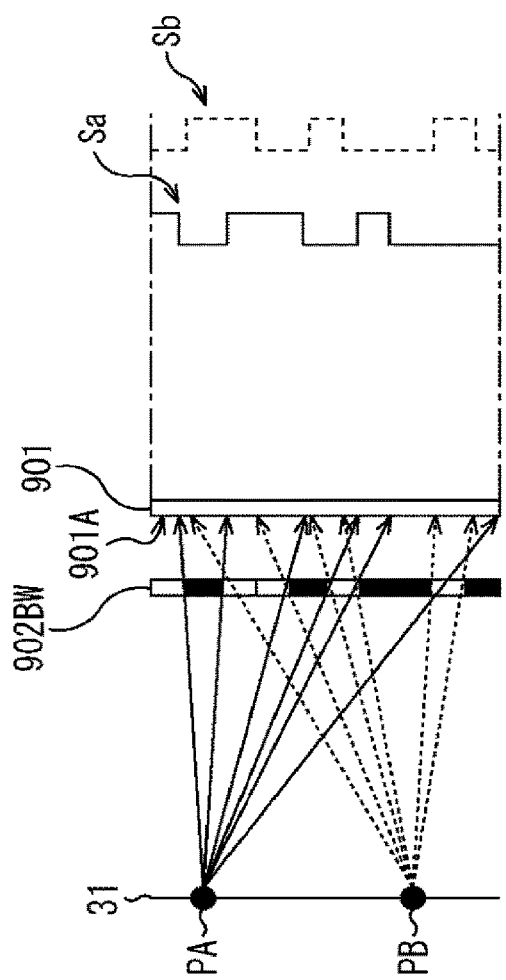
FIG. 46 is a diagram illustrating a variation of the imaging element.

FIG. 46 illustrates the light receiving sensitivity characteristics of the imaging element 901 with respect to light from point light sources PA and PB on the subject surface 31 in a case where the optical filter 902BW is used. Each ray of light from the point light sources PA and PB is modulated by the optical filter 902BW, and then is incident on the light receiving surface 901A of the imaging element 901.

For example, the light receiving sensitivity characteristic of the imaging element 901 with respect to the light from the point light source PA is as a waveform Sa. That is, since a shadow is produced by the black pattern portion of the optical filter 902BW, a shade pattern is produced in a figure on the light receiving surface 901A for the light from the point light source PA. Similarly, the light receiving sensitivity characteristic of the imaging element 901 with respect to the light from the point light source PB is as a waveform Sb. That is, since a shadow is produced by the black pattern portion of the optical filter 902BW, a shade pattern is produced in a figure on the light receiving surface 901A for the light from the point light source PB.

Note that the light from the point light source PA and the light from the point light source PB have different incident angles with respect to each white pattern portion of the optical filter 902BW, such that a shift is produced in a way how a shade pattern appears on the light receiving surface. Accordingly, each pixel of the imaging element 901 is provided with an incident angle directivity with respect to each point light source on the subject surface 31.

Details of this scheme are disclosed, for example, in Non-Patent Document 1 described above.

Figure 47:
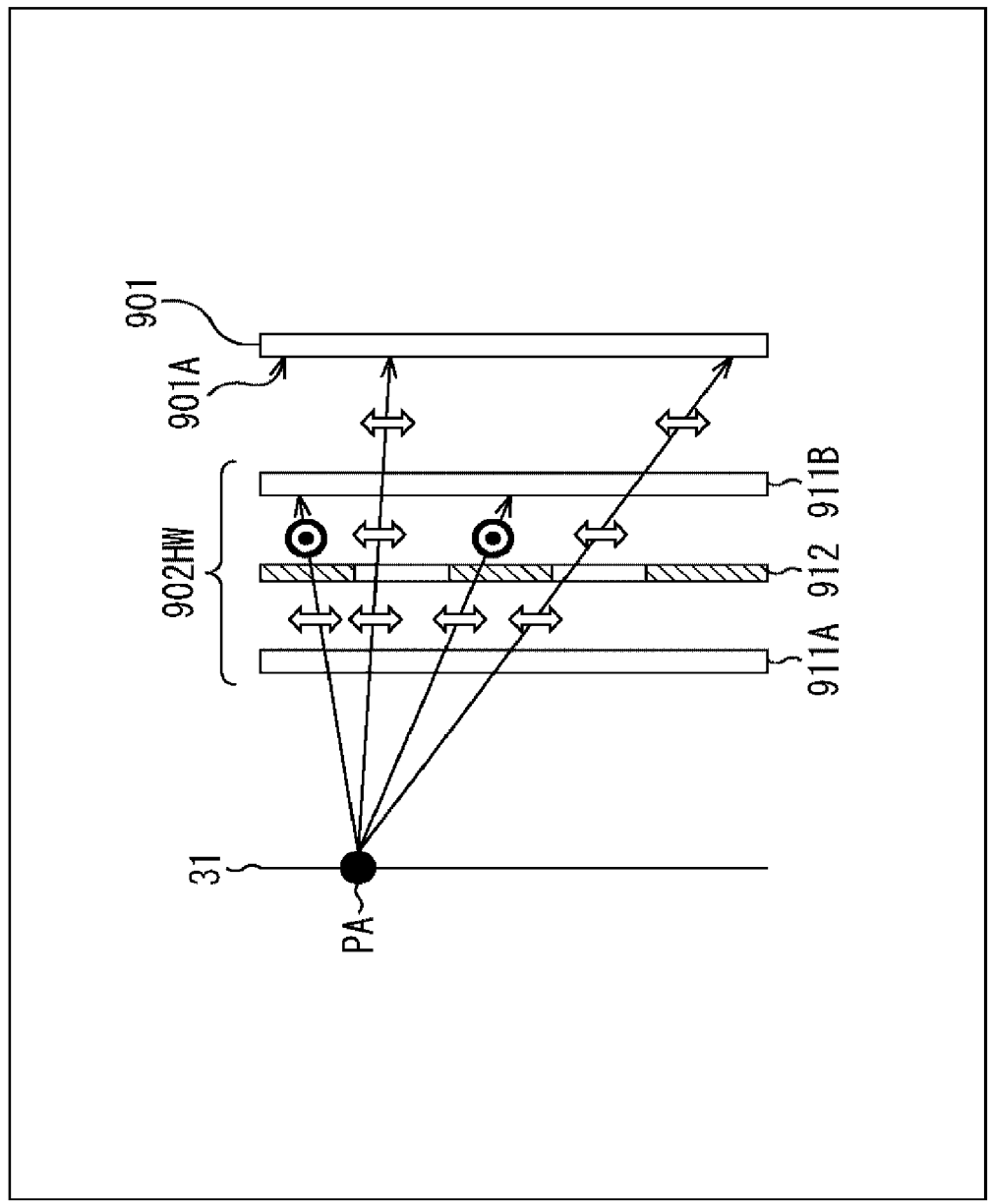
FIG. 47 is a diagram illustrating a variation of the imaging element.

Note that an optical filter 902HW in FIG. 47 may be used instead of the optical filter 902BW. The optical filter 902HW includes a linear polarizing element 911A and a linear polarizing element 911B having equal polarization directions, and a half-wave plate 912, where the half-wave plate 912 is sandwiched between the linear polarizing elements 911A and 911B. The half-wave plate 912 is provided with a polarizing portion indicated by hatching instead of the black pattern portion of the optical filter 902BW, and the white pattern portion and the polarizing portion are randomly arranged.

The linear polarizing element 911A transmits only light in a predetermined polarization direction out of approximately non-polarized light emitted from the point light source PA. Hereinafter, it is assumed that the linear polarizing element 911A transmits only light whose polarization direction is parallel to the drawing. The polarization direction of the polarized light transmitted through the polarizing portion of the half-wave plate 912, out of the polarized light transmitted through the linear polarizing element 911A, is changed in a direction perpendicular to the drawing because the polarization plane is rotated. On the other hand, the polarization direction of the polarized light transmitted through the white pattern portion of the half-wave plate 912, out of the polarized light transmitted through the linear polarizing element 911A, remains unchanged in a direction parallel to the drawing. Then, the linear polarizing element 911B transmits the polarized light that has been transmitted through the white pattern portion, and hardly transmits the polarized light that has been transmitted through the polarizing portion. Accordingly, the light amount of the polarized light transmitted through the polarizing portion is lessened, as compared with the polarized light transmitted through the white pattern portion. Therefore, a shade pattern approximately similar to a case where the optical filter BW is used is produced on the light receiving surface 901A of the imaging element 901.

Figure 48:
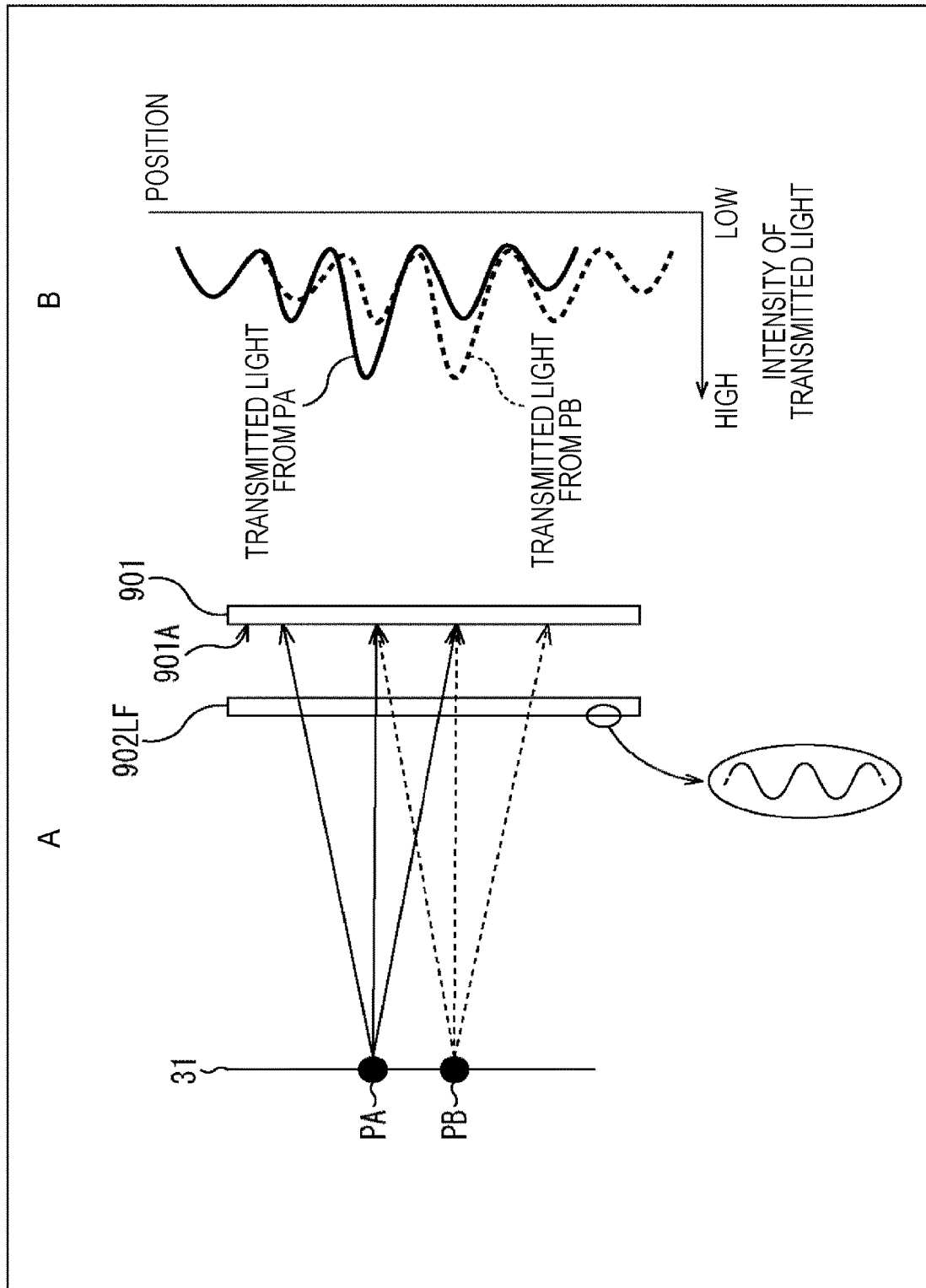
FIG. 48 is a diagram illustrating a variation of the imaging element.

Furthermore, as illustrated in A of FIG. 48, an optical interference mask can be used as an optical filter 902LF. The light receiving surface 901A of the imaging element 901 is irradiated with light emitted from the point light sources PA and PB on the subject surface 31 via the optical filter 902LF. As illustrated in the enlarged view on a lower side of A of FIG. 48, for example, a light incident surface of the optical filter 902LF is provided with irregularities to an extent equivalent to the wavelength. In addition, the optical filter 902LF maximizes the transmission of light having a specific wavelength radiated from a perpendicular direction. When a change in the incident angle (tilt with respect to the perpendicular direction) of light having a specific wavelength emitted from the point light sources PA and PB on the subject surface 31 with respect to the optical filter 902LF increases, the optical path length changes. Here, when the optical path length is an odd multiple of the half wavelength, the light is weakened with each other, and when the optical path length is an even multiple of the half wavelength, the light is intensified with each other. That is, the intensity of the transmitted light having a specific wavelength that has been emitted from the point light sources PA and PB and transmitted through the optical filter 902LF is modulated according to the incident angle with respect to the optical filter 902LF, as illustrated in B of FIG. 48, and is incident on the light receiving surface 901A of the imaging element 901. Accordingly, the detection signal output from each pixel output unit of the imaging element 901 is given as a signal obtained by merging the modulated light intensities of respective point light sources for each pixel output unit.

Details of this scheme are disclosed, for example, in Patent Document 1 described above.

Note that, in the schemes of Patent Document 1 and Non-Patent Document 1, the incident angle directivity cannot be set independently in units of pixels 121a without affecting adjacent pixels, like the imaging element 121 using the pixel 121a in FIG. 4 or the pixel 121a in FIG. 5 described above. Accordingly, for example, when the pattern of the optical filter 902BW or the pattern of the diffraction grating of the optical filter 902LF is made different, the incident angle directivities of at least a plurality of adjacent pixels of the imaging element 901 are in turn made different together with each other. Furthermore, the pixels 121a located at close positions have incident angle directivities close to each other.

In addition, the present disclosure can also be applied to an imaging apparatus or an imaging element that images light of a wavelength other than visible light, such as infrared light. In this case, the restoration image is not given as an image in which the user can recognize the subject by viewing but an image in which the user cannot visually recognize the subject. Note that, since it is difficult for a normal imaging lens to transmit far-infrared light, the present technology is effective in a case where far-infrared light is imaged, for example.

<Other Variations>

In the above description, an example in which biometric authentication is performed on the basis of an image obtained by imaging the face or eye of the user is indicated; however, the present disclosure can also be applied to a case where biometric authentication is performed on the basis of an image obtained by imaging other parts of the user, such as fingerprint authentication.

Furthermore, the present disclosure can also be applied to a case where the movement or state or the like of the user's eye other than the user's line of sight is detected. For example, the present disclosure can be applied to a case where blink detection, sleep detection, or the like is performed on the basis of an image obtained by imaging the user's eye or face. Moreover, for example, the present disclosure can also be applied to a case where wearing or the like of the electronic instrument 301 such as a wearable device is detected.

In addition, for example, by applying machine learning such as deep learning, it is also possible to perform image recognition or the like using the detection image and detection signal set before restoration without using the restoration image after restoration.

6. Application Examples

The technology according to the present disclosure can be applied to a variety of products. For example, the technology according to the present disclosure can be applied to an imaging unit of a medical instrument such as an endoscopic surgery system or a capsular endoscope.

Figure 49:
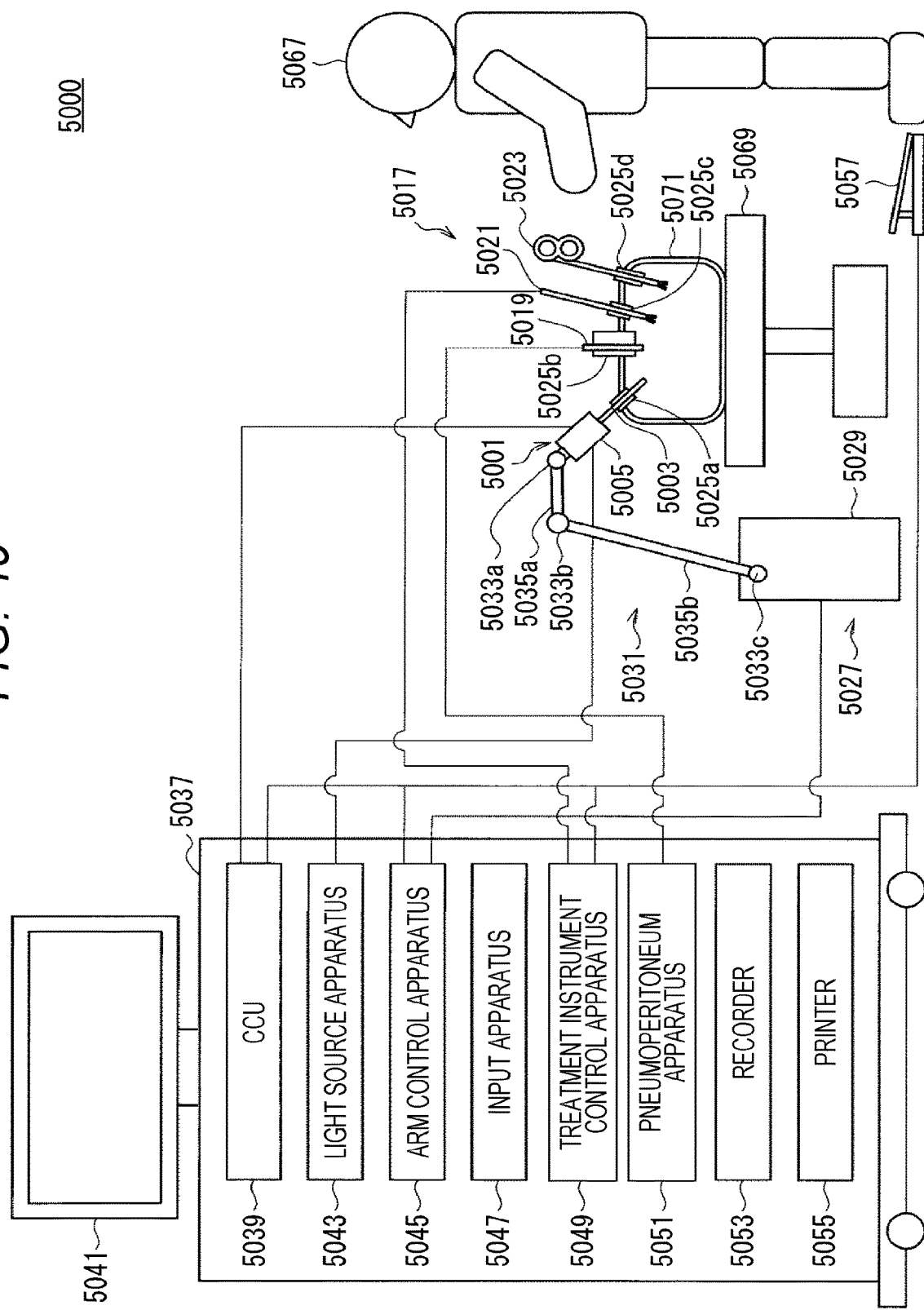
FIG. 49 is a diagram illustrating an example of an outline of the configuration of an endoscopic surgery system.

FIG. 49 is a diagram illustrating an example of an outline of the configuration of an endoscopic surgery system 5000 to which the technology according to the present disclosure can be applied. FIG. 49 illustrates a scene in which an operating surgeon (surgeon) 5067 is performing a surgery on a patient 5071 on a patient bed 5069 using the endoscopic surgery system 5000. As illustrated in FIG. 49, the endoscopic surgery system 5000 is constituted by an endoscope 5001, other surgical tools 5017, a support arm apparatus 5027 supporting the endoscope 5001, and a cart 5037 in which various apparatuses for surgery through the endoscope are equipped.

In endoscopic surgery, instead of cutting the abdominal wall and opening the abdomen, a plurality of cylindrical puncture tools called trocars 5025a to 5025d is punctured into the abdominal wall. Then, a lens barrel 5003 of the endoscope 5001 and other surgical tools 5017 are inserted into the body cavity of the patient 5071 through the trocars 5025a to 5025d. In the illustrated example, a pneumoperitoneum tube 5019, an energy treatment instrument 5021, and a forceps 5023 are inserted into the body cavity of the patient 5071 as the other surgical tools 5017. Furthermore, the energy treatment instrument 5021 is a treatment instrument that performs incision and detachment of tissue, sealing of a blood vessel, and the like by high-frequency current or ultrasonic vibration. However, the illustrated surgical tools 5017 are merely an example and various surgical tools generally used for surgery through the endoscope, such as a thumb forceps and a retractor, can be used as the surgical tools 5017, for example.

The image of the surgical site in the body cavity of the patient 5071 captured by the endoscope 5001 is displayed on a display apparatus 5041. The operating surgeon 5067 performs treatment such as cutting off the affected part, for example, using the energy treatment instrument 5021 and the forceps 5023 while viewing the image of the surgical site displayed on the display apparatus 5041 in real time. Note that, although illustration is omitted, the pneumoperitoneum tube 5019, the energy treatment instrument 5021, and the forceps 5023 are supported by the operating surgeon 5067 or an assistant or the like during surgery.

(Support Arm Apparatus)

The support arm apparatus 5027 includes an arm portion 5031 extending from a base portion 5029. In the illustrated example, the arm portion 5031 is constituted by joint portions 5033a, 5033b, and 5033c, and links 5035a and 5035b and is driven under the control of an arm control apparatus 5045. The endoscope 5001 is supported by the arm portion 5031 such that the position and orientation of the endoscope 5001 are controlled. With this configuration, fixing of the position of the endoscope 5001 can be implemented in a stable manner.

(Endoscope)

The endoscope 5001 is constituted by the lens barrel 5003 of which a region of a predetermined length from the distal end is inserted into the body cavity of the patient 5071, and a camera head 5005 connected to the proximal end of the lens barrel 5003. In the illustrated example, the endoscope 5001 configured as a so-called rigid endoscope having the rigid lens barrel 5003 is illustrated; however, the endoscope 5001 may be configured as a so-called flexible endoscope having the flexible lens barrel 5003.

An opening portion into which an objective lens is fitted is provided at the distal end of the lens barrel 5003. A light source apparatus 5043 is connected to the endoscope 5001; light generated by this light source apparatus 5043 is guided to the distal end of the lens barrel 5003 by a light guide provided extending inside this lens barrel, and is radiated toward an object to be observed in the body cavity of the patient 5071 via the objective lens. Note that the endoscope 5001 may be a forward-viewing endoscope, an oblique-viewing endoscope, or a side-viewing endoscope.

An optical system and an imaging element are provided inside the camera head 5005 and reflected light (observation light) from the object to be observed is converged on this imaging element by this optical system. The observation light is photoelectrically converted by the imaging element and an electrical signal corresponding to the observation light, that is, an image signal corresponding to the observation image is generated. This image signal is transmitted as RAW data to a camera control unit (CCU) 5039. Note that the camera head 5005 is equipped with a function of adjusting the magnification and focal length by appropriately driving the optical system thereof.

In addition, for example, in order to cope with stereoscopic viewing (three-dimensional (3D) display) or the like, a plurality of imaging elements may be provided in the camera head 5005. In this case, a plurality of relay optical systems is provided inside the lens barrel 5003 in order to guide the observation light to each of the plurality of imaging elements.

(Various Apparatuses Equipped in Cart)

The CCU 5039 is constituted by a central processing unit (CPU), graphics processing unit (GPU), or the like and comprehensively controls working of the endoscope 5001 and the display apparatus 5041. Specifically, the CCU 5039 carries out various image processes for displaying an image based on the image signal accepted from the camera head 5005, such as a developing process (demosaic process), on the accepted image signal, for example. The CCU 5039 provides the image signal on which these image processes have been carried out to the display apparatus 5041. Furthermore, the CCU 5039 transmits a control signal to the camera head 5005 and controls driving of the camera head 5005. This control signal can include information regarding imaging conditions such as magnification and focal length.

The display apparatus 5041 displays an image based on the image signal on which the image processes have been carried out by the CCU 5039, under the control of the CCU 5039. In a case where the endoscope 5001 is compatible with high resolution capturing such as 4K capturing (the number of horizontal pixels 3840×the number of vertical pixels 2160), or 8K capturing (the number of horizontal pixels 7680×the number of vertical pixels 4320), and/or is compatible with 3D display, a display apparatus capable of high resolution display and/or capable of 3D display can be used as the display apparatus 5041 so as to cope with each case, for example. In a case where the endoscope 5001 is compatible with high resolution capturing such as 4K or 8K capturing, a more immersive feeling can be obtained by using a display apparatus 5041 having a size of 55 inches or more. Furthermore, a plurality of display apparatuses 5041 with different resolutions and sizes may be provided depending on the practical usage.

The light source apparatus 5043 is constituted by a light source such as a light emitting diode (LED) and the like and supplies irradiation light used when the surgical site is captured to the endoscope 5001.

The arm control apparatus 5045 is constituted, for example, by a processor such as a CPU and works in accordance with a predetermined program to control driving of the arm portion 5031 of the support arm apparatus 5027 in accordance with a predetermined control scheme.

The input apparatus 5047 is an input interface to the endoscopic surgery system 5000. The user can input various types of information and input instructions to the endoscopic surgery system 5000 via the input apparatus 5047. For example, the user inputs various types of information regarding surgery, such as body information of the patient and information about the surgical procedure of the surgery, via the input apparatus 5047. Furthermore, for example, the user inputs an instruction to drive the arm portion 5031, an instruction to alter the imaging conditions (the type of irradiation light, the magnification, the focal length, and the like) for the endoscope 5001, an instruction to drive the energy treatment instrument 5021, and the like via the input apparatus 5047.

The type of the input apparatus 5047 is not limited and the input apparatus 5047 can be various known input apparatuses. For example, a mouse, a keyboard, a touch panel, a switch, a foot switch 5057, a lever, and/or the like, can be applied as the input apparatus 5047. In a case where a touch panel is used as the input apparatus 5047, the touch panel may be provided on the display surface of the display apparatus 5041.

Alternatively, the input apparatus 5047 is, for example, a device worn by the user, such as a glasses-type wearable device or a head mounted display (HMD), and various inputs are made according to the gesture and the line of sight of the user detected by these devices. Furthermore, the input apparatus 5047 includes a camera capable of detecting the movement of the user and various inputs are made according to the gesture and the line of sight of the user detected from a moving picture captured by the camera. Moreover, the input apparatus 5047 includes a microphone capable of picking up the voice of the user and various inputs are made by sound via the microphone. In this manner, by configuring the input apparatus 5047 so as to be able to input various types of information in a non-contact manner, particularly a user (for example, the operating surgeon 5067) belonging to a clean area is allowed to operate an instrument belonging to a non-clean area in a non-contact manner. In addition, since the user can operate the instrument without releasing his/her hand from the holding surgical tool, the user's convenience is improved.

A treatment instrument control apparatus 5049 controls driving of the energy treatment instrument 5021 for cauterization and incision of tissue, sealing of a blood vessel, or the like. For the purpose of securing a field of view through the endoscope 5001 and securing a working space for the operating surgeon, a pneumoperitoneum apparatus 5051 delivers a gas into the body cavity of the patient 5071 via the pneumoperitoneum tube 5019 in order to inflate the body cavity. A recorder 5053 is an apparatus capable of recording various types of information regarding surgery. A printer 5055 is an apparatus capable of printing various types of information regarding surgery in various formats such as text, image, or graph.

Hereinafter, a particularly characteristic configuration of the endoscopic surgery system 5000 will be described in more detail.

(Support Arm Apparatus)

The support arm apparatus 5027 includes the base portion 5029 as a pedestal and the arm portion 5031 extending from the base portion 5029. In the illustrated example, the arm portion 5031 is constituted by the plurality of joint portions 5033*a*, 5033*b*, and 5033*c*, and the plurality of links 5035*a* and 5035*b* coupled by the joint portion 5033*b*; in FIG. 49, however, for the sake of simplicity, the configuration of the arm portion 5031 is illustrated in a simplified manner. Actually, the shapes, the number, and the arrangement of the joint portions 5033*a* to 5033*c* and the links 5035*a* and 5035*b*, as well as the directions of the rotation axes of the joint portions 5033*a* to 5033*c*, and the like can be appropriately set such that the arm portion 5031 has a desired degree of freedom. For example, the arm portion 5031 can be suitably configured so as to have degrees of freedom equal to or greater than six degrees of freedom. This allows the endoscope 5001 to freely move within the movable range of the arm portion 5031, such that the lens barrel 5003 of the endoscope 5001 can be inserted into the body cavity of the patient 5071 in a desired direction.

Actuators are provided in the joint portions 5033*a* to 5033*c* and the joint portions 5033*a* to 5033*c* are configured so as to be rotatable around predetermined rotation axes by driving of these actuators. Driving of the actuators is controlled by the arm control apparatus 5045, such that the rotation angle of each of the joint portions 5033*a* to 5033*c* is controlled and then driving of the arm portion 5031 is controlled. With this configuration, the control of the position and orientation of the endoscope 5001 can be implemented. At this time, the arm control apparatus 5045 can control driving of the arm portion 5031 by various known control schemes such as force control or position control.

For example, the position and orientation of the endoscope 5001 can be controlled in such a manner that the operating surgeon 5067 appropriately makes an operation input via the input apparatus 5047 (including the foot switch 5057) and in turn the arm control apparatus 5045 appropriately controls driving of the arm portion 5031 according to the operation input. With this control, the endoscope 5001 at the distal end of the arm portion 5031 can be moved from an arbitrary position to another arbitrary position and thereafter can be fixedly supported at that position after the movement. Note that the arm portion 5031 may be operated by a so-called master slave scheme. In this case, the arm portion 5031 can be remotely operated by the user via the input apparatus 5047 installed at a place away from the surgery room.

Furthermore, in a case where the force control is applied, the arm control apparatus 5045 may perform so-called power assist control in which the actuators of the respective joint portions 5033*a* to 5033*c* are driven in response to an external force from the user such that the arm portion 5031 moves smoothly in proportion to the external force. With this control, when the user moves the arm portion 5031 while directly touching the arm portion 5031, the arm portion 5031 can be moved with a relatively light force. Accordingly, it becomes possible to more intuitively move the endoscope 5001 with a simpler operation and user's convenience can be improved.

Here, in general surgery through the endoscope, the endoscope 5001 has been supported by a surgeon called a scopist. In contrast to this, using the support arm apparatus 5027 makes it possible to reliably fix the position of the endoscope 5001 without manual operation, such that the image of the surgical site can be stably obtained and surgery can be performed smoothly.

Note that the arm control apparatus 5045 is not necessarily provided in the cart 5037. Furthermore, the arm control apparatus 5045 is not necessarily one apparatus. For example, the arm control apparatus 5045 may be provided in each of the joint portions 5033a to 5033c of the arm portion 5031 of the support arm apparatus 5027 such that control of driving of the arm portion 5031 is implemented by the plurality of arm control apparatuses 5045 collaborating with each other.

(Light Source Apparatus)

The light source apparatus 5043 supplies the endoscope 5001 with irradiation light when the surgical site is captured. The light source apparatus 5043 is constituted by, for example, an LED, a laser light source, or a white light source constituted by a combination thereof. At this time, in a case where the white light source is configured by a combination of RGB laser light sources, the output intensity and the output timing of each color (each wavelength) can be controlled with high accuracy and accordingly the white balance of the captured image can be adjusted in the light source apparatus 5043. Furthermore, in this case, by irradiating an object to be observed with a laser beam from each of the RGB laser light sources by time sharing and controlling driving of the imaging element of the camera head 5005 in synchronization with the irradiation timing, it is also possible to capture an image corresponding to each of RGB by time sharing. According to this method, a color image can be obtained without providing a color filter in the imaging element.

In addition, driving of the light source apparatus 5043 may be controlled such that the intensity of light to be output is altered for every predetermined time span. By controlling driving of the imaging element of the camera head 5005 in synchronization with the timing of the alteration of the intensity of light to acquire images by time sharing and merging these images, an image of a high dynamic range without so-called blocked up shadows and blown out highlights can be generated.

Furthermore, the light source apparatus 5043 may be configured such that light of a predetermined wavelength band compatible with special light observation can be supplied from the light source apparatus 5043. In the special light observation, for example, by utilizing the wavelength dependence of light absorption in body tissue, so-called narrow band light observation (narrow band imaging) is performed in which, by radiating narrow band light compared with the irradiation light at the time of ordinary observation (in other words, white light), predetermined tissue such as a blood vessel at a mucosal surface layer is captured with high contrast. Alternatively, in the special light observation, fluorescence observation for obtaining an image by fluorescence generated by radiating excitation light may be performed. In the fluorescence observation, for example, fluorescence observation in which body tissue is irradiated with excitation light and fluorescence from the body tissue is observed (autofluorescence observation), or fluorescence observation in which a reagent such as indocyanine green (ICG) is locally administered to body tissue and at the same time, the body tissue is irradiated with excitation light corresponding to a fluorescence wavelength of the reagent to obtain a fluorescent image can be performed. The light source apparatus 5043 can be configured such that narrow band light and/or excitation light compatible with such special light observation can be supplied from the light source apparatus 5043.

(Camera Head and CCU)

Figure 50:
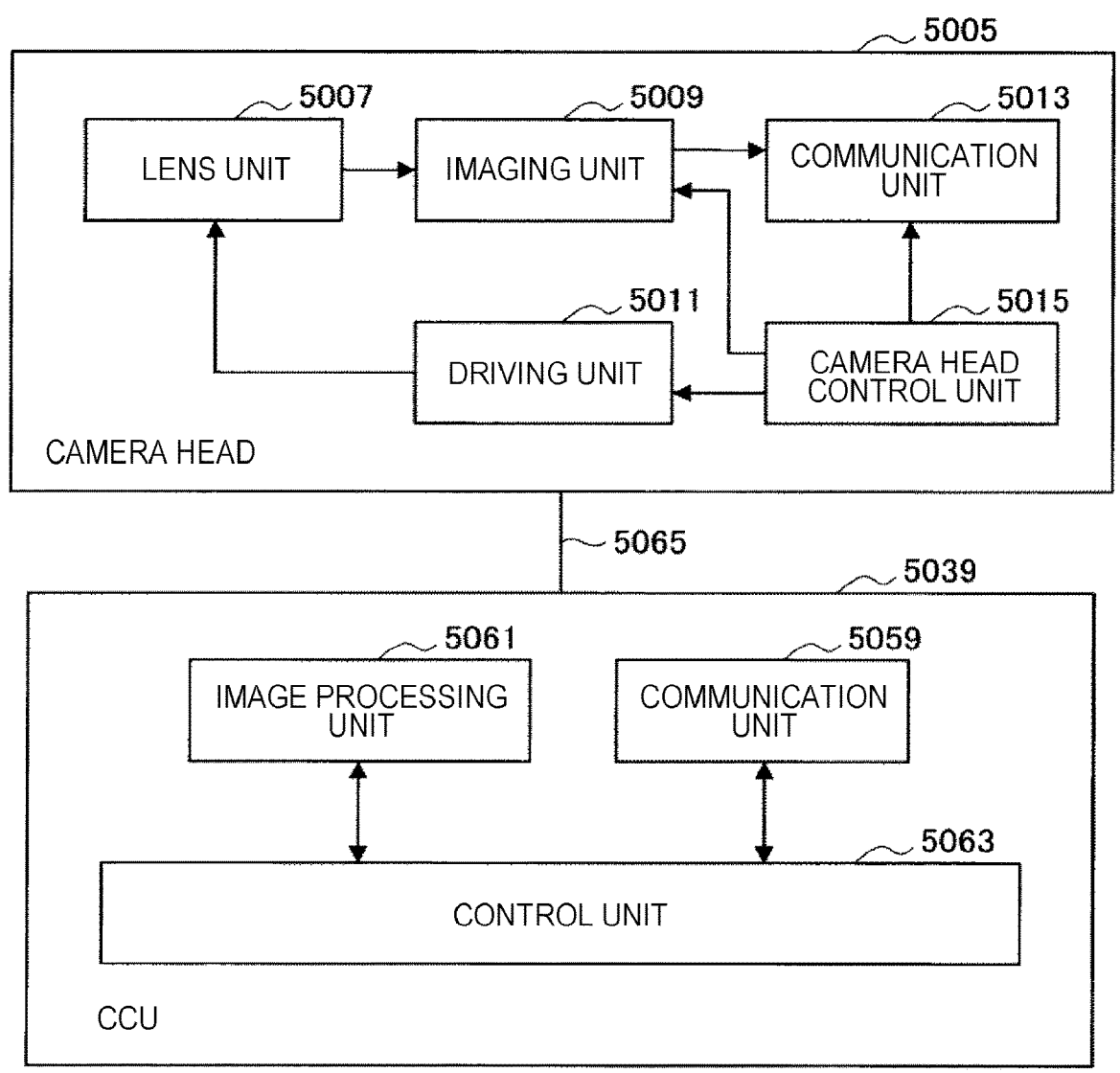
FIG. 50 is a block diagram illustrating an example of functional configurations of a camera head and CCU illustrated in FIG. 49.

Referring to FIG. 50, functions of the camera head 5005 and the CCU 5039 of the endoscope 5001 will be described in more detail. FIG. 50 is a block diagram illustrating an example of functional configurations of the camera head 5005 and the CCU 5039 illustrated in FIG. 49.

Referring to FIG. 50, the camera head 5005 has a lens unit 5007, an imaging unit 5009, a driving unit 5011, a communication unit 5013, and a camera head control unit 5015 as functions thereof. Furthermore, the CCU 5039 has a communication unit 5059, an image processing unit 5061, and a control unit 5063 as functions thereof. The camera head 5005 and the CCU 5039 are connected via a transmission cable 5065 so as to be able to communicate bidirectionally.

First, the functional configuration of the camera head 5005 will be described. The lens unit 5007 is an optical system provided at a connecting portion with the lens barrel 5003. The observation light taken in from the distal end of the lens barrel 5003 is guided to the camera head 5005 and is incident on the lens unit 5007. The lens unit 5007 is constituted by combining a plurality of lenses including a zoom lens and a focus lens. The optical characteristics of the lens unit 5007 are adjusted so as to converge the observation light on a light receiving surface of the imaging element of the imaging unit 5009. Furthermore, the zoom lens and the focus lens are configured such that their positions on an optical axis can move in order to adjust the magnification and focus of the captured image.

The imaging unit 5009 is constituted by the imaging element and is arranged at a succeeding stage of the lens unit 5007. The observation light having passed through the lens unit 5007 is converged on the light receiving surface of the imaging element and an image signal corresponding to the observation image is generated by photoelectric conversion. The image signal generated by the imaging unit 5009 is provided to the communication unit 5013.

For example, an image sensor of the complementary metal oxide semiconductor (CMOS) type capable of capturing a color image having a Bayer array is used as the imaging element constituting the imaging unit 5009. Note that, for example, an imaging element capable of coping with capturing of a high resolution image of 4K or more may be used as the imaging element. Since the image of the surgical site is obtained with high resolution, the operating surgeon 5067 can grasp how the surgical site is in more detail and can progress the surgery more smoothly.

Furthermore, the imaging element constituting the imaging unit 5009 is configured such that the imaging element constituting the imaging unit 5009 has a pair of imaging elements for separately acquiring image signals for right eye and left eye compatible with the 3D display. Owing to that the 3D display is performed, the operating surgeon 5067 can more precisely grasp the depth of the living tissue in the surgical site. Note that, in a case where the imaging unit 5009 is configured as a multi-plate type, the lens units 5007 are also provided as a plurality of systems corresponding to respective imaging elements.

Furthermore, the imaging unit 5009 is not necessarily provided in the camera head 5005. For example, the imaging unit 5009 may be provided inside the lens barrel 5003 immediately behind the objective lens.

The driving unit 5011 is constituted by an actuator and moves the zoom lens and the focus lens of the lens unit 5007 by a predetermined distance along the optical axis under the control of the camera head control unit 5015. With this movement, the magnification and the focus of the captured image by the imaging unit 5009 can be appropriately adjusted.

The communication unit 5013 is constituted by a communication apparatus for transmitting and receiving various types of information to and from the CCU 5039. The communication unit 5013 transmits the image signal obtained from the imaging unit 5009 as RAW data to the CCU 5039 via the transmission cable 5065. At this time, in order to display the captured image of the surgical site with low latency, it is preferred that the image signal be transmitted by optical communication. This is because the operating surgeon 5067 performs surgery while observing the state of the affected part with the captured image and thus, for more safe and reliable surgery, the moving image of the surgical site is required to be displayed in real time as much as possible during surgery. In a case where optical communication is performed, a photoelectric conversion module that converts the electrical signal into an optical signal is provided in the communication unit 5013. The image signal is converted into an optical signal by the photoelectric conversion module and then transmitted to the CCU 5039 via the transmission cable 5065.

Furthermore, the communication unit 5013 receives the control signal for controlling driving of the camera head 5005 from the CCU 5039. This control signal includes, for example, information regarding imaging conditions, such as information to designate a frame rate of the captured image, information to designate an exposure value at the time of imaging, and/or information to designate the magnification and focus of the captured image. The communication unit 5013 provides the received control signal to the camera head control unit 5015. Note that the control signal from the CCU 5039 may also be transmitted by optical communication. In this case, the communication unit 5013 is provided with a photoelectric conversion module that converts the optical signal into an electrical signal; the control signal is converted into an electrical signal by this photoelectric conversion module and then provided to the camera head control unit 5015.

Note that the above-mentioned imaging conditions such as the frame rate, exposure value, magnification, and focus are automatically set by the control unit 5063 of the CCU 5039 on the basis of the acquired image signal. In other words, so-called auto exposure (AE) function, auto focus (AF) function, and auto white balance (AWB) function are equipped in the endoscope 5001.

The camera head control unit 5015 controls driving of the camera head 5005 on the basis of the control signal received from the CCU 5039 via the communication unit 5013. For example, the camera head control unit 5015 controls driving of the imaging element of the imaging unit 5009 on the basis of information to designate the frame rate of the captured image and/or information to designate exposure at the time of imaging. Furthermore, for example, the camera head control unit 5015 appropriately moves the zoom lens and the focus lens of the lens unit 5007 via the driving unit 5011 on the basis of information to designate the magnification and focus of the captured image. The camera head control unit 5015 may further include a function of storing information for identifying the lens barrel 5003 and the camera head 5005.

Note that, by arranging constituents such as the lens unit 5007 and the imaging unit 5009 in a hermetically sealed structure having high airtightness and waterproofness, the camera head 5005 is enabled to have resistance to an autoclave sterilization process.

Next, the functional configuration of the CCU 5039 will be described. The communication unit 5059 is constituted by a communication apparatus for transmitting and receiving various types of information to and from the camera head 5005. The communication unit 5059 receives the image signal transmitted from the camera head 5005 via the transmission cable 5065. At this time, as described above, the image signal can be suitably transmitted by optical communication. In this case, a photoelectric conversion module that converts the optical signal into an electrical signal is provided in the communication unit 5059 so as to be compatible with the optical communication. The communication unit 5059 provides the image signal converted into the electrical signal to the image processing unit 5061.

Furthermore, the communication unit 5059 transmits the control signal for controlling driving of the camera head 5005 to the camera head 5005. This control signal can also be transmitted by optical communication.

The image processing unit 5061 carries out various image processes on the image signal, which is RAW data transmitted from the camera head 5005. Examples of these image processes include various known signal processes such as a developing process, a high image quality process (a band enhancement process, a super resolution process, a noise reduction (NR) process, a camera shake correction process, and/or the like), and/or an enlargement process (electronic zoom process). Furthermore, the image processing unit 5061 performs a wave sensing process on the image signal for performing AE, AF, and AWB.

The image processing unit 5061 is constituted by a processor such as a CPU and a GPU and the above-described image processes and wave sensing process can be performed by this processor working in accordance with a predetermined program. Note that, in a case where the image processing unit 5061 is constituted by a plurality of GPUs, the image processing unit 5061 appropriately divides the information related to the image signal and performs the image processes in parallel by the plurality of GPUs.

The control unit 5063 performs various types of control relating to imaging of the surgical site by the endoscope 5001 and display of the captured image obtained by the imaging. For example, the control unit 5063 generates a control signal for controlling driving of the camera head 5005. At this time, in a case where the imaging conditions have been input by the user, the control unit 5063 generates the control signal on the basis of the input by the user. Alternatively, in a case where the AE function, the AF function, and the AWB function are equipped in the endoscope 5001, the control unit 5063 appropriately calculates the optimum exposure value, focal length, and white balance according to the result of the wave sensing process by the image processing unit 5061 and generates the control signal.

Furthermore, the control unit 5063 displays the image of the surgical site on the display apparatus 5041 on the basis of the image signal on which the image processes have been carried out by the image processing unit 5061. At this time, the control unit 5063 recognizes various objects in the image of the surgical site using various image recognition technologies. For example, the control unit 5063 detects the shape, color, and the like of the edge of an object included in the image of the surgical site, thereby being able to recognize a surgical tool such as the forceps, a specific living body part, bleeding, a mist at the time of using the energy treatment instrument 5021, and the like. When displaying the image of the surgical site on the display apparatus 5041, the control unit 5063 displays various types of surgery support information superimposed onto this image of the surgical site using results of the recognition. Since the surgery support information is displayed superimposed and presented to the operating surgeon 5067, surgery can be advanced more safely and reliably.

The transmission cable 5065 connecting the camera head 5005 and the CCU 5039 is an electrical signal cable compatible with communication of electrical signals, an optical fiber compatible with optical communication, or a composite cable thereof.

Here, in the illustrated example, communication is performed by wire using the transmission cable 5065; however, communication between the camera head 5005 and the CCU 5039 may be performed wirelessly. In a case where the communication between the camera head 5005 and the CCU 5039 is performed wirelessly, it is no longer necessary to lay the transmission cable 5065 in the surgery room, such that a difficulty that the movement of the medical staff in the surgery room is hindered by the transmission cable 5065 can be eliminated.

An example of the endoscopic surgery system 5000 to which the technology according to the present disclosure can be applied has been described thus far. Note that, although the endoscopic surgery system 5000 has been described here as an example, a system to which the technology according to the present disclosure can be applied is not limited to such an example. For example, the technology according to the present disclosure may be applied to an examination flexible endoscopic system or a microscopic surgery system.

The technology according to the present disclosure can be suitably applied to the imaging unit 5009 in the configuration described above. By applying the technology according to the present disclosure to the imaging unit 5009, the imaging unit 5009 can be downsized. Furthermore, since the degree of freedom in arrangement of each pixel of the imaging element is higher, it becomes easier to obtain the image of the surgical site at a desired position, and it is possible to perform surgery more safely and reliably.

FIG. 51 is a diagram illustrating an example of an outline of the configuration of an in-vivo information acquisition system 5400 to which the technology according to the present disclosure can be applied. Referring to FIG. 51, the in-vivo information acquisition system 5400 is constituted by a capsule endoscope 5401 and an external control apparatus 5423 that comprehensively controls working of the in-vivo information acquisition system 5400. During the examination, the capsule endoscope 5401 is swallowed by a patient. The capsule endoscope 5401 has an imaging function and a wireless communication function, and moves inside organs such as the stomach and intestine by peristaltic motion and the like until the capsule endoscope 5401 is spontaneously discharged from the patient, while sequentially capturing images inside these organs (hereinafter also referred to as in-vivo images) at predetermined intervals, and sequentially transmitting information about the captured in-vivo images wirelessly to the external control apparatus 5423 outside the body. The external control apparatus 5423 generates image data for displaying the captured in-vivo images on a display apparatus (not illustrated) on the basis of the received information about the in-vivo images. By configuring in this manner, in the in-vivo information acquisition system 5400, an image obtained by imaging how the inside of the patient's body is can be obtained at any time from when the capsule endoscope 5401 is swallowed until it is discharged.

The configurations and functions of the capsule endoscope 5401 and the external control apparatus 5423 will be described in more detail. As illustrated in FIG. 51, the capsule endoscope 5401 is configured in such a manner that functions of a light source unit 5405, an imaging unit 5407, an image processing unit 5409, a wireless communication unit 5411, a power feeding unit 5415, a power supply unit 5417, a state detection unit 5419, and a control unit 5421 are equipped in a capsule type casing 5403.

The light source unit 5405 is constituted by a light source such as a light emitting diode (LED), and irradiates the imaging field of view of the imaging unit 5407 with light.

The imaging unit 5407 is constituted by an imaging element and an optical system including a plurality of lenses provided at the preceding stage of the imaging element. Reflected light (hereinafter referred to as observation light) of light radiated on body tissue to be observed is converged by the optical system and is incident on the imaging element. The imaging element receives the observation light and photoelectrically converts the received observation light to generate an electrical signal corresponding to the observation light, that is, an image signal corresponding to the observation image. The image signal generated by the imaging unit 5407 is provided to the image processing unit 5409. Note that various known imaging elements such as a complementary metal oxide semiconductor (CMOS) image sensor or a charge coupled device (CCD) image sensor can be used as the imaging element of the imaging unit 5407.

The image processing unit 5409 is constituted by a processor such as a central processing unit (CPU) or a graphics processing unit (GPU), and performs various signal processes on the image signal generated by the imaging unit 5407. The various signal processes only need to include minimal processes for transmitting the image signal to the external control apparatus 5423 (for example, image data compression, frame rate conversion, data rate conversion, format conversion, and/or the like). The image processing unit 5409 can be implemented with a smaller size and lower consumed power by configuring such that the image processing unit 5409 performs only the minimum necessary processes, and therefore is favorable for the capsule endoscope 5401. However, in a case where there is a margin in space in the casing 5403 and consumed power, additional signal processes (for example, noise removal process, other high image quality processes, or the like) may be performed in the image processing unit 5409. The image processing unit 5409 provides the image signal on which the signal processes have been carried out to the wireless communication unit 5411 as RAW data. Note that, in a case where information about the state (movement, orientation, and the like) of the capsule endoscope 5401 is acquired by the state detection unit 5419, the image processing unit 5409 may provide the image signal to the wireless communication unit 5411 in link with the acquired information. With this configuration, the position in the body where the image was captured, the imaging direction of the image, and the like can be associated with the captured image.

The wireless communication unit 5411 is constituted by a communication apparatus capable of transmitting and receiving various types of information to and from the external control apparatus 5423. This communication apparatus is constituted, for example, by an antenna 5413, a processing circuit that performs a modulation process for signal transmission and reception, and the like. The wireless communication unit 5411 performs a predetermined process such as the modulation process on the image signal on which the signal processes have been carried out by the image processing unit 5409, and transmits the resulting image signal to the external control apparatus 5423 via the antenna 5413. Furthermore, the wireless communication unit 5411 receives a control signal relating to drive control of the capsule endoscope 5401 from the external control apparatus 5423 via the antenna 5413. The wireless communication unit 5411 provides the received control signal to the control unit 5421.

The power feeding unit 5415 is constituted by an antenna coil for receiving electric power, a power regeneration circuit that regenerates electric power from a current generated in the antenna coil, a booster circuit, and the like. In the power feeding unit 5415, electric power is generated using a so-called non-contact charging principle. Specifically, when a magnetic field (electromagnetic wave) having a predetermined frequency is imparted from the outside to the antenna coil of the power feeding unit 5415, an induced electromotive force is generated in the antenna coil. This electromagnetic wave may be a carrier wave transmitted from the external control apparatus 5423 via the antenna 5425, for example. Electric power is regenerated from the generated induced electromotive force by the power regeneration circuit, and the potential of the regenerated electric power is appropriately adjusted in the booster circuit, whereby electric power for accumulation is generated. The electric power generated by the power feeding unit 5415 is accumulated in the power supply unit 5417.

The power supply unit 5417 is constituted by a secondary battery, and accumulates the electric power generated by the power feeding unit 5415. In FIG. 51, in order to avoid making the drawing complicated, illustration of an arrow or the like indicating the supply destination of the electric power from the power supply unit 5417 is omitted; however, the electric power accumulated in the power supply unit 5417 is supplied to the light source unit 5405, the imaging unit 5407, the image processing unit 5409, the wireless communication unit 5411, the state detection unit 5419, and the control unit 5421, and can be used for driving these units.

The state detection unit 5419 is constituted by a sensor for detecting the state of the capsule endoscope 5401, such as an acceleration sensor and/or a gyro sensor. The state detection unit 5419 can acquire information about the state of the capsule endoscope 5401 from the result of the detection by the sensor. The state detection unit 5419 provides the acquired information about the state of the capsule endoscope 5401 to the image processing unit 5409. In the image processing unit 5409, as described above, this information about the state of the capsule endoscope 5401 can be linked with the image signal.

The control unit 5421 is constituted by a processor such as a CPU, and comprehensively controls working of the capsule endoscope 5401 by working in accordance with a predetermined program. The control unit 5421 appropriately controls driving of the light source unit 5405, the imaging unit 5407, the image processing unit 5409, the wireless communication unit 5411, the power feeding unit 5415, the power supply unit 5417, and the state detection unit 5419 in accordance with control signals transmitted from the external control apparatus 5423, thereby implementing the function in each unit as described above.

The external control apparatus 5423 can be a processor such as a CPU or a GPU, or a microcomputer or a control board or the like in which a processor and a storage element such as a memory are jointly mounted. The external control apparatus 5423 includes an antenna 5425, and is configured such that various types of information can be transmitted to and received from the capsule endoscope 5401 via the antenna 5425. Specifically, the external control apparatus 5423 controls working of the capsule endoscope 5401 by transmitting a control signal to the control unit 5421 of the capsule endoscope 5401. For example, light irradiation conditions for an object to be observed in the light source unit 5405 can be altered by the control signal from the external control apparatus 5423. Furthermore, imaging conditions (for example, the frame rate or exposure value in the imaging unit 5407) can be altered by the control signal from the external control apparatus 5423. In addition, the content of the process in the image processing unit 5409 and conditions for the wireless communication unit 5411 to transmit the image signal (for example, the transmission interval, the number of transmission images, and the like) may be altered by the control signal from the external control apparatus 5423.

Besides, the external control apparatus 5423 carries out various image processes on the image signal transmitted from the capsule endoscope 5401, and generates image data for displaying the captured in-vivo image on the display apparatus. For example, various known signal processes can be performed as these image processes, such as a developing process (demosaic processing), a high image quality process (a band enhancement process, a super resolution process, a noise reduction (NR) process, a camera shake correction process, and/or the like), and/or an enlargement process (electronic zoom process). The external control apparatus 5423 controls driving of the display apparatus (not illustrated) to display an in-vivo image captured on the basis of the generated image data. Alternatively, the external control apparatus 5423 may cause a recording apparatus (not illustrated) to record the generated image data or may cause a printing apparatus (not illustrated) to output and print the generated image data.

An example of the in-vivo information acquisition system 5400 to which the technology according to the present disclosure can be applied has been described thus far. The technology according to the present disclosure can be suitably applied to the imaging unit 5407 in the configuration described above. By applying the technology according to the present disclosure to the imaging unit 5407, the capsule endoscope 5401 can be further downsized, and thus the burden on the patient can be further mitigated.

7. Others

A series of the above-described processes can be executed by hardware as well and also can be executed by software. In a case where the series of the processes is executed by software, a program constituting the software is installed in a computer. Here, the computer includes, for example, a computer incorporated in dedicated hardware (for example, the control unit 123 and the like).

For example, the program executed by the computer can be provided by being recorded in a recording medium serving as a package medium or the like (for example, the recording medium 130 and the like). Furthermore, the program can be provided via a wired or wireless transmission medium such as a local area network, the Internet, or digital satellite broadcasting.

Note that, the program executed by the computer may be a program in which the processes are performed along the time series in accordance with the order described in the present description, or alternatively, may be a program in which the processes are performed in parallel or at a necessary timing, for example, when called.

In addition, in the present description, a system refers to a collection of a plurality of constituent elements (e.g., apparatuses and modules (parts)) and whether or not all the constituent elements are arranged within the same casing is not regarded as important. Accordingly, a plurality of apparatuses accommodated in separate casings so as to be connected to one another via a network and one apparatus of which a plurality of modules is accommodated within one casing are both deemed as systems.

Moreover, the embodiments according to the present technology are not limited to the above-described embodiments and various alterations can be made without departing from the scope of the present technology.

For example, the present technology can employ a cloud computing configuration in which one function is divided and allocated to a plurality of apparatuses so as to be processed in coordination thereamong via a network.

Furthermore, the respective steps described in the aforementioned flowcharts can be executed by a plurality of apparatuses each taking a share thereof as well as executed by a single apparatus.

Moreover, in a case where a plurality of processes is included in one step, the plurality of processes included in one step can be executed by a plurality of apparatuses each taking a share thereof as well as executed by a single apparatus.

Note that the present disclosure can be also configured as described below.

(1)

An electronic instrument worn or used by a user, the electronic instrument including an imaging unit arranged at a position where at least a part of the user wearing or using the electronic instrument is capturable, the imaging unit including two or more pixel output units that each receive incident light from a subject incident not via either an imaging lens or a pinhole and output one detection signal indicating an output pixel value modulated depending on an incident angle of the incident light.

(2)

The electronic instrument according to (1) above, in which each of the pixel output units is arranged in an eyepiece unit of the electronic instrument or around the eyepiece unit.

(3)

The electronic instrument according to (2) above, in which the electronic instrument is worn on a head of the user.

(4)

The electronic instrument according to (3) above, in which the electronic instrument is of a glasses type or a goggles type.

(5)

The electronic instrument according to (2) above, in which the electronic instrument includes a camera, and the eyepiece unit includes a viewfinder of the camera.

(6)

The electronic instrument according to any one of (2) to (5) above, in which at least some of the pixel output units have higher light receiving sensitivity with respect to a direction of an eye of the user in proximity to the eyepiece unit.

(7)

The electronic instrument according to (1) above, in which each of the pixel output units is arranged in a display unit of the electronic instrument or around the display unit.

(8)

The electronic instrument according to (7) above, in which at least some of the pixel output units have higher light receiving sensitivity with respect to a direction of a face of the user viewing the display unit.

(9)

The electronic instrument according to any one of (1) to (8) above, further including a restoration unit that restores a restoration image using a plurality of the detection signals from respective ones of the pixel output units.

(10)

The electronic instrument according to (9) above, further including a control unit that executes a predetermined process on the basis of the restoration image.

(11)

The electronic instrument according to (10) above, in which the imaging unit is arranged at a position where at least a part of an eye of the user wearing or using the electronic instrument is capturable, and the control unit detects a movement or a state of the eye of the user on the basis of the restoration image.

(12)

The electronic instrument according to (10) above, in which the imaging unit is arranged at a position where at least a part of a face of the user wearing or using the electronic instrument is capturable, and the control unit performs a recognition process or an authentication process for the user on the basis of the restoration image.

(13)

The electronic instrument according to any one of (1) to (12) above, in which the imaging unit includes one or more imaging elements, and a plurality of the pixel output units is provided in the imaging elements.

(14)

The electronic instrument according to any one of (1) to (13) above, in which respective ones of the pixel output units are arranged in two or more regions away from each other.

(15)

The electronic instrument according to any one of (1) to (14) above, in which the plurality of pixel output units has a configuration in which the incident angle directivity can be set independently.

(16)

The electronic instrument according to (15) above, in which
the plurality of pixel output units each includes:
one photodiode; and
a light shielding film that blocks a part of the incident light from being incident on the photodiode.

(17)

The electronic instrument according to (15) above, in which
at least two pixel output units out of the plurality of pixel output units include a plurality of photodiodes, and have the incident angle directivities different from each other by making photodiodes that contribute to output different from each other.

(18)

The electronic instrument according to any one of (1) to (17) above, in which
the imaging unit has a configuration for causing the incident angle directivities of output pixel values with respect to the incident light of at least two pixel output units out of the plurality of pixel output units to have characteristics different from each other.

Note that the effects described in the present description merely serve as examples and not construed to be limited. There may be another effect.

REFERENCE SIGNS LIST

101 Imaging apparatus
111 Signal processing control unit
121 Imaging element
121a, 121a' Pixel
121A Light receiving surface
121b Light shielding film
121c On-chip lens
121e, 121f Photodiode
122 Restoration unit
123 Control unit
125 Detection unit
126 Association unit
301 Electronic instrument
311 Imaging unit
312 Signal processing control unit
321 Restoration unit
322 Control unit
325 Association unit
326 Output unit
328 Recording/playback unit
401 Wearable device
411L, 411R Lens
412 Frame
431 Camera
441 Viewfinder
461 Head mounted display
471L, 471R Lens
491 PC
501 Display
502 Bezel
601 Wearable device
611L, 611R Lens
612 Frame
631 Camera
641 Mount
642 Flash built-in unit
643 Lens
661 Head mounted display
671 Main body portion
672 Head pad
691 Headphones
701L, 701R Housing
702 Headset
721 Headphones
731L, 731R Housing
732 Neckband
751 Bending sensor
801 Information processing system
811 Electronic instrument
812 Signal processing apparatus
901b, 901s Pixel output unit

The invention claimed is:

1. An electronic instrument configured to be worn or used by a user, the electronic instrument comprising:
an imaging sensor configured to be arranged at a position where at least a part of the user wearing or using the electronic instrument is capturable, the imaging sensor including two or more pixel output units each configured to have a different incident angle directivity, to receive incident light from a subject incident not via an imaging lens and not via a pinhole, and to output one detection signal indicating an output pixel value modulated depending on an incident angle of the incident light,
wherein at least some of the pixel output units have higher light receiving sensitivity in a direction of an eye or face of the user than in other directions.

2. The electronic instrument according to claim 1, wherein
each of the pixel output units is arranged in an eyepiece unit of the electronic instrument or around the eyepiece unit.

3. The electronic instrument according to claim 2, wherein
the electronic instrument is configured to be worn on a head of the user.

4. The electronic instrument according to claim 3, wherein
the electronic instrument is of a glasses type or a goggles type.

5. The electronic instrument according to claim 2, wherein
the electronic instrument includes a camera, and
the eyepiece unit includes a viewfinder of the camera.

6. The electronic instrument according to claim 1, wherein
at least some of the pixel output units have higher light receiving sensitivity in a direction of the eye of the user in proximity to the eyepiece unit than in the other directions.

7. The electronic instrument according to claim 1, wherein
each of the pixel output units is configured to be arranged in a display of the electronic instrument or around the display, and at least some of the pixel output units have higher light receiving sensitivity in a direction of a face of the user viewing the display than in the other directions.

8. The electronic instrument according to claim 1, further comprising:
processing circuitry configured to restore a restoration image using a plurality of detection signals from respective ones of the pixel output units.

9. The electronic instrument according to claim 8, further comprising wherein the processing circuitry is configured to execute a predetermined process based on the restoration image.

10. The electronic instrument according to claim 9, wherein
the imaging sensor is further configured to be arranged at a position where at least a part of the eye of the user wearing or using the electronic instrument is capturable, and
the processing circuitry is further configured to detect a movement or a state of the eye of the user based on the restoration image.

11. The electronic instrument according to claim 9, wherein
the imaging sensor is further configured to be arranged at a position where at least a part of the face of the user wearing or using the electronic instrument is capturable, and
the processing circuitry is further configured to perform a recognition process or an authentication process for the user based on the restoration image.

12. The electronic instrument according to claim 1, wherein
the imaging sensor includes one or more imaging elements, and
a plurality of the pixel output units is provided in the imaging elements.

13. The electronic instrument according to claim 1, wherein
respective ones of the pixel output units are arranged in two or more regions away from each other.

14. An electronic instrument configured to be worn or used by a user, the electronic instrument comprising:
an imaging sensor configured to be arranged at a position where at least a part of the user wearing or using the electronic instrument is capturable, the imaging sensor including two or more pixel output units each configured to have a different incident angle directivity, to receive incident light from a subject incident not via an imaging lens and not via a pinhole, and to output one detection signal indicating an output pixel value modulated depending on an incident angle of the incident light,
wherein the two or more pixel output units have a configuration in which the incident angle directivity can be set independently; and
wherein at least two pixel output units, out of the two or more pixel output units, each include a plurality of photodiodes, and the at least two pixel output units have the incident angle directivities different from each other by making respective subsets of the plurality of photodiodes that contribute to output be different from each other.

15. The electronic instrument according to claim 14, wherein
the two or more pixel output units each includes:
one photodiode; and
a light shielding film configured to block a part of the incident light from being incident on the photodiode.

16. The electronic instrument according to claim 1, wherein the imaging sensor has a configuration for causing the incident angle directivities of output pixel values with respect to the incident light of at least two pixel output units out of the plurality of pixel output units to have characteristics different from each other.

17. An electronic instrument configured to be worn or used by a user, the electronic instrument comprising:
an imaging sensor configured to be arranged at a position where at least a part of the user wearing or using the electronic instrument is capturable, the imaging sensor including two or more pixel output units each configured to have a different incident angle directivity, to receive incident light from a subject incident not via an imaging lens and not via a pinhole, and to output one detection signal indicating an output pixel value modulated depending on an incident angle of the incident light,
wherein a first one of the pixel output units is installed in a different casing from a second one of the pixel output units.

18. The electronic instrument of claim 17, wherein the processing circuitry is further configured to detect a movement or a state of the eye of the user such that the movement or the state of the eye of the user is output as user related information.

19. The electronic instrument of claim 17, wherein the processing circuitry is further configured to perform a recognition process or an authentication process for the user such that a result of the recognition process or the authentication process is output as user related information.

20. The electronic instrument of claim 17, wherein the processing circuitry is further configured to restore a restoration image using a plurality of detection signals from respective ones of the pixel output units and output user related information by processing the restoration image.

21. The electronic instrument of claim 17, wherein the processing circuitry is further configured to output user related information by applying machine learning using a plurality of detection signals from respective ones of the pixel output units.

22. The electronic instrument of claim 1, further comprising processing circuitry configured to output user related information based on the one detection signal,
wherein the processing circuitry is further configured to output the user related information by applying machine learning using a plurality of detection signals from respective ones of the pixel output units.

23. The electronic instrument of claim 14, further comprising processing circuitry configured to output user related information based on the one detection signal,
wherein the processing circuitry is further configured to output the user related information by applying machine learning using a plurality of detection signals from respective ones of the pixel output units.

24. The electronic instrument of claim 1,
wherein a first one of the pixel output units is installed in a different casing from a second one of the pixel output units.

25. The electronic instrument of claim 14,
wherein a first one of the pixel output units is installed in a different casing from a second one of the pixel output units.

* * * * *